United States Patent [19]

Hyatt

[11] Patent Number: 4,523,290

[45] Date of Patent: Jun. 11, 1985

[54] DATA PROCESSOR ARCHITECTURE

[76] Inventor: Gilbert P. Hyatt, P.O. Box 4584, Anaheim, Calif. 92803

[21] Appl. No.: 844,765

[22] Filed: Oct. 25, 1977

Related U.S. Application Data

[63] Continuation-in-part of Ser. No. 490,816, Jul. 22, 1974, Pat. No. 4,209,853, Ser. No. 522,559, Nov. 11, 1974, Pat. No. 4,209,852, and Ser. No. 812,285, Jul. 1, 1977, Pat. No. 4,371,953.

[51] Int. Cl.³ .............................................. G06J 1/00
[52] U.S. Cl. ................................... 364/602; 364/862; 365/1; 365/222
[58] Field of Search ................ 364/862, 200 MS File, 364/900 MS File, 600, 602, 606, 607; 365/45, 222, 183, 103, 104, 1; 357/24; 328/167; 307/221 D; 333/165

[56] References Cited

U.S. PATENT DOCUMENTS

| | | | |
|---|---|---|---|
| 3,315,235 | 4/1967 | Carnevale et al. | 364/200 |
| 3,355,719 | 11/1967 | Fox | 364/862 X |
| 3,462,742 | 8/1969 | Miller et al. | 364/200 |
| 3,593,313 | 7/1971 | Tomaszewski | 364/200 |
| 3,646,522 | 2/1972 | Furman | 364/200 |
| 3,654,499 | 4/1972 | Smith . | |
| 3,670,313 | 6/1972 | Beausoleil et al. . | |
| 3,689,902 | 9/1972 | Chang et al. . | |
| 3,701,125 | 10/1972 | Chang et al. . | |
| 3,701,132 | 10/1972 | Bonyhard et al. . | |
| 3,702,988 | 11/1972 | Haney | 364/200 |
| 3,787,852 | 1/1974 | Puckette | 307/221 D |
| 3,797,002 | 3/1974 | Brown . | |
| 3,810,126 | 5/1974 | Butler et al. . | |
| 3,857,101 | 12/1974 | Puckette et al. | 307/221 D |
| 3,859,640 | 1/1975 | Eberlein et al. . | |
| 3,877,056 | 4/1975 | Bailey | 307/221 D X |
| 3,887,762 | 6/1975 | Uno et al. | 358/101 |
| 3,903,543 | 9/1975 | Smith . | |
| 3,931,510 | 1/1976 | Kmetz | 364/862 |
| 3,941,979 | 3/1976 | Cragon | 365/183 X |
| 3,947,826 | 3/1976 | Bockwoldt | 364/900 |
| 3,950,732 | 4/1976 | Chang et al. | 365/183 X |
| 3,956,624 | 5/1976 | Audaire et al. | 364/862 |
| 3,967,263 | 6/1976 | Chang et al. . | |
| 4,034,199 | 7/1977 | Lampe et al. . | |

OTHER PUBLICATIONS

Wegener–"Appraisal of Charge Transfer Technologies for Peripheral Memory Applications"–CCD Applications Conf., Sep. 1973, pp. 43–54.

Altman–"New MOS Technique Points Way to Junctionless Devices"–Electronics, May 11, 1970, pp. 112–118.

Amelio–"Physics and Applications of Charge-Coupled Devices"–IEEE Intercon.–Mar. 26-30, 1973, pp. 1–6.

Tompsett–"Charge Transfer Devices"–J. Jac. Sci. Technol., vol. 9, No. 4–Jul.–Aug. 1972, pp. 1166–1181.

Carnes et al.–"Charge-Coupled Devices and Applications"–Solid State Technology–Apr. 1974–pp. 67–77.

Keshavan et al–"Nonvolatile Charge Storage Cell for Random-Access Memory Applications"–IBM Tech. Dis. Bull.; Feb. 1974–pp. 2806, 2807.

(List continued on next page.)

Primary Examiner—Joseph F. Ruggiero
Attorney, Agent, or Firm—Gilbert P. Hyatt

[57] ABSTRACT

The present invention is directed to an improved data processor architecture. In a preferred embodiment, this architecture provides a hybrid stored program computer having analog and digital signals, where this architecture utilizes the combination of an integrated circuit analog read only memory, an integrated circuit analog alterable memory, and digital processing logic to achieve a low cost monolithic hybrid data processor. Analog CCD memories are provided for obtaining high capacity storage at low cost. Digital processing is provided for flexibility and capability. Analog to digital converters and digital to analog converters are used for communication between analog and digital portions of the data processor. Adaptive compensation having stored reference signals enhances analog signal precision.

63 Claims, 43 Drawing Figures

OTHER PUBLICATIONS

Fischler et al.–"Non-volatile Charge-Coupled Memory"–IBM Technical Disclosure Bull.–Red. vol. 15, No. 3–Aug. 1972–pp. 741, 742.

Electronics Review, "Japanese Develop Non-Destructive Analog Semiconductor Memory"–Electronics, Jul. 11, 1974, pp. 29–30.

White et al.–"CCD and MNOS Devices for Programmable Analog Signal Processing and Digital Nonvolatile Memory"–IEEE IEDM, Wash., D.C., 1973–pp. 130–134.

Theunissen–"Charge Transfer Devices"–L'onde Electrique–1974–vol. 54, No. 8, pp. 405–413.

Tiemann et al., "Intracell Charge-transfer Structures for Signal Processing", IEEE Trans. on Electron Devices, vol. Ed.-21, No. 5, May 1974, pp. 300–308.

Engeler et al.–"A Surface-charge Random-access Memory System"–IEEE Journal of Solid-State Circuits–vol. SC-7, No. 5, Oct. 1972–pp. 330–335.

Boonstra et al.–"Analog Functions Fit Neatly Onto Charge Transport Chips"–Electronics–Feb. 28, 1972, pp. 64–71.

Altman–"The New Concept for Memory and Imaging: Charge Coupling", Electronics–Jun. 21, 1971–pp. 50–59.

Boysel; "Adder On A Chip: LSI Helps Reduce Cost Of Small Machine"; Electronics, Mar. 18, 1968, pp. 119–124.

Hopkins: "Electronic Navigator Charts Man's Path To The Moon", Electronics; Jan. 9, 1967, pp. 109–118.

Levy et al; "System Utilization of Large Scale Integration", IEEE Transactions on Computers, Oct. 1967.

Beelitz et al; "System Architecture for Large Scale Integration"; AFIPS Conference Proceedings; Nov. 1967.

"Compressed Refresh System for Use With CRT Image Display"; Chesarek; IBM Technical Disclosure Bulletin; vol. 20; No. 5; Oct. 1977.

"Analog Capacitance ROM With IGFET Bucket-Brigade Shift Register", Brunn et al; IEEE Journal of Solid State Circuits; vol. SC-10; No. 1, pp. 55–59; Feb. 1975.

"A Nonvolatile Charge-Addressed Memory"; White et al; IEEE Journal of Solid State Circuits; vol. SC-10; No. 5; pp. 281–287; Oct. 1975.

"A BYTE Organized NMOS/CCD Memory With Dynamic Refresh Logic"; Varshney et al; IEEE Transactions on Electron Devices, vol. ED-23; No. 2, pp. 86–92; Feb. 1976.

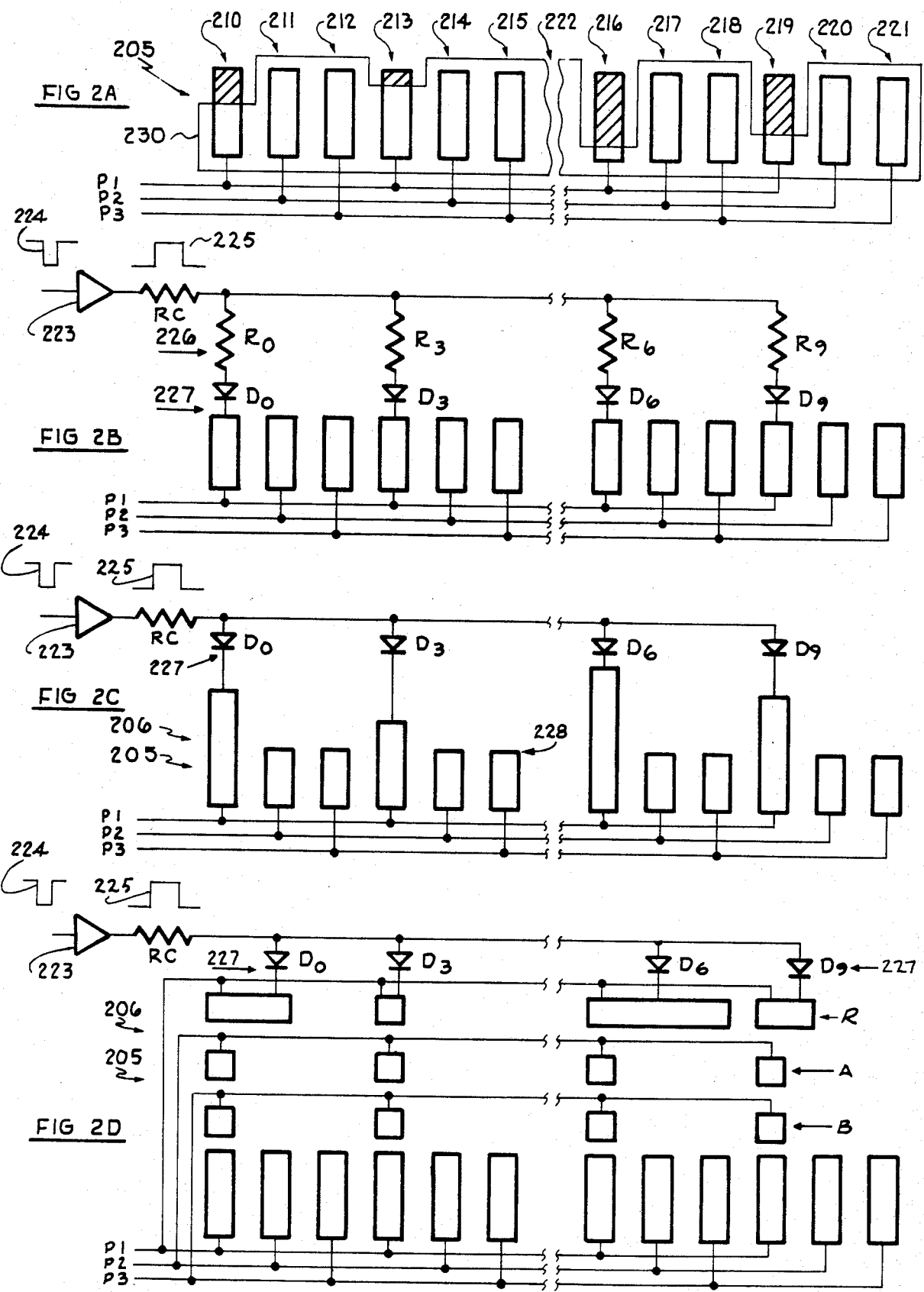

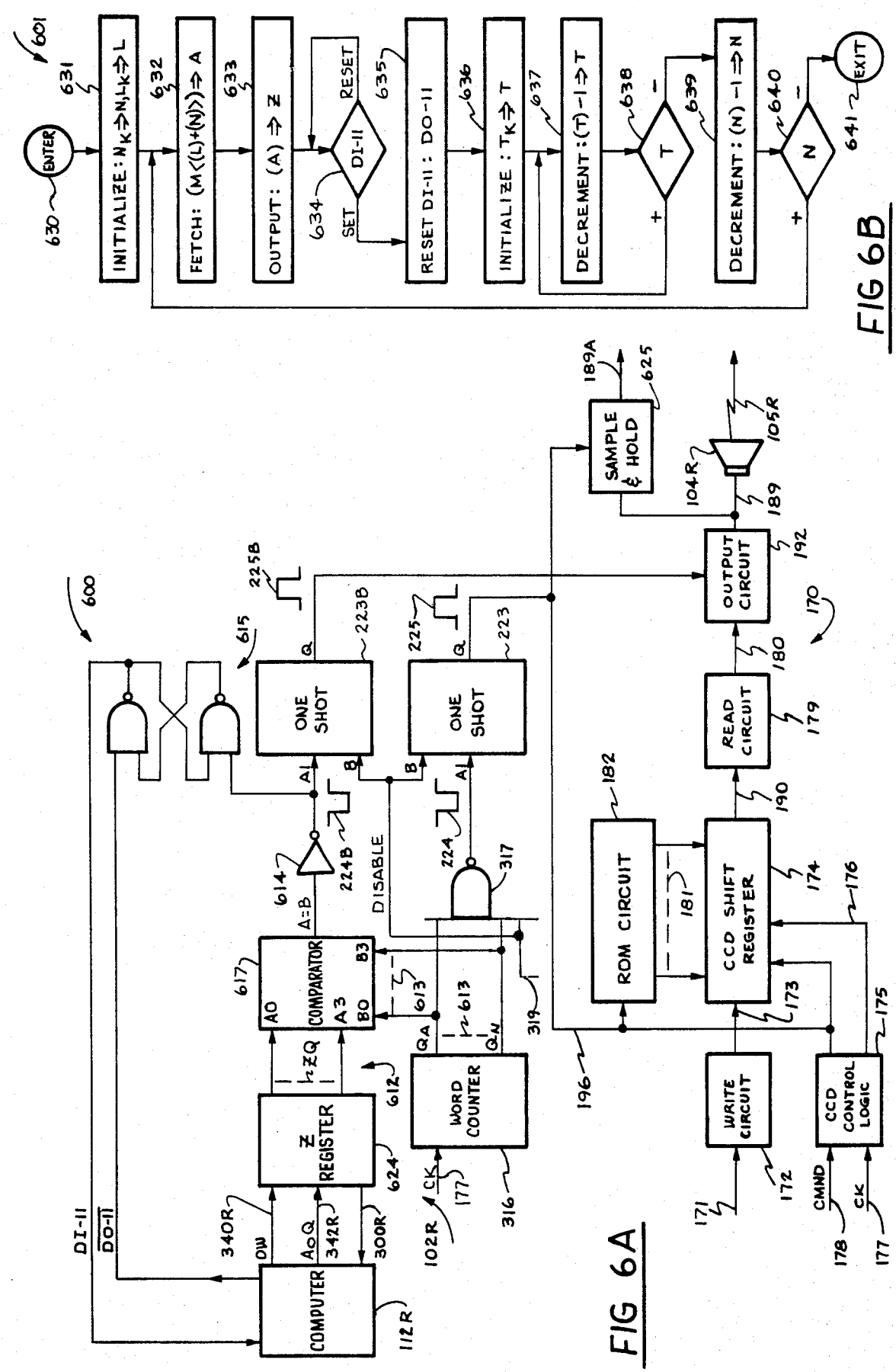

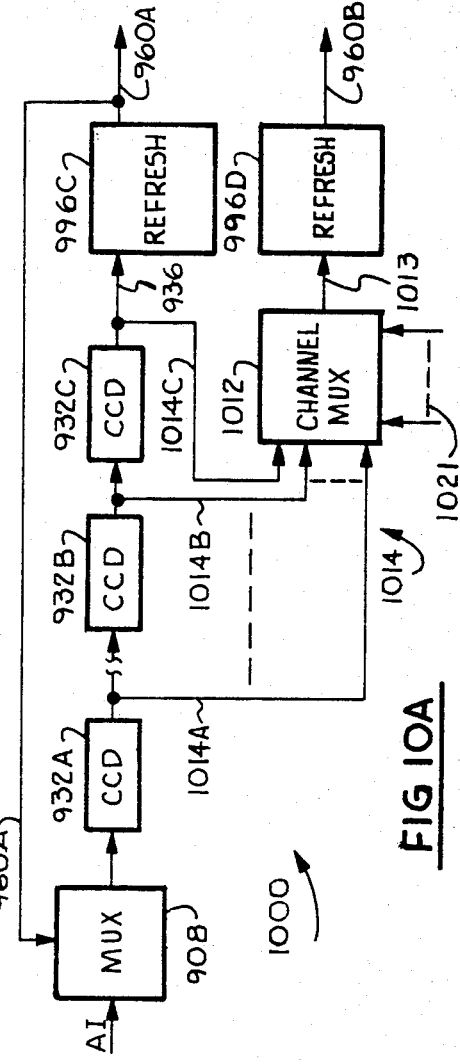
FIG 10B
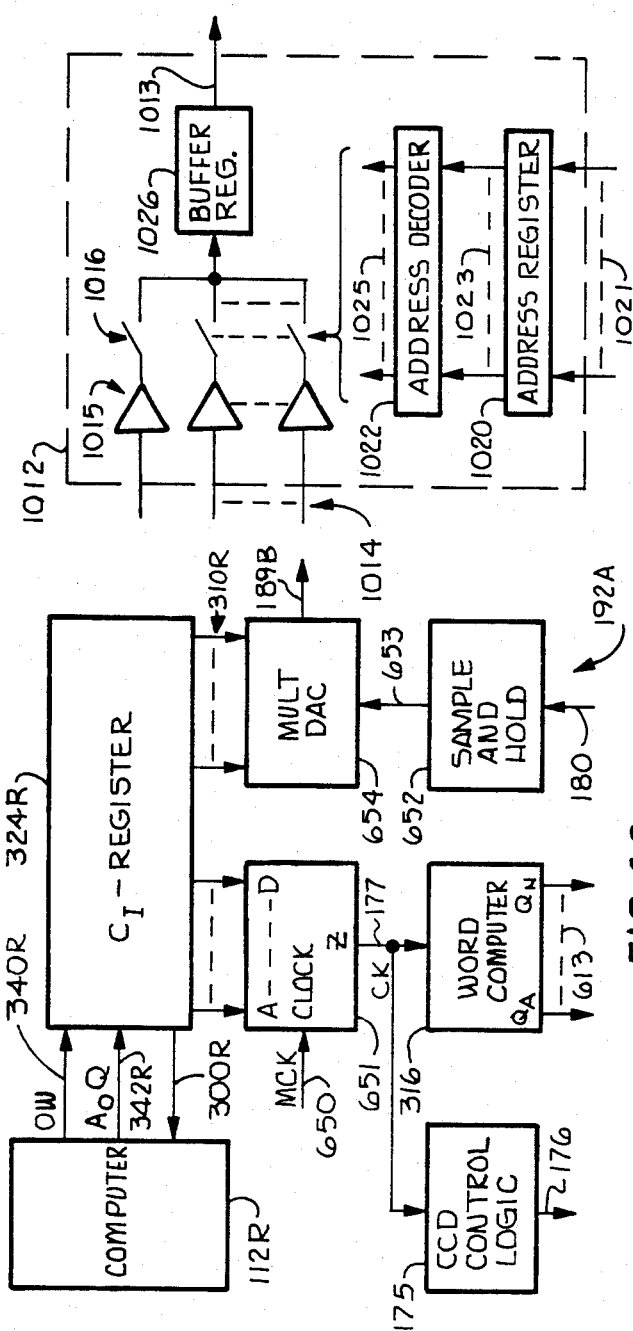
FIG 6C
FIG 10A
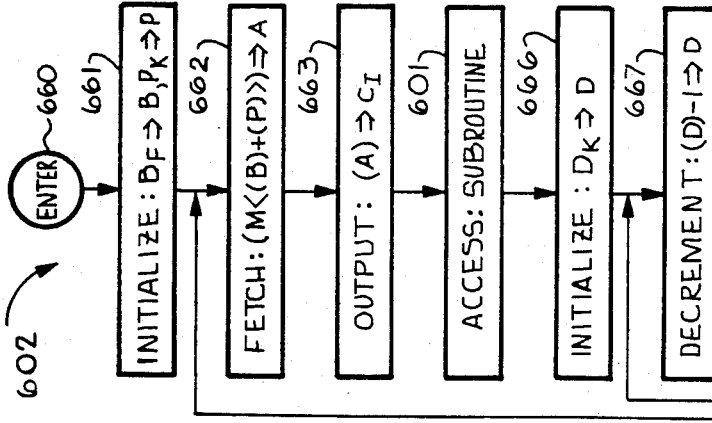
FIG 6D

DATA PROCESSOR ARCHITECTURE

CROSS REFERENCE TO RELATED APPLICATIONS

Parent Patent Applications

This application is a continuation-in-part of each application in the following chain of copending patent applications (1) HOLOGRAPHIC SYSTEM FOR OBJECT LOCATION AND IDENTIFICATION Ser. No. 490,816 filed on July 22, 1974 and now issuing as a U.S. Pat. No. 4,209,853.

(2) SIGNAL PROCESSING AND MEMORY ARRANGEMENT Ser. No. 522,559 filed on Nov. 11, 1974 and now issuing as a U.S. Pat. No. 4,209,852; and (3) ANALOG READ ONLY MEMORY Ser. No. 812,285 filed on July 1, 1977 now U.S. Pat. No. 4,371,953;

all by Gilbert P. Hyatt;

wherein the benefit of the filing dates of the above-listed copending applications are herein claimed in accordance with the United States Code such as with 35 USC 120 and other authorities therefore;

wherein the above-listed patents and patent applications are incorporated herein by reference as if fully set forth at length herein.

The relationship and combination of the above referenced applications and the instant application will become apparent to those skilled in the art from the disclosures therein, the disclosures herein, and the wealth of prior art knowledge.

Related Patent Applications

This application is further related to but not a continuation of the following list of applications (1) FACTORED DATA PROCESSING SYSTEM FOR DEDICATED APPLICATIONS Ser. No. 101,881 filed on Dec. 28, 1970; abandoned (2) CONTROL SYSTEM AND METHOD Ser. No. 134,958 filed on Apr. 19, 1971;

(3) CONTROL APPARATUS Ser. No. 135,040 filed on Apr. 19, 1971;

(4) APPARATUS AND METHOD FOR PRODUCING HIGH REGISTRATION PHOTOMASKS Ser. No. 229,213 filed on Apr. 13, 1972 now U.S. Pat. No. 3,820,894 issued on June 28, 1974;

(5) MACHINE CONTROL SYSTEM OPERATING FROM REMOTE COMMANDS Ser. No. 230,872 filed on Mar. 1, 1972;

(6) COORDINATE RESOLUTION FOR NUMERICAL CONTROL SYSTEMS Ser. No. 232,459 filed on Mar. 7, 1972 now issuing as a U.S. Pat. No. 4,370,720;

(7) DIGITAL FEEDBACK CONTROL SSYTEM Ser. No. 246,867 filed on Apr. 24, 1972 now issuing as a U.S. Pat. No. 4,310,878;

(8) STORED PROGRAM DATA PROCESSING SYSTEM FOR DIRECT CONTROL OF A MACHINE IN REAL TIME WITH DISCRETE SIGNALS Ser. No. 291,394 filed on Sept. 22, 1972 U.S. Pat. No. 4,396,976;

(9) DIGITAL ARRANGEMENT FOR PROCESSING SQUAREWAVE SIGNALS Ser. No. 302,771 filed on Nov. 1, 1972;

(10) APPARATUS AND METHOD FOR PROVIDING INTERACTIVE AUDIO COMMUNICATION Ser. No. 325,933 filed on Jan. 22, 1973 now U.S. Pat. No. 4,016,540 issued on Apr. 5, 1977;

(11) ELECTRONIC CALCULATOR SYSTEM HAVING AUDIO MESSAGES FOR OPERATOR INTERACTION Ser. No. 325,941 filed on Jan. 22, 1973 now U.S. Pat. No. 4,060,848 issued on Nov. 29, 1977;

(12) COMPUTERIZED SYSTEM FOR OPERATOR INTERACTION Ser. No. 288,247 filed on Sept. 11, 1972 now U.S. Pat. No. 4,212,284 issued on Oct. 17, 1978;

(13) METHOD AND APPARATUS FOR SIGNAL ENHANCEMENT WITH IMPROVED DIGITAL FILTERING Ser. No. 550,231 filed on Feb. 14, 1975 and now issuing as a U.S. Pat. No. 4,209,843;

(14) ILLUMINATION CONTROL SYSTEM Ser. No. 366,714 filed on June 4, 1973 now U.S. Pat. No. 3,986,022 issued on Oct. 12, 1976;

(15) COMPUTERIZED MACHINE CONTROL SYSTEM Ser. No. 476,743 filed on June 5, 1974 now issuing as a U.S. Pat. No. 4,364,110;

(16) PROJECTION TELEVISION SYSTEM USING LIQUID CRYSTAL DEVICES Ser. No. 730,756 filed on Oct. 7, 1976;

(17) VOICE SIGNAL PROCESSING SYSTEM Ser. No. 801,879 filed on May 31, 1977 now U.S. Pat. No. 4,144,582 issued on Mar. 13, 1979; and

(18) INCREMENTAL DIGITAL FILTER Ser. No. 754,660 filed on Dec. 27, 1976;

all by Gilbert P. Hyatt; and

(19) INTERACTIVE CONTROL SYSTEM Ser. No. 101,449 filed on Dec. 28, 1970 by Lee, Cole, Hirsch, Hyatt, and Wimmer now abandoned in favor of a continuing application;

(20) INTERACTIVE CONTROL SYSTEM Ser. No. 354,950 filed on Apr. 24, 1973 by Lee, Cole, Hirsch, Hyatt, and Wimmer now U.S. Pat. No. 4,038,640 issued on July 26, 1977;

(21) ADAPTIVE ILLUMINATION SOURCE INTENSITY CONTROL DEVICE Ser. No. 152,105 filed on June 11, 1971 by Lee, Wimmer, and Hyatt now U.S. Pat. No. 3,738,242 issued on June 12, 1973 and continuations and divisionals therefrom; and

(22) DIGITAL SIGNAL PROCESSOR FOR SERVO VELOCITY CONTROL Ser. No. 339,817 filed on Mar. 9, 1973 by Gilbert P. Hyatt now U.S. Pat. No. 4,034,276 issued on July 5, 1977 wherein the above-listed patents and patent applications are incorporated herein by reference as if fully set forth at length herein.

The relationship and combination of the above referenced applications and the instant application will become apparent to those skilled in the art from the disclosures therein, the disclosures herein, and the wealth of prior art knowledge.

BACKGROUND OF THE INVENTION

1. Field of the Invention

The present invention is related to electronic memories for data processors and signal processors.

2. Description of the Prior Art

Multitudes of different types of memories are used in the prior art including magnetic memories, integrated circuit memories, and optical memories. The most pertinent prior art is integrated circuit read only memories and integrated circuit charge coupled device (CCD) memories. Integrated circuit read only memories are significantly more expensive than charge coupled device memories, primarily because such read only memories require more complex monolithic processes than are required for CCD memories and because such read only memories are random access memories thereby requiring more complex accessing circuitry and multitudes of parallel interconnections than are required for CCD memories. CCD memories are lower in cost than conventional read only memories, but CCD memories are volatile where all stored information is lost when power is turned off. This volatility characteristic is verified in the "Engineer's newsletter"; Electronics Magazine; Mar. 31, 1977; page 121; last sentence.

Therefore, the prior art has been constrained to expensive memories such as magnetic memories and integrated circuit read only memories when non-volatile capability is required.

The prior art is further defined in the art-of-record of the related applications in the chain of continuing applications including U.S. Pat. No. 2,961,535 to Lanning; U.S. Pat. No. 3,356,989 to Autry; U.S. Pat. No. 3,368,203 to Loizides; U.S. Pat. No. 3,613,771 to Quay; U.S. Pat. No. 3,618,052 to Kwei; U.S. Pat. No. 3,643,106 to Berwin; U.S. Pat. No. 3,654,499 to Smith; U.S. Pat. No. 3,662,351 to Ho; U.S. Pat. No. 3,701,978 to Miller; U.S. Pat. No. 3,775,738 to Quay; U.S. Pat. No. 3,753,242 to Townsend; U.S. Pat. No. 3,755,793 to Ho; U.S. Pat. No. 3,757,313 to Hines; U.S. Pat. No. 3,761,901 to Aneshansley; U.S. Pat. No. 3,771,148 to Aneshansley; U.S. Pat. No. 3,774,169 to Smith; U.S. Pat. No. 3,774,177 to Schaffer; U.S. Pat. No. 3,775,738 to Quay; U.S. Pat. No. 3,787,852 to Puckette; U.S. Pat. No. 3,801,967 to Berger; U.S. Pat. No. 3,810,126 to Butler; U.S. Pat. No. 3,826,926 to White; U.S. Pat. No. 3,852,745 to Le Bail; U.S. Pat. No. 3,868,516 to Buss; U.S. Pat. No. 3,873,958 to Whitehouse; U.S. Pat. No. 3,876,989 to Bankowski; U.S. Pat. No. 3,889,245 to Gosney; U.S. Pat. No. 3,891,977 to Amelio; U.S. Pat. No. 3,895,342 to Mallet; U.S. Pat. No. 3,909,806 to Uchida; U.S. Pat. No. 3,914,748 to Barton; U.S. Pat. No. 3,999,171 to Parsons; and U.S. Pat. No. 3,942,034 to Buss and including the article by Dennard, IBM Technical Disclosure Bulletin, Vol. 14, No. 12, May 1972, pages 3791–3792; the article by Altman, Electronics Magazine, Feb. 28, 1972, pages 62–71; and the article by Baertsch, Electronics Magazine, Dec. 6, 1971, pages 86–91.

SUMMARY OF THE INVENTION

The present invention is directed to a data processor wherein the preferred embodiment provides an analog read only memory using charge coupled devices. Fixed but selectable charge packets are used to charge elements in a charge coupled device array; where selectable charging may be provided by selecting resistor values, selecting capacitor values, selectable masking of photo detectors, and other such methods. The accumulated fixed packets of charge are then shifted with a charge coupled device register to provide sequential analog signal outputs. Use of an analog read only memory permits hybrid signal processing such as for voice response. Use of a serial output simplifies the accessing and reduces accessing electronics by eliminating the more complex random access arrangements. The analog read only memory of the present invention has the additional advantage of being a non-volatile memory for preserving stored information when power is removed; where conventional charge coupled device memories are volatile and lose all stored information when power is removed. The analog read only memory of the present invention is particularly useful in systems for generating analog output signals such as voice response systems and filtering systems. Accessing of analog samples from the read only memory can be controlled with a digital processor such as by controlling shifting of the charge couple device shift register and by selecting the desired output information under digital control.

The present invention is broadly directed to new and unique memory techniques; wherein a preferred embodiment is in the form of a non-volatile analog read only memory (ROM) using low-cost charge coupled device (CCD) technology in combination with an amplitude control servo to provide a high precision non-volatile CCD memory. The prior art does not consider and does not teach adaptive memory compensation and certainly not servo memory compensation, the prior art does not teach non-volatile CCD memories and certainly not the CCD ROM of the present invention and the prior art does not teach analog ROMs as in the memory of the present invention.

The servo system of the present invention provides for servo control of memory compensation. In a preferred embodiment, a memory compensation signal is generated in response to stored information to compensate for memory errors. Also, an implicit servo may be used for compensation of stored information such as for amplitude compensation.

One embodiment of the memory system of the present invention is a read only memory, wherein the preferred embodiment thereof is an analog read only memory using charge coupled devices. Fixed but selectable charge packets are used to charge elements in a charge coupled device array; where selectable charging may be provided by selecting resistor values, selecting capacitor values, selectable masking of photo detectors, and other such methods. The accumulated fixed packets of charge are then shifted with a charge coupled device register to provide sequential analog signal outputs. Use of an analog read only memory permits hybrid signal processing such as for voice response. Use of a serial output simplifies the accessing and reduces accessing electronics by eliminating the more complex random access arrangements. The analog read only memory of the present invention has the additional advantage of being a non-volatile memory for preserving stored information when power is removed; when conventional charge coupled device memories are volatile and lose all stored information when power is removed. The analog read only memory of the present invention is particularly useful in systems for generating analog output signals such as voice response systems and filtering systems. Accessing of analog samples from the read only memory can be controlled with a digital processor such as by controlling shifting of the charge couple device shift register and by selecting the desired output information under digital control.

The CCD embodiment of the present invention provides non-volatile storage in the form of monolithic resistors, capacitors, optical masks, and other fixed arrangements which provide charge accumulation that is a function of the fixed monolithic arrangement. Charge may be accumulated or loaded into a CCD shift register and shifted to the output in serial form, thereby eliminating complex electronics and interconnections usually required for random access memory architectures.

Further, the CCD ROM of the present invention is fully compatible with other CCD technologies such as CCD volatile memories and CCD signal processors, thereby providing a fully CCD signal processing system having non-volatile memory, alterable memory, and processing circuitry.

In another embodiment, the CCD shift register used for outputting ROM signals may also be used as an alterable CCD memory such as on a time-shared basis with the ROM capability.

Yet further, unique and useful CCD memory and signal processing circuits are provided including demodulators, multiplexers, beamformers, compositors, a hybrid memory, an adaptive refresh arrangement, and other inventive features.

The CCD ROM of the present invention provides an important solution to a major technological problem. Multitudes of electronic systems such as electronic game systems, electronic appliance systems, electronic calculators, and other such devices have been severely limited in the amount of memory available because of the high cost of memory. For example, in implementing a talking doll the memory required for speech sample storage completely dominated the total cost budget thereby rendering such a device to be economically unfeasible. Various memory alternatives were considered such as conventional CCD memories and bubble memories which are both indicated to be low in cost.

Relative to bubble memories, the cost per bit is low but only for large systems wherein bubble memories require complex overhead circuitry devices such as magnets. Therefore, although large bubble memories have a low cost per bit, a minimum bubble memory system may cost several hundred dollars due to overhead cost factors.

Relative to CCD memories, they are conceptually low in cost even for small memory systems but are inherently volatile type memories which lose information due to power removal or due to other conditions such as electrical noise. Therefore, CCD memories have been considered to be inappropriate for storing permanent information.

In view of the above, memory technologies are generally considered in the art to preclude low-cost applications requiring large amounts of memory such as an electronic talking doll system. In order to solve this "unfilled need", the present invention is directed to a CCD ROM having non-volatile storage for permanent information and having low cost.

Further, in accordance with the hybrid memory arrangement of the present invention, a hybrid memory is provided for storing analog information under digital control. Therefore a complete analog parameter may be stored in one CCD memory element in direct contrast to prior art digital memories which merely store one digital bit of one word in a CCD memory element, thereby achieving greater storage density and lower cost per word with the memory arrangement of the present invention.

An object of the present invention is to provide a low-cost electronic memory.

Another object of the present invention is to provide a non-volatile electronic memory.

Yet another object of the present invention is to provide an analog read only memory.

Yet another object of the present invention is to provide a reverberation filter.

Still another object of the present invention is to provide a non-volatile CCD memory.

Yet still another object of the present invention is to provide a combination non-volatile and volatile CCD memory.

Yet still another object of the present invention is to provide an adaptive refresh arrangement.

A further object of the present invention is to provide a hybrid memory for improved storage capacity.

A still further object of the present invention is to provide improved signal processing arrangements.

A yet still further object of the present invention is to provide a monolithic memory system.

The foregoing and other objects, features, and advantages of the present invention will become apparent from the following detailed descriptions of preferred embodiments of this invention, as illustrated in the accompanying drawings.

BRIEF DESCRIPTION OF THE DRAWINGS

A better understanding of the present invention may be obtained from a consideration of the detailed description hereinafter taken in conjunction with the drawings which are briefly described below.

FIG. 2 comprising FIGS. 2A–2D illustrates ROM arrangements in accordance with the present invention wherein FIG. 2A sets forth an optical ROM arrangement, FIG. 2B sets forth a resistance ROM arrangement, FIG. 2C sets forth an electrode dimensional ROM arrangement, and FIG. 2D sets forth an electrode dimensional ROM arrangement in combination with a parallel input load serial output arrangement in accordance with the block diagram of FIG. 1.

FIG. 3 comprising

FIG. 6 comprising FIGS. 6A–6D illustrates memory control and memory access arrangements wherein FIG. 6A sets forth a block access arrangement, FIG. 6B sets forth a computer program flow diagram for implementing block accesses, FIG. 6C sets forth an arrangement for controlling characteristics of a block of information, and FIG. 6D sets forth a computer program flow diagram for accessing multiple blocks of stored information and for controlling characteristics of each block in accordance with the ROM control logic block of FIG. 1.

FIG. 7 comprising

FIG. 9 comprising FIGS. 9A–9T illustrates signal processing arrangements using charge couple devices (CCDs) in accordance with the present invention wherein FIG. 9A illustrates a CCD channel processor arrangement; FIGS. 9S and 9T illustrate combined scale factor and bias refresh circuits using both analog and hybrid implicit servos for scale factor refresh with parallel bias and scale factor refresh circuits.

FIG. 10 comprising FIGS. 10A and 10B illustrates an improved memory access arrangement in accordance with the present invention wherein FIG. 10A sets forth a block diagram of the improved memory access arrangement and FIG. 10B sets forth a detailed diagram of a channel multiplexer in accordance with FIG. 10A.

Figure 1:
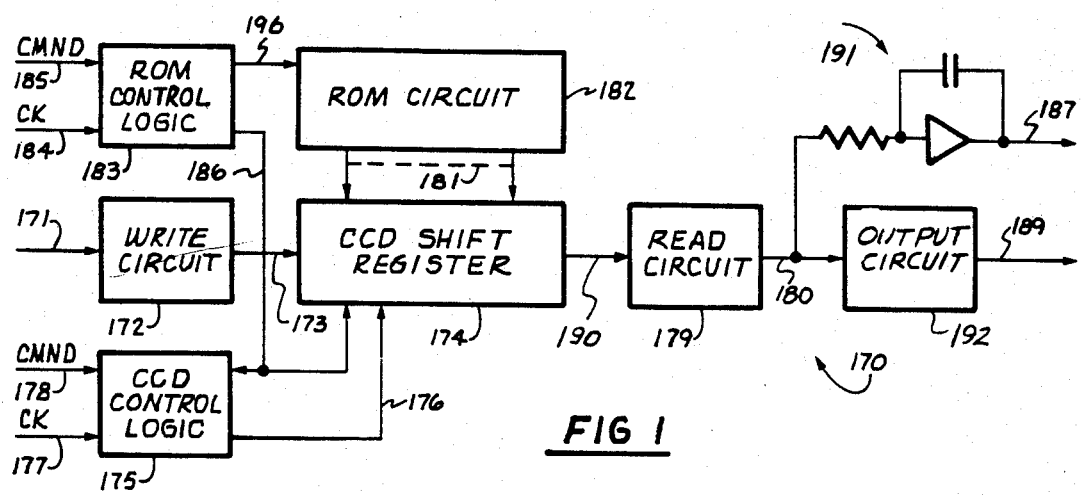
FIG. 1 comprises a block diagram of the memory system of the present invention.

By way of introduction of the illustrated embodiments, the components shown in the figures have been assigned general reference numerals and a description of each such component is given in the following detailed description. The components in the figures have been assigned three-digit reference numerals wherein the hundreds-digit of the reference numeral is related to the figure number except that the same component appearing in successive figures has maintained the first reference numeral. For example, the components in FIG. 1 have one-hundred series reference numerals (100 to 199) and the components in FIG. 2 have two-hundred series reference numerals (200 to 299).

Reference numerals may herein be presented either with alphabetical characters or without alphabetical characters; wherein corresponding reference numerals with or without alphabetical characters show relationships therebetween and alphabetical characters show alternatives therebetween. For example, FET component 992 (FIG. 9F) is related to FET components 992A and 992B (FIG. 9K) as being related but alternated embodiment; wherein these alternate devices include corresponding reference numerals to show relationships therebetween and further include alphabetical designations to identify distinctions therebetween.

Reference numerals followed by a letter R represent reference numerals used in Patent No. 4,016,540 and continuations therefrom and are so designated for consistency of cross-referencing between the instant application and said referenced patent and related applications.

DETAILED DESCRIPTION OF THE PRESENTLY PREFERRED EMBODIMENT

System Description

The electronic memory arrangement of the present invention can take any of a number of possible forms. Preferred embodiments of several features of the present invention are shown in the accompanying figures and will be described in detail hereinafter.

The read only memory (ROM) feature of the present invention 170 is exemplified with the simplified block diagram shown in FIG. 1. Input signal 171 may be an analog input signal or a digital input signal for storing in shift register 174. Write circuitry 172 writes information into CCD shift register 174 in response to input signal 171. Shift register 174 shifts signals stored therein under control of control signals 176 from control logic 175 generated in response to clock signals CK 177 and input command signals CMND 178. Signals shifted in register 174 are shifted out as signals 190 to read circuitry 179 to generate output signal 180. Fixed signals 181 may be loaded into register 174 under control of ROM control logic 183 operating in response to clock signal CK 184 and command signal CMND 185. Fixed signals 181 may be implicit in the memory structure or may be generated with ROM circuitry 182 operating under control of control signal 196 generated by ROM control logic 183 in response to clock signal 184 and command signal 185.

Many of the elements shown in FIG. 1 are either described in the copending applications incorporated by reference or are old in the art. For example, CCD shift register 174 having appropriate write circuitry 172 and read circuitry 179 and operating under control of CCD control logic 175 is well known in the art; wherein a preferred embodiment thereof is provided in copending applications incorporated herein by reference and further discussed with reference to FIG. 9 herein. For example, write circuitry 172, CCD shift register 174, and read circuitry 179 may be a single monolithic integrated circuit; wherein write circuitry 172 may comprise a monolithic write diode, CCD shift register 174 may comprise storage elements having triple electrodes deposited thereon for a three-phase clock system, and read circuitry 179 may comprise a monolithic sense amplifier and output amplifier. CCD control logic 175 may generate three-phase clock signals 176 or any other well-known clock signals such as two-phase or four-phase clock signals to control shifting of information in register 174. Control logic 175 may operate in response to a single clock signal 177 for generating multi-phase clock signals 176 and a command signal 178 for commanding shifting or non-shifting by enabling or disabling, respectively, control logic 175 for generating or not generating, respectively, multiple-phase clock signals 176. Such elements and the interconnection and cooperation therebetween are well known in the art and widely described in the literature such as in the patents referenced herein.

The loading of signals into a CCD shift register such as the loading of parallel signals 181 into shift register 174 is well known in the art and may be performed in various ways such as by accumulating photo-optically generated charge or parallel transfer of signals with CCD circuit techniques. Further, new and unique ways of loading signals 181 into register 174 are herein provided using prior art circuit techniques in a unique manner such as accumulation of thermally generated charge which is similar to accumulating photo-electrically generated charge and such as accumulating electronically generated charge by connecting ROM charging circuits 182 to CCD elements in register 174.

Various output circuits may be used such as a generalized output circuit 192 for generating output signal 189; or an integration output circuit 191 for generating integration output signal 187; or any known output circuit.

Although the prior art does not show CCD ROM arrangements nor analog ROM arrangements, well-known prior art methods may be used with some modification to provide such unique ROM capability. As will be discussed herein, ROM input signals 181 may be implicit in CCD register 174 such as by explicitly accumulating thermally generated or photo-electrically generated charge or may utilize external circuitry such as ROM circuitry 182 to provide ROM charge signals 181. ROM control logic 183 may control ROM circuitry 182 to generate ROM signals 181, may control CCD register 174 to load ROM signals 181, and may control CCD control logic 175 to enable and disable shift register operations. For example, command signal 185 to ROM control logic 183 may command readout of ROM information such as with signal 180. Command signal 185 may enable a circuit such as a well-known one-shot multivibrator to generate a predetermined duration pulse signal 196 to enable ROM circuit 182 to generate charge signals 181 for loading into register 174 and pulse signal 186 to disable CCD control logic 175 to discontinue shifting of register 174 until charge accumulation has been completed. Completion of the fixed duration signal 196 may disable ROM circuits 182 from generating additional charge and may control shifting of register 174 to shift out accumulated charge signals with register 174 as output signal 180 to external circuitry. Enabling and disabling of clock signals and use of one-shot multivibrators for time delays and timing signals is described in copending patent applications incorporated by reference herein and is well known in the art, and therefore need not be described in greater detail herein. Further, loading of parallel signals into a serial register and outputting of the signals loaded in parallel as serial signals is well known in the art and therefore need not be described further herein.

Detailed embodiments of CCD shift register 174 are shown in FIG. 9 hereinafter and detailed embodiments of ROM circuit 182 and the use thereof in memory system 170 is shown in FIG. 2 hereinafter. Further, the manner in which signals 181 are formed as fixed signals and the manner in which signals 181 are formed as analog signals will be described in detail with reference to FIG. 2 hereinafter.

The arrangement described with reference to FIG. 1 is shown in the form of parallel fixed input signals 181 and serial output signals 190 using parallel-to-serial conversion for simplicity of discussion. This arrangement exemplifies the broad scope of the present invention which is directed to non-volatile CCD signals; a unique read only memory concept, arrangement, and method; a generalized analog ROM; and other inventive features not known in the prior art. Many other arrangements can be used to implement these features wherein the present invention is not limited to CCDs, nor to parallel-to-serial arrangements, nor to any particular circuit arrangement but is generally applicable. For example, register 174 may be a bucket-brigade device, a bubble memory device, a magnetostrictive delay line, or other devices. Further, fixed signals may be charge signals 181 loaded into CCD register 174 in either explicit form with ROM circuit 182 or in implicit form such as by accumulating thermally generated or optically generated charge or may be other signals for other circuit types such as voltage signals, current signals, acoustical signals, illumination signals, or other signals. In an acoustical signal embodiment, register 174 may be exemplified by acoustical propogation in an acoustic surface wave (SAW) device and ROM circuitry 182 may be electrodes for introducing acoustical signals. In an illumination embodiment described with reference to FIG. 2A herein, ROM circuitry 182 may be implemented as an optical masking arrangement to implicitly generate photo-optically generated fixed charge signals 181. Yet further, random access such as with a conventional random access memory (RAM) may be used in place of the CCD shift register shown for a preferred embodiment. Therefore, the specific embodiment described for a CCD arrangement with reference to FIG. 1 merely exemplifies the broad scope of the present invention and is not intended to be limited to the presently preferred specific embodiment described herein.

For simplicity of discussion, the arrangement shown in FIG. 1 has a single block of ROM circuits 182 for loading fixed signals 181 into register 174. In alternate embodiments, a plurality of ROM circuits 182 may be connected having corresponding charge signals 181 connected together such as ORed together so that an appropriate ROM circuit 182 out of a plurality of ROM circuits may be selected such as by selection of the appropriate one-shot signal 225 (FIGS. 2B–2D and 3B) to select a block of ROM circuits to load fixed information into register 174.

The various portions of the memory system illustrated in FIG. 1 may be implemented with similar monolithic integrated circuit processes such as the well-known MOS technology to provide a fully monolithic memory system, thereby providing still further advantages.

Based upon the foregoing description, it can be seen that register 174 may be a conventional volatile CCD shift register for storing input information 171 and for generating stored output information 180 in addition to receiving fixed input information 181 for generating fixed output information 180. This dual function capability of memory system 170 and particularly register 174 is considered to provide important advantages in electronic system implementation.

Read Only Memory Implementation

Various means for generating fixed charge input signals 181 will now be discussed with reference to FIG. 2. For simplicity of discussion and because peripheral circuits have been discussed with reference to FIG. 1; circuits 172, 175, 179, and 183 are not shown in FIG. 2; wherein FIG. 2 shows register 174 and may also show ROM circuit 182 and fixed charge signals 181 as required to illustrate operation. FIG. 2 shows a CCD memory in the form of a conventional three-phase clocked CCD register which is modified to incorporate the features of the present invention. Because of this high level of detail in the disclosure, it is desirable to assume a particular illustrative configuration, herein selected as a three-phase clocked CCD register system. For example, FIGS. 2A–2D show three-phase clock signals P1, P2, and P3 which are used to sequence charge signals from a first to a second and to a third CCD electrode in a well-known manner, wherein construction and use of three-phase signal generators, three-phase clock interconnections, three-phase CCD registers, and three-phase CCD electrodes are well known in the art and are shown herein in schematic and illustrative form for simplicity of discussion. Such a specific embodiment is provided merely for illustrative purposes and is not intended to limit the scope of the present invention.

In order to exemplify the teachings of the present invention, a plurality of preferred embodiments will now be discussed with reference to FIG. 2. For consistency of discussion, 12 electrodes 210–221 are shown for each embodiment (FIGS. 2A–2D), wherein corresponding electrodes between the different embodiments are lined up vertically in the plane of the page of FIG. 2. An extended length of the CCD shift register is implied with the "break" schematic representation 222. Electrode and schematic break notations are lined up vertically in the plane of the page of FIG. 2 and reference numerals 210–222 apply to corresponding electrode and break notations for each of FIGS. 2A–2D. Similarly, three-phase clock signals P1–P3 are shown for each of the preferred embodiments and shown connected to corresponding CCD electrodes for each of the preferred embodiments in FIG. 2. Other corresponding elements and signals are provided with corresponding notations in FIGS. 2A–2D.

Further, the three-phase clocking system is shown with electrode triplets for each memory element, wherein the adjacent electrode triplet connected to clock signals P1, P2, and P3 form a memory element with signal transfer capability. For example, electrodes 210, 213, 216, and 219 are shown having the ROM parameter formed therewith and are associated with the second transfer electrodes 211, 214, 217, and 220 respectively and the third transfer electrodes 212, 215, 218, and 221 respectively.

In the disclosed embodiment, only a single electrode 210, 213, 216, and 219 of each electrode triplet is shown having an analog ROM parameter provided therewith for purposes of illustration. In alternate embodiments, a plurality of electrodes in each memory element may have the analog ROM parameter constructed therewith where, for example, each of the electrodes in each electrode triplet shown in each of FIGS. 2A–2D may be structured as shown for the signal electrode 210, 213, 216, and 219 in each of FIGS. 2A–2D to have ROM capability for the plurality of electrodes associated with a triplet memory element. For example, electrodes 211 and 212 may be masked as shown for electrode 210 (FIG. 2A); electrodes 211 and 212 may be connected either with or without diodes to resistor R0 or to similar resistors as shown for electrode 210 (FIG. 2B); electrodes 211 and 212 may have sizes related to the size of electrode 210 (FIG. 2C); and electrodes 211 and 212 may have ROM transfer electrodes connected thereto such as electrodes 210R, 210A and 210B for electrode 210 (FIG. 2D).

For convenience of discussion, a group of corresponding electrodes for each memory element may be herein referred to by the clock phase connected thereto wherein for example electrodes 210, 213, 216, and 219 may be referred to as the P1 electrodes. Further, a memory element may comprise a plurality of electrodes such as three electrodes for the three-phase memory system discussed with reference to FIG. 2, wherein a memory element or memory cell may be herein referred to by the electrode shown as the P1 electrode for that particular cell. For example, the memory cell comprising electrodes 210–212 may be referred to as memory element 210.

One embodiment of the analog ROM of the present invention will now be discussed with reference to FIG. 2A. Photo-optical CCD arrangements are well known in the art such as for CCD television cameras, where illumination 205 is focused upon electrodes 210–221 providing charge accumulation on an illuminated electrode that is proportional to the intensity of the illumination. If illumination 205 is uniform over the array of electrodes 210–221 and if a mask is provided for each electrode such as mask 230 (which is shown continuous but broken at point 222), the charge accumulation on each electrode in response to the uniform illumination is proportional to the size of the sensitive area which can be considered proportional to the size of the unmasked electrode portion such as the cross-hatched portions of the P1 electrodes shown outside of mask 230 (FIG. 2A). For example, the active area of electrode 210 is shown greater than the active area of electrode 213 illustrated with the unmasked (cross-hatched) portions of these electrodes; wherein photo-electrically generated charge is proportionately greater for electrode 210 than for electrode 213. For the purposes of this example, electrode 216 has the greatest magnitude analog ROM parameter followed by electrodes 219, 210, and 213 having progressively decreasing analog magnitudes for ROM parameters.

Except for the use of mask 230 and uniform illumination 205, the CCD register shown in FIG. 2A may be a conventional photo-electric CCD device including control electronics for exposing, accumulating, and outputting signals. Such conventional exposure, charge accumulation, and outputting of information may be used for the other embodiments shown in FIGS. 2B–2D.

It will now become obvious to those skilled in the art from the teachings herein that charge accumulation for each P1 electrode is proportional to the unmasked area, or sensitive area, or cross-hatched area (FIG. 2A) and therefore a group of related charge signals having predetermined relative magnitudes can be provided. A scale factor parameter may be intensity of illumination 205 and a bias parameter may be thermally generated charge accumulation during the exposure and shifting time; wherein scale factor and bias errors may be measured and/or reduced such as with the adaptive compensation arrangements shown in FIG. 9 herein.

Masking of integrated circuits is well known in the art such as using thin film techniques with photo-resist or passivation technologies, using thick film techniques such as silk screening and depositions, and using other such methods.

Alternate preferred embodiments of the ROM of the present invention will now be discussed with reference to FIGS. 2B and 2C. A command pulse 224 may be processed with circuitry 223 such as a one-shot multivibrator for generating a precision pulse signal 225 which is conducted through charging resistor $R_C$ (FIGS. 2B and 2C) and through ROM selectable resistors $R_0$, $R_3$, $R_6$, and $R_9$ 226 (FIG. 2B) to charge P1 electrodes. Diodes 227 may be used for electrical isolation. The amount of charge accumulated on each P1 electrode may be related to the magnitude of the charging resistance, which is the charging resistance $R_C$ (FIGS. 2B and 2C) and the ROM parameter charging resistance 226 (FIG. 2B) for a particular electrode and further related to the capacitance of the electrode to establish an RC time constant. For a particular charging time and charging signal amplitude (the width and amplitude of pulse 225) and for a particular RC time constant associated with the electrode, an amount of charge will be accumulated with each P1 electrode that is related to the value of the charging resistance and to the value of the electrode capacitance. For simplicity of discussion, the arrangement shown in FIG. 2B has constant dimension electrodes (implying constant capacitance values) and selectable resistor values and the arrangement shown in FIG. 2C has constant charging resistor values (implied by charging resistor $R_C$ being common to all electrodes) and selectable P1 electrode capacitance values (implied by the selectable dimensions of the P1 electrodes). From these two illustrations (FIGS. 2B and 2C), one skilled in the art will be able to provide various combinations of these teachings such as by using selected size P1 electrodes shown in FIG. 2C in combination with the arrangement of FIG. 2B having selected value resistors for providing additional control of the RC time constant for the ROM of the present invention.

After the ROM charge has been accumulated on the P1 electrodes (FIGS. 2B and 2C), multiple-phase shifting operations may be initiated with clock signals P1–P3 as is well known in the art.

In one embodiment, the P1 electrodes accumulating ROM related charge may be excited by maintaining the P1 clock signal constant for charge accumulation and by disabling the P2 and P3 clock signals to minimize charge accumulation such as thermally generated charge accumulation on the P2 and P3 electrodes.

Another embodiment will now be discussed with reference to FIG. 2C. Charge accumulation may be provided with photo-electrically generated charge 205 in response to illumination signal 205 or with thermally generated charge in response to thermal signal 206; wherein electrically generated charge through diodes 227 to the P1 electrodes may be eliminated from this embodiment. The photo-optically generated charge or thermally generated charge may be accumulated in proportion to the dimensions of the electrode. Unmasked P1 electrodes may provide photo-electric charge accumulation proportional to the area of the electrode exposed to the illumination and thermally generated charge may be accumulated in proportion to the area of the electrode. The P1 electrodes are shown having a dimension above the bias dimension 228 proportional to the ROM parameter; wherein the bias dimension 228 is shown as the dimension for the P2 and P3 electrodes for purposes of illustration.

Charge may be accumulated in response to illumination signal 205 or thermal signal 206 for a period of time and may then be shifted out of the memory as is well known for CCD imaging arrays. Charge accumulation time should be such that the amount of charge accumulated during the accumulation period does not exceed the capacity of the smaller electrodes (such as the P2 and P3 electrodes) to insure that the smaller electrodes will not be saturated as the accumulated charge from the larger electrodes (such as the P1 electrodes) are shifted through the register. Therefore, the charging time limits the maximum charge and the area of the P1 electrodes determines the magnitude of the charge to provide ROM analog parameters that will not saturate the register.

Figure 9A:
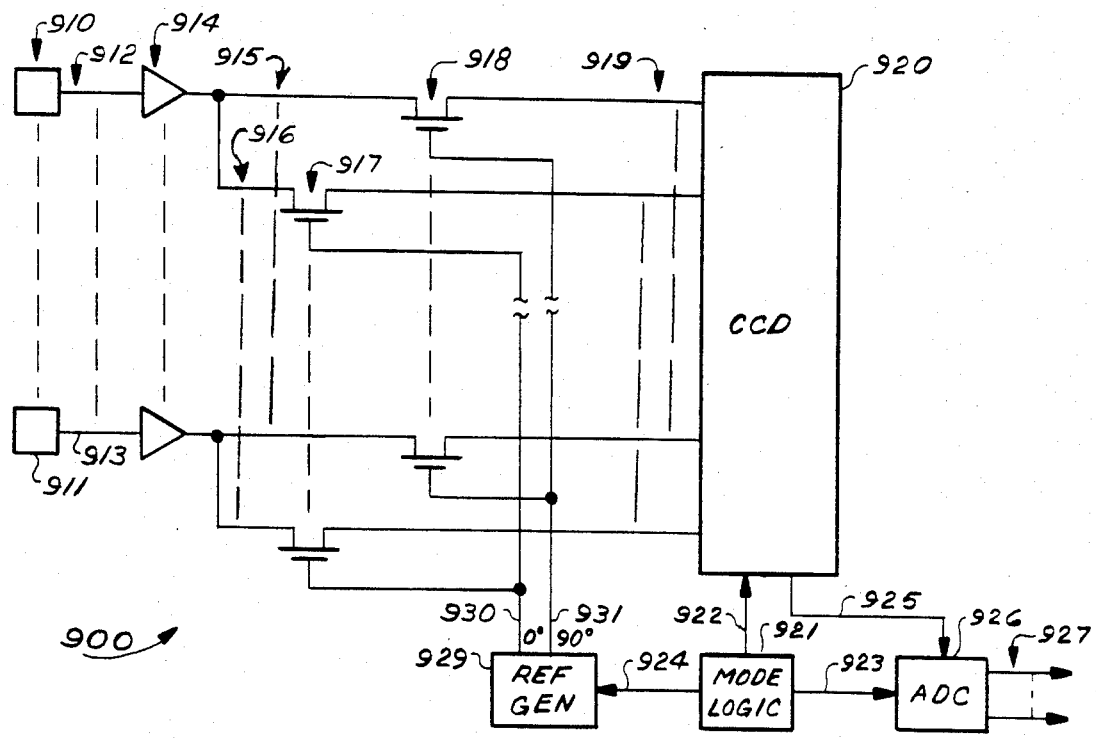
Figure 9B:
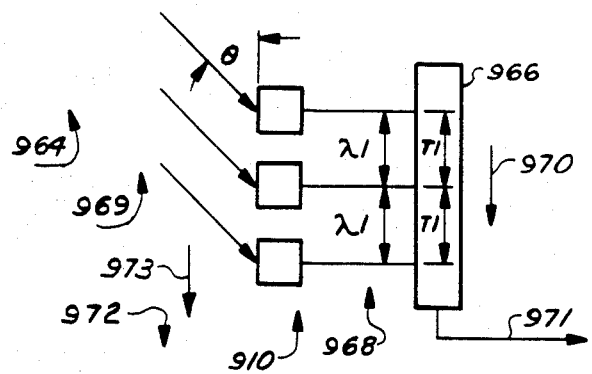
FIG. 9B illustrates a CCD beam-forming arrangement.
Figure 9C:
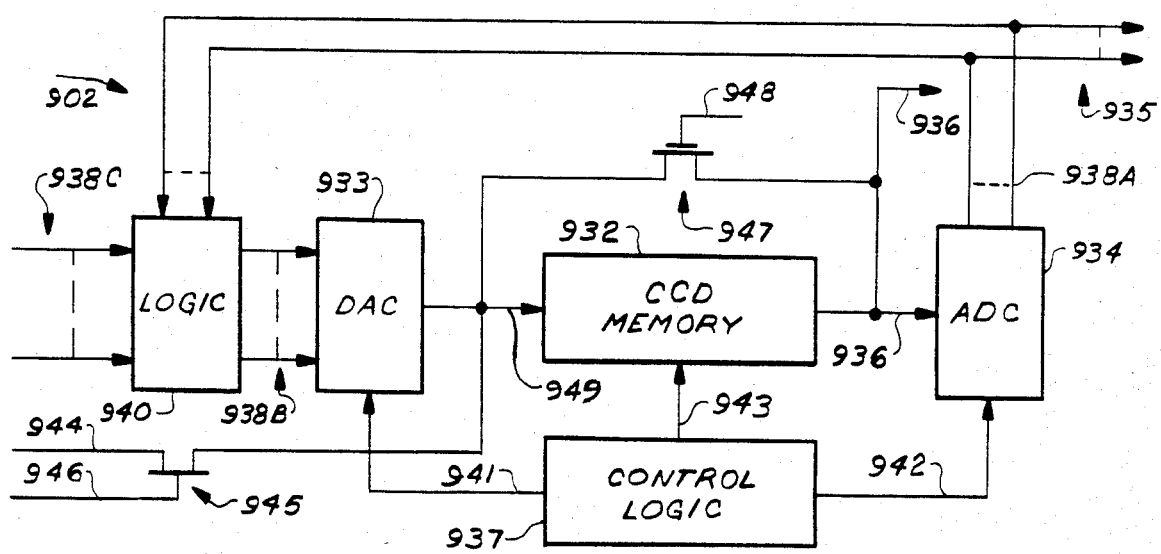
FIG. 9C illustrates a CCD hybrid memory arrangement.
Figure 9D:
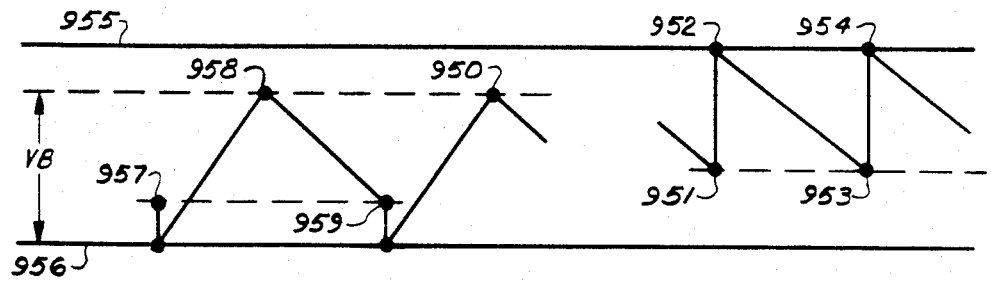
FIG. 9D illustrates signal degradation and compensation in accordance with the hybrid memory arrangement of FIG. 9C.
Figure 9E:
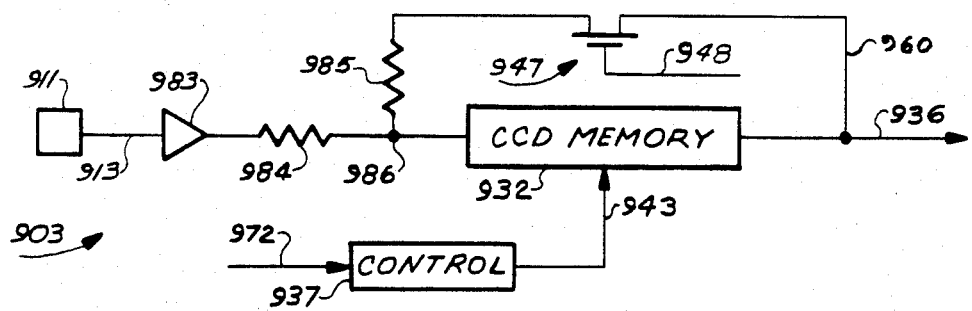
FIG. 9E illustrates an alternate embodiment of a CCD memory arrangment.
Figure 9F:
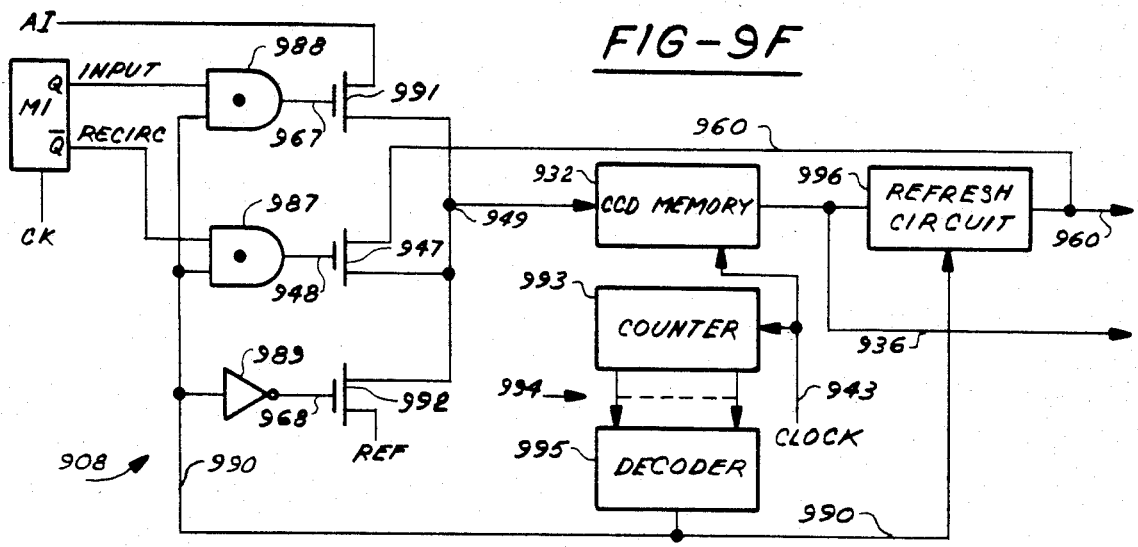
FIG. 9F illustrates an adaptive memory refresh arrangment.

An adaptive compensation arrangement may be used, where one of the P2 or P3 electrode signals may be used as a bias signal and one of the P1 electrode signals may be used as a scale factor signal or alternately P1 electrode signals may be used for both bias and scale factor signals in accordance with the adaptive compensation arrangement shown in FIG. 9F et seq.

Another alternate embodiment will now be discussed with reference to FIG. 2D. Charge accumulation may be provided with an independent set of electrodes, the R electrodes, wherein charging may be provided with electrical charging through diodes 227 and charging resistor $R_C$ as discussed with reference to FIG. 2C above; or may be photo-electric charging as discussed with reference to FIGS. 2A and 2C above; or may be thermal charging as discussed with reference to FIG. 2C above. Alternately, R electrodes may be constant in dimension and may be charged through weighted resistors as discussed with reference to FIG. 2B above or alternately R electrodes may have controllable capacitance and controllable resistance associated therewith for having a selectable RC time constant, as discussed with reference to FIGS. 2B and 2C above.

Using any of the analog ROM charging techniques discussed herein, auxiliary electrodes R may be charged to a level related to a desired ROM parameter. These ROM parameters may be stored on the R electrodes as analog charge accumulated with any of the above-listed methods or with other methods that will become obvious to those skilled in the art from the teachings herein. The charge accumulated on the R electrodes may be transferred through transfer electrodes A and B to the P1 electrodes of the CCD shift register. Transfer may be provided with a three-phase clock having the corresponding R, A, and B electrodes of the parallel transfer shift register as being the three-phase triplet electrodes associated with a memory element. Parallel transfer of information through the R, A, and B electrodes into the shift register and then serial transfer of the shift register information through the P1, P2, and P3 electrodes is well known in the art and need not be described in greater detail herein.

It may be desirable to clear register 174 prior to charge accumulation operations. Such register clearing may be provided by rapidly shifting all of the information out of register 174 to minimize photo-electrically and thermally generated charge accumulation and disabling electrical inputs into register 174 to minimize electrically generated charge accumulation.

Diodes, charging resistors, and various other components may be used as required; wherein certain diodes and resistors are shown herein in order to exemplify the use of such components, but not to establish a requirement. For example, charging resistor $R_C$ merely sets a time constant for charging of the P1 electrodes (FIGS. 2B–2D). Further, diodes $D_0$, $D_3$, $D_6$, and $D_9$ are shown for illustrative purposes to provide isolation between enable signal 225 and the P1 electrodes. Still further, one-shot multivibrator 223 is shown for generating output pulse 225 having a prescribed pulse width in response to input ROM command pulse 224 which may be a digital signal or other type of command signal. Still further, element 223 may include amplitude control circuits such as for providing a precise voltage amplitude for pulse 225, a precise current for pulse 225, or other pulse characterstics. Yet further, variations in charging signals such as illumination signals 205, thermal signals 206, and electrical pulse 225 may be compensated for with the adaptive refresh arrangement shown in FIG. 9 herein. For example, one of the P1 electrodes may be a reference electrode for providing a reference signal used to compensate the other signals such as for scale factor compensation or a plurality of the P1 electrodes may be reference electrodes for providing a plurality of reference signals such as for bias and scale factor compensation. For this example, electrodes 216 having a large charge signal impressed thereon may be used for a scale factor reference signal and electrodes 213 having a small charge signal impressed thereon may be used for a bias reference signal consistent with the adaptive compensation arrangements shown in FIG. 9F et seq herein.

For consistency of discussion, each of the presently preferred embodiments shown in FIGS. 2A–2D have consistent structure and consistent magnitudes for cross-referencing therebetween. For example, the exposed electrodes shown in cross-hatched form in FIG. 2A have a cross-hatched dimension proportional to the ROM signal amplitude; wherein the relative magnitudes of these cross-hatched segments are consistent with FIG. 2B wherein resistors $R_0$, $R_3$, $R_6$, and $R_9$ (FIG. 2B) may have values proportional to the cross-hatched dimensions of the exposed electrodes shown in FIG. 2A; wherein dimensions of the P1 electrodes (FIG. 2C) may be consistent with the ROM parameters of corresponding electrodes in FIG. 2A; and wherein the dimensions of each ROM electrode R (FIG. 2D) may be consistent with the dimensions of the cross-hatched electrodes of FIG. 2A for consistency of discussion of these presently preferred embodiments.

One feature of the present invention is a fully monolithic memory arrangement wherein it is herein intended that all elements may be provided on the monolithic structure such as monolithic resistors $R_C$, $R_0$, $R_3$, $R_6$, and $R_9$; diodes $D_0$, $D_3$, $D_6$, and $D_9$; and control electronics such as circuit 223.

Although the ROM feature of the present invention has been discussed for an analog ROM embodiment, those skilled in the art will readily recognize that a digital ROM embodiment is a simplified version of an analog ROM, wherein the digital ROM merely has two amplitude levels instead of a plurality of intermediate amplitude levels; wherein the two digital amplitude levels may be the highest level and the lowest level or the scale factor level and the bias level such as discussed for the adaptive compensation arrangement with reference to FIG. 9. Therefore, any references herein to an analog ROM or an ROM in general is also intended to imply a digital ROM as an alternate embodiment.

For simplicity of discussion, a simplified schematic representation of CCD structure has been discussed relative to FIG. 2. Expansion of this simplified schematic representation into a full design will now become obvious to those skilled in the art from the teachings herein. For example, FIG. 2A shows a simplified photo-optical CCD electrode pattern to exemplify the ROM photo-optical mask teaching of the present invention. Well-known photo-optical CCDs accumulate photo-optically generated charge with an electrode from a sensitive charge generating area. For simplicity, the sensitive charge generating area is illustrated as the electrode area. Further, well-known photo-optical CCDs use one set of accumulating electrodes and another set of shifting electrodes (similar to the arrangement shown in FIG. 2D) but for simplicity of illustration these accumulating and shifting electrode functions are shown combined into one set of electrodes.

In view of the above, a method for providing a non-volatile analog ROM in conjunction with a CCD circuit has been provided. This specific embodiment is exemplary of many other embodiments and may be implemented for read only memories and/or alterable memories, non-volatile memories and/or volatile memories, CCD memories and/or other types of memories, analog memories and/or digital memories, and other alternatives and/or combinations of the features of the present invention.

CCD Register Control Electronics

Control electronics for CCD registers will now be discussed in simplified form to illustrate implementations thereof, although many other control arrangements are well known in the art andd may be used with the system of the present invention.

Figure 3A:
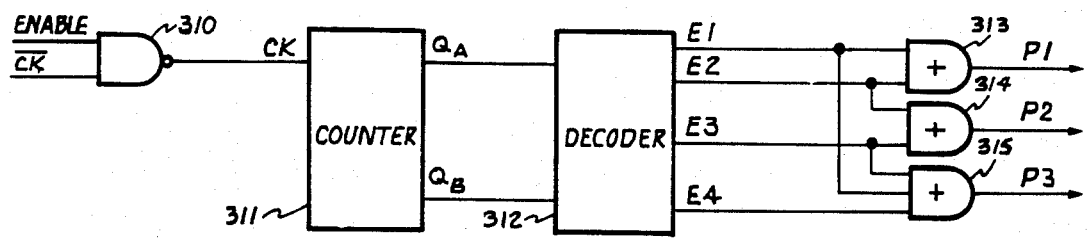
FIGS. 3A and 3B illustrates memory control electronics wherein FIG. 3A sets forth a three-phase clock circuit in accordance with the CCD control logic block shown in FIG. 1 and FIG. 3B sets forth an ROM control circuit in accordance with the ROM control logic block of FIG. 1.

A three-phase clock generator will now be discussed with reference to FIG. 3A. An inverted clock signal $\overline{CK}$ is input to an NAND-gate 310 and is controlled with the enable signal. When enabled, the clock signal is inverted with gate 310 amd applied to counter 311. Counter 311 sequences through a plurality of states such as with a two-state counter having two output signals $Q_A$ and $Q_B$. Decoder 312 may decode counter signals $Q_A$ and $Q_B$ to provide one of four output signals E1–E4 related to the state of counter signals $Q_A$ and $Q_B$. Decoder output signals E1–E4 may be used directly as multiphase clock signals or may be logically combined to provide other clock signals.

For example, it may be desired to have overlapping clock signals such as for the P1 signal overlapping the P2 signal during the transition therebetween, the P2 signal overlapping the P3 signal during the transition therebetween, and the P3 signal overlapping the P1 signal during the transition therebetween; but where all three signals P1–P3 do not overlap at the same time. This can be achieved by ORing together the E1 and E2 signals with OR-gate 313 to form the P1 signal; ORing together the E2 and E3 signals with OR-gate 314 to form the P2 signal; and ORing together the E3, E4, and E1 signals with OR-gate 315 to form the P3 signal to use up the remainder of the four-bit counter times and to overlap the P1 signal. The logical diagram shown in FIG. 3A uses well-known components wherein NAND-gate 310 may be an S/N 7400 gate, counter 311 may be an S/N 7493 counter, decoder 312 may be an S/N 7445 decoder, and OR-gates 313 and 314 may be S/N 7432 gates.

The memory output control circuit will now be discussed with reference to FIG. 3B. A word counter 316 is conventionally used to count shift clock pulses to maintain track of the information being shifted out of a shift register. NAND-gate 317 may be used to logically combine a plurality of word counter outputs to detect the last word, or the first word, or a selected word in the count sequence. For example, when word counter 316 has a maximum output of all-ones, indicative of the last word being shifted out of the shift register; the all-one condition detected by gate 317 generates a low output signal 224 indicative of the last word being output. Signal 224 enables one-shot 223 which may be a one-shot multivibrator or synchronous one-shot circuit to generate a single charging pulse 225 (FIGS. 2B–2D and 3B) to initiate charging of the CCD electrodes with the fixed parameter prior to again enabling shifting operations with the next cycle of word counter 316.

The CCD shift register may also be used for alterable memory storage, wherein the ROM parameter can be disabled with signal 319 disabling gate 317 to disable circuit 223 to prevent generation of ROM command pulse 225; thereby making the CCD register available for alterable memory operations. These memory output control circuits may be implemented with commercially available integrated circuits, wherein counter 316 may be an S/N 7493 counter, NAND-gate 317 may be an S/N 7430 gate, and one-shot 223 may be an S/N 74121 monostable multivibrator or alternately may be a synchronous one-shot as discussed in copending patent application Ser. No. 754,660 with reference to FIG. 4H at page 36 line 4 to page 37 line 23 therein.

Filtering Arrangement

An improved filtering arrangement will now be discussed with reference to FIG. 2A. Although this filtering arrangement will be discussed in the embodiment of an electro-optical, analog, CCD, correlator arrangement; this description merely exemplifies the general principles of implementing any of multitudes of filters which may be analog or digital and which may be correlator, Fourier transform, matched filter, or other filter types with CCD or other technologies for applications such as pattern recognition and signal processing.

Correlation is implemented by obtaining a plurality of signal samples, multiplying each signal sample by a related constant parameter, and then summing all of the products as is well known in the art. For illustrative purposes in exemplifying the improvement of the present invetion, the input signal samples are illumination signal samples projected on a CCD imaging array, the reference signal samples are defined by masking of illumination sensitive elements of a CCD array, and the summation is provided with an analog integrator at the output of the shift register. A well-known imaging CCD array may be modified by providing a mask 230 as discussed with reference to FIG. 2A above, wherein the unmasked sensitive areas (shown in cross-hatched form) represent a constant magnitude or ROM parameter. An illumination image projected on the masked CCD array provides charge accumulation that is a function of (1) the intensity of illumination exposing a sensitive CCD element and (2) the dimensions of the sensitive CCD element. Therefore the charge accumulation may be proportional to both of these parameters, illumination sample intensity and masked sample dimensions, resulting in charge accumulation related to the product thereof. After a controlled charge accumulation time as implemented with well-known non-masked non-correlator imaging CCDs; the CCD shift register may shift the products out of the shift register and into a summing or integrating circuit such as circuit 191 (FIG. 1) for integration of CCD output signal samples 180 to provide integrated correlated output signal samples 187.

This correlation inventive feature may be better understood in view of the patent to Buss referenced herein. Buss provides for electronic generation of each of two sets of signal samples, electronic multiplication between corresponding sets of samples, and integration with a summing amplifier SA (FIGS. 1 and 2 therein). This is significantly different from the correlator feature of the present invention which provides multiplication with an extremely simple CCD photo-optical structure.

In an alternate embodiment, the summing of the photoelectrically generated products, generated in accordance with the teachings of the present invention, may be performed in parallel in a manner illustrated in the referenced Buss patent.

In still another embodiment, an optical image 205 may be focused and swept across the masked CCD array (FIG. 2A) to attempt to determine a peak output signal 187; indicative of correlation between a masked reference signature and an illumination image. Optical sweep techniques are well known in the art and are performed with oscillating mirrors and other mechanical devices. Alternately, a solid state liquid crystal scanning arrangement is discussed in copending patent applications Ser. No. 727,330 and Ser. No. 730,756 referenced herein.

Thin and thick column masking techniques have been discussed with reference to FIG. 2A above, wherein these masking methods provide relatively permanent masks which are inexpensive but may be difficult to change. In accordance with another feature of the present invention, a changeable mask selected from a plurality of masks may be interposed between an illumination source and an imaging CCD array such as with a slide or microfilm image. Illumination that is masked by the interposed selected mask may be projected onto the CCD imaging array to implement the above-described correlator having a changeable mask arrangement. In one version of this embodiment, an image may be scanned across the mask for projection of a scanned mask image onto the CCD imaging array for correlation, as discussed above for the permanent mask embodiment. The scanned image may be a picture of a fingerprint, a persian rug, an acoustical signal from an anti-submarine warfare oscillagram, or any other pictorial signal requiring correlation with a predetermined signature.

In accordance with the optical filter feature of the present invention discussed above, an arrangement will now be discussed for improving correlation operations. Correlation is improved if the images of the reference and the input patterns have the same size and orientation. Size may be adjusted with projection arrangements of lenses or other well-known optical devices such as a well-known zoom lens which may preserve focus while changing dimensions. Further, angular orientation may be controlled with well-known optics such as with a well-known dove prism or with a rotational holding fixture which may be rotated to control angular orientation of an image. For the rotational optics, a preferred embodiment would place the rotational optics inbetween the input pattern and the fixed or masked pattern. For mechanical rotational control, either the mask reference image may be rotated, or the input image may be rotated, or both may be rotated to provide proper angular orientation therebetween. Still further, relative position may be controlled with well-known scanning optics or positioning devices. Such arrangements are described in referenced application Ser. No. 152,105 and Ser. No. 366,714 and continuations therefrom.

For simplicity of discussion, the masking arrangement of the present invention has been discussed with reference to FIG. 2A using an opaque mask. Alternately, the mask may have various degrees of transmissivity (constructed with well-known methods such as photographic methods) and need not be fully opaque, wherein the product parameter will be related to the illumination sample intensity and the masked area as discussed above and further will be related to the mask transmissivity for the present embodiment.

In still another alternate embodiment, mask 230 (FIG. 2A) may fully overlay all of the CCD element sensitive areas so that the fixed parameters are not area, but may have selected transmissivity, wherein the fixed parameter may be transmissivity and which operates in the same manner as discussed above for the opaque area mask.

A preferred embodiment of the correlator feature of the present invention will now be discussed with reference to FIG. 4. System 400 includes source 410 for generating illumination 411 which is processed with optics, images, and masks to generate processed illumination 421 for conversion with CCD electronics 422. Source 410 generates illumination 411 which may be processed with input optics 412 to generate preprocessed illumination 413 for illuminating image 414. Image illumination 415 may be processed with intermediate optics 416 for generating processed image illumination 417 for illuminating mask 418 to generated masked image illumination 419 which may be projected on CCD electronics 422 with projection optics 420 generating projection illumination 421. Filtered output signal 427 may be recorded, processed, or analyzed with well-known means and methods.

Rotation control 423 may be any convenient rotation control but in a preferred embodiment may be implemented as discussed in referenced application Ser. No. 152,105 and Ser. No. 366,714 and continuing applications therefrom. Rotation control 423 may rotate image 414 with linkage 424, optics 416 with linkage 425, mask 418 with linkage 426, or with other well-known methods. Image and/or mask rotation may be implemented as mechanical rotation of insertable images and/or masks. Optics rotation may use a well-known dove prism arrangement.

Source 410 and optics 412, 416, and 420 may be any well-known devices such as a projection bulb for source 410 and lenses, filters, fiber optics, prisms, sweep or scanning optics, etc for optics 412, 416, and 420 implemented in well-known arrangements. Further, optics 412, 416, or 420 may include a zoom lens for image dimensional control and may include a dove prism for rotational control. Image 414 and mask 418 may be exemplified with photographic slides and CCD electronics may be exemplified with a conventional CCD image sensor.

Stereo Reverberation Unit

A stereo reverberation unit is discussed in detail in parent application Ser. No. 812,285 at page 35 line 2 through page 38 line 4, which discussion is herein incorporated by reference.

In one embodiment, delayed sound signals can be mixed with non-delayed sound signals to provide various advantages. For example, if reverberation device 500 degrades signals, then mixing of degraded delayed signals with non-degraded non-delayed signals can provide both signal quality plus signal reverberation. In this embodiment, mixer 502 can mix delayed signal 516 with non-delayed signal 504 to provide the combination thereof.

Also, volume and/or amplitude and/or filter controls can be provided for mixing controllable amplitudes such as by implementing mixing resistors 512 as well-known variable resistors such as potentiometers.

Further, a plurality of channels can be provided such as for a stereo record player or stereo FM radio wherein each channel can have a reverberation unit with separately controllable delay, amplitude, etc. Further, mixing between channels can be provided such as by mixing a signal from a first channel, either delayed or non-delayed, with a signal from a second channel, either delayed or non-delayed.

Yet further, well-known reverberation effects such as echos, flanging, etc can now be implemented with the system of the present invention by one skilled in the art from the teachings herein.

Figure 5:
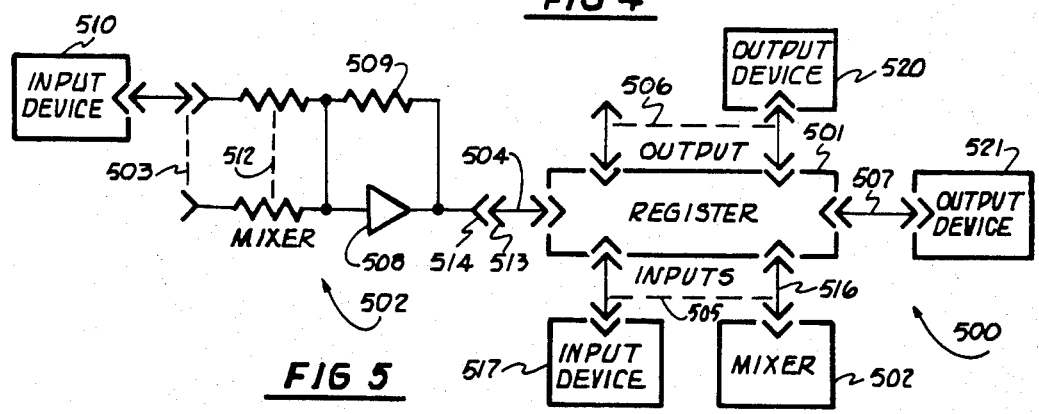
FIG. 5 comprises a reverberation filter embodiment of the memory system of the present invention.

Still further, the adaptive analog refresh arrangement discussed with reference to FIGS. 9F to 9T herein using reference signals can be used with the reverberation unit discussed with reference to FIG. 5 herein to improve precision and capability.

Yet still further, the reverberation unit of the present invention can be used with frequency synthesizers, electronic organs, the audionic arrangement disclosed in the referenced applications, and multitudes of other applications.

The controllable clock rate discussed can be provided with well-known rate multipliers, voltage controlled oscillators, etc or can be provided with arrangements disclosed in referenced application Ser. No. 550,231.

In view of the above, a programmable arrangement is provided for summing signals and for time delaying signals using any of a plurality of types of output devices for generation of signals having programmable summation and time delay characteristics.

Data Processor Architecture

In accordance with another feature of the present invention, an improved data processor architecture will now be described.

An improved data processor architecture having an integrated circuit ROM and an integrated circuit alterable memory has been described in copending application Ser. No. 101,881; wherein the improved ROM and alterable memory of the present invention may be used in place of the ROM and alterable memory of that data processor. For example, a CCD ROM and a CCD shift register memory may be used for the ROM and alterable memory of said data processor. The alterable memory in said data processor is disclosed as a shift register memory, wherein use of the shift register memory disclosed herein in CCD shift register form is readily adaptable to said data processor by one skilled in the art from the teachings herein. Similarly, the ROM of the present invention may be adapted to that data processor.

Although the ROM of the present invention is described herein as a serial shift register ROM and is described in said copending application as being a random access ROM, one skilled in the art will be able to adapt the architecture of said data processor to utilize the ROM of the present invention. For example, data processors using disk and drum memories for permanent program and alterable data storage are well known in the art, wherein the CCD ROM shift register and alterable shift register arrangements of the present invention may be used to replace the disk and drum memories in such prior art computer architectures. One such data processor is the Verdan computer manufactured by North American Aviation and used on the GAM-77 Hound Dog missile system. This data processor uses a small disk memory for program storage and for data storage, wherein the CCD ROM and CCD alterable memory of the present invention may be adapted by one skilled in the art to that type of data processor architecture from the teachings herein.

Alternately, the CCD ROM and CCD alterable memory of the present invention may be used in the form of an off-line memory such as with prior art disk and drum memories. For example, the data processor may have a self-contained main memory for storing program and operand information, wherein the program information may be loaded from the off-line memory, and wherein well-known prior art disk or drum memories may be replaced by the improved ROM and alterable memories of the present invention. Such a data processor architecture may load programs and data from a CCD off-line memory into the internal working memory which may be a well-known IC RAM such as used in micro-computers, then the data processor may execute the program from the internal RAM for processing information.

A data processor may have only low computational speed requirements but may have large program memory requirements. For example, a speech response data processor may be required to store large amounts of speech information for generating many words, but a word may not have to be generated any more rapidly than once per half second and word samples may not have to be generated any more rapidly than once every millisecond. This represents a computational requirement of possibly three orders of magnitude (1,000 times) slower than provided with conventional computers. Therefore, a serial memory including both ROM and alterable memory used in conjunction with a serial computer may provide both a low-cost memory and a low-cost processing capability. One form of serial computer is described in said application Ser. No. 101,881. Another form of serial computer is the Verdan computer referenced above. Many other serial computers are well known in the art and may be adapted to use the serial ROM and serial alterable memory arrangements of the present invention from the teachings herein.

An incremental digital differential analyzer (DDA) and other processors may utilize the memory arrangements of the present invention. For example, one incremental-type structure is discussed in copending application Ser. No. 754,660 requiring a fixed constant memory register and an alterable memory register for incremental computational elements. In accordance with the present invention, a serial CCD ROM may be used to store a fixed parameter and a serial alterable memory may be used to store an alterable parameter; wherein serial processor architectures such as DDA processor architectures are well known in the art.

Further, many applications require analog output information in response to analog input information, but the information is processed under digital control. Such applications can efficiently use the system of the present invention which can receive and store analog input information in the analog alterable memory; can store analog fixed information in the analog ROM; can process information under digital computer control as discussed for the improved processor architecture of the present invention or with the processor described in application Ser. No. 101,881; and can output analog information such as analog information stored in the analog memory arrangements of the present invention. One such embodiment may be a digital audionic system of the form described in U.S. Pat. No. 4,060,848; wherein sound samples may be stored in analog signal form in an analog ROM implemented in accordance with the present invention, wherein stored sound samples may be selected under digital data processor control such as with the digital data processor of said patent and may be output as analog signal samples to drive a sound transducer in accordance with said patent. One improvement for said digital audionic system provided with this feature of the present invention would be the use of an analog ROM to replace the digital sound sample memory of said patent to provide an analog sound sample memory for generating the analog sound samples to the sound transducer set forth in said patent.

Analog ROM Data Selection

A memory architecture will now be described for selecting a block of words from a memory, for selecting a plurality of blocks of words from a memory, and for controlling important parameters of these blocks of words. These features will be discussed for the preferred embodiment of the analog ROM of the present invention with reference to FIG. 6, but are intended to be exemplary of general memory access and signal processing arrangements. The arrangement discussed with reference to FIG. 1 will be used as a basis for the discussion of the memory accessing arrangement of FIG. 6; wherein additional circuitry is provided in FIG. 6 to illustrate selection of particular words or signals stored in the analog ROM of the present invention.

A block access control arrangement will now be discussed with reference to FIG. 6A. As discussed with reference to FIGS. 1 and 3; word counter 316, decoder 317, and one shot 223 generate ROM read pulse 225 to initiate loading of ROM signals 181 from ROM circuit 182 into CCD shift register 174 in preparation for shifting ROM signals 181 out of register 174 as output signal 190 to read circuit 179. Output signal 180 from read circuit 179 is processed with output circuit 192 to generate output signal 189. In one embodiment, output signal 189 is an analog output signal corresponding to one of a plurality of analog signals stored in the analog ROM of the present invention, which ROM comprises ROM circuit 182 and register 174. In the present illustrative embodiment, output circuit 192 may be a sample-and-hold circuit for sampling one of a plurality of output signals 180 shifted as a sequential set of output signals under control of clock signal 176. Selection circuitry 600 may be used to select which of the plurality of analog output signals is sampled with sample-and-hold 192 for storage as output signal 189.

Selection of a particular ROM word out of a plurality of words is accomplished by comparing a selected word address stored in Z-register 624 with the addresses of each of a sequence of words generated with counter 316 using comparator 617, wherein the output of comparator 617 is indicative of the address of the ROM output word identified with counter word 613 being equal to the selected word address 612 from Z-register 624. When such an address coincidence is detected with comparator 617, comparator output A=B enables one-shot 223B to load the selected analog sample 180 for storing the output sample as signal 189. Stored signal 189 may be used to excite a sound transducer such as transducer 104R shown in FIGS. 1A, 1B, and 3 of referenced U.S. Pat. No. 4,016,540. Alternately, output circuit 192 may be an A/D converter such as the converter discussed with reference to FIG. 3 of referenced U.S. Pat. No. 4,016,540 or any other known A/D converter. Alternately, output circuit 192 may be a combination sample-and-hold and A/D converter or other known analog, hybrid, and/or digital signal processing arrangements.

Memory signal selection is shown as a computerized signal selection under control of computer 112R (FIG. 6A) for convenience of illustration and for consistency with referenced applications. This preferred embodiment is illustrative of many alternate embodiments that may be implemented by those skilled in the art from the teachings of the present invention. Computer 112R may be any computer or alternately may be non-computerized circuit arrangements but in a preferred embodiment computer 112R is the computer disclosed in detail in application Ser. No. 101,881 and in continuations therefrom. Computer 112R may monitor discrete memory ready input signal DI-11 as being indicative of the memory being ready to accept a new memory address word. Computer 112R may detect memory ready signal DI-11 with a skip-on-discrete instruction and may output a memory address word to register 624 with an I/O instruction which generates an OW gated clock pulse signal 340R such as the OW-7 signal or other selected OW signal and the A0Q accumulator output word 342R to Z-register 624 similar to the arrangements discussed in application Ser. No. 101,881 and U.S. Pat. No. 4,036,178. Z-register 624 has been discussed in detail in application Ser. No. 101,881 as a parallel scan-in register having complement outputs, but alternately Z-register 624 may be implemented as a conventional shift register such as the $C_I$ shift register discussed in application Ser. No. 101,881 and U.S. Pat. No. 4,036,178. To avoid conflict with the $C_I$ register as discussed in U.S. Pat. No. 4,036,178; the OW output channel associated with the Z-register of application Ser. No. 101,881 has been selected for illustration of the arrangement shown in FIG. 6A, wherein Z-register 624 is associated with said previously disclosed and available channel. The complement outputs of said Z-register may be compensated for by complementing the memory address word prior to outputting under program control of computer 112R, or using the uncomplemented outputs of each stage of the Z-register in place of the complemented outputs, or by incorporating inverters in either input signal line 342R or output signal lines ZQ 612, or by using an implementation similar to the $C_I$ register implementation in place of the Z-register implementation, or with other arrangements.

Output signals ZQ 612 may be compared with word counter output signals 613 using comparitor 617. Comparitor 617 may be a SN7485 four-bit comparator as discussed on pages 202–207 of the referenced TI TTL Data Book. Such an SN7485 comparator compares four input bits A0–A3 from Z-register 624 with four input bits B0–B3 from word counter 316 and generates an equivalent output A=B when the count word B0–B3 613 from counter 316 becomes equal to the word A0–A3 stored in Z-register 624. Comparator 617 is shown as a single four-bit comparator for simplicity of discussion, but such comparators may be expanded as discussed at page 202 in the TTL Data Book to achieve comparison of longer address words. The output of comparator 617 is low for a non-comparison condition and is high for one clock interval of word counter 316 for the clock interval that the number in counter 316 is equal to the number in Z-register 624. This positive pulse output from comparator 617 is inverted with inverter 614 to generate negative pulse 224B to set latch 615 and to initiate generation of pulse 225B with one-shot 223B. Latch 615 may be an SN74279 latch which is set with negative going pulse 224B to generate a high discrete input signal DI-11 and which is reset with the negative going discrete pulse DO-11 to generate a low discrete input signal DI-11. One-shot circuits 223 and 223B are similar to one-shot 223 discussed with reference to FIG. 3B. One-shots 223 and 223B are disabled when disable signal 619 goes low.

Output signal 225B from one-shot 223B strobes sample-and-hold 192 to load a particular one of a sequence of analog output samples from register 174. Output circuit 192 stores the selected memory sample for a period of time, which may be one memory access iteration, or which may be a computer controlled time delay, or which may be other controlled periods for updating output signal 189.

Figure 3B:
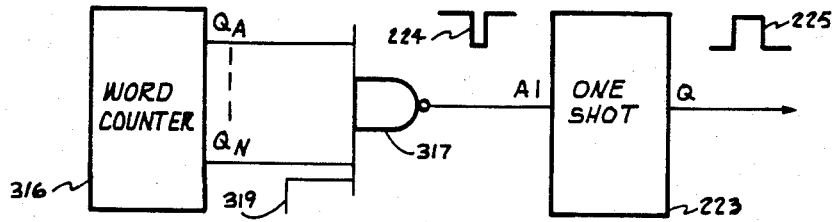

Word counter 316, decoder 317, and one-shot 223 may be implemented as discussed for FIG. 3B above for sequentially outputting fixed sequences of ROM signals from register 174. Outputting of a sequence of addresses into Z-register 624 from computer 112R causes the sequence of selected analog words from register 174 to be latched in sample-and-hold 192 as a sequence of latched analog signals generated as signal 189. Signal 189 may be used to drive a sound transducer such as transducer 104R (FIGS. 1A, 1B, and 3 of U.S. Pat. No. 4,016,540) or may be used to excite other analog, hybrid, or digital circuits.

A standby, non-operating, or other condition may be provided such as with various disable or standby mechanizations. Exemplary mechanizations are discussed below. One-shots 223 and 223B and decoder 317 may be disabled with disable signal 319. A disable signal may be packed into stages Z0–Z11 of Z-register 624 such as the YL3 signal from the Z9 stage of Z-register 624 disclosed in FIG. 14A of application Ser. No. 101,881 and shown in FIG. 6A herein as Z-register 624. Alternately, the address of a standby signal may be loaded into Z-register 624 to select such word from register 174 for loading into circuit 192 to provide a standby output signal 189. Further, for applications where a change in output word 189 is used such as for driving sound transducer 104R, merely not changing the word in Z-register 624 may result in a constant signal being loaded into circuit 192 for providing a constant output signal 189 as a standby condition.

For simplicity of discussion, an arrangement is shown in FIG. 6A wherein a stored word is latched in sample-and-hold 192 when it becomes available from the output of register 174 and therefore the time that such signal is latched is a function of the storage location of that signal or the address of that signal. If the shifting time of register 174 is short compared to the holding time of output circuit 192, then the differences in access time for various signals may be of no consequence. Further, if signals are sampled in sequence such as for a sequence of sound samples stored in adjacent memory locations for an audionic embodiment, the difference in access time for adjacent signals may be only one shift clock period and therefore may be inconsequential. For applications where the access time delay is critical, access time delays may be equalized with any of a number of arrangements. Exemplary arrangements are discussed below.

In one alternate embodiment, accessing of an appropriate stored signal can be used to hold the accessing of other signals, where the desired signal is held until sampled at a fixed time. For example, detection of coincidence signal 224B with latch 615 can hold shifting of register 174 such as with signal DI-11 disabling clock pulse generator as the enable signal to gate 310 (FIG. 3A) or as command signal 178 to logic 175 (FIG. 3B and FIG. 6A). Hold signal DI-11 preserves output signals 190 and 180 of register 174 to be sampled by output circuit 192 at a fixed time, where signal 225B from one-shot 223B strobes circuit 192 at such a fixed time to load the output of register 174 that is held in a static condition with the hold signal.

In another embodiment, second sample-and-hold 625 stores output signal 189 of the first sample-and-hold 192 in response to signal 225 from one-shot 223, which signal 225 can occur at a fixed time interval. Therefore, sample-and-hold circuit 192 provides temporary storage for analog signal 180 when it becomes available in response to signal 225B and sample-and-hold 625 provides synchronous storage of the analog signal loaded from temporary sample-and-hold 192 at a fixed or synchronous time interval to provide synchronous output signal 189A in response to non-synchronous signal 189. Many other arrangements for synchronizing the analog output signal from the analog ROM will now become obvious from the teachings herein.

In accordance with another feature of the present invention, the memory arrangement of the present invention, which is characterized by the CCD analog ROM, may be accessed rapidly to minimize errors such as charge leakage errors, even for a low duty cycle requirement. For example, an audionic system may require output samples to be provided at a 10 KHz rate, but the CCD memory may be shifted at 10 MHz shift rate for rapid access and for reduced errors.

A computer subroutine will now be discussed with reference to FIG. 6A to illustrate how computer 112R (FIG. 6A) may be programmed to control single block memory accesses. Computer 112R enters subroutine 601 through operation 630 and exits subroutine 601 through operation 641 with well-known subroutine operations. For example, ENTER operation 630 may include a calling sequence such as saving the return address to the main program and EXIT operation 641 may include fetching the stored return address and transferring back to the main program location defined with the return address, as is well known in the computer programming art.

After entering subroutine 601 through operation 630, the program initializes subroutine 601 such as by loading parameters or constants into various registers and memory locations. For example, a memory address index word $N_k$ may be loaded into the N-scratchpad register and the base address location $L_k$ may be loaded into the L-scratchpad register such as shown in program operation 631 and a time delay parameter $T_k$ may be loaded into the T-scratchpad register such as shown in program operation 636; wherein these scratchpad register designations are provided for convenience and may be assigned to any scratchpad registers or other storage locations in the computer.

The program can fetch the appropriate address of the analog ROM word such as with a table-lookup type operation with operation 632 and can output the table-lookup address word to Z-register 624 (FIG. 6A) with operation 633. The address word can be fetched from the memory location defined by the sum of the base address (stored in the L-scratchpad register) and the index address (stored in the N-scratchpad register) with operation 632, where the fetched word can be loaded into the A-register with an indexed memory access instruction. The fetched word stored in the A-register can be output to Z-register 624 as the $A_OQ$ signal 342R (FIG. 6A) with operation 633 (FIG. 6B). Alternately, the analog ROM address can be defined by the N-parameter or can be defined by the indexed base address parameter, (L+N); wherein this direct ROM address can be output to Z-register 624 thereby eliminating the need for table-lookup fetch operation 632.

After outputting the analog ROM address word with operation 633, the program tests discrete input DI-11 with operation 634 to determine if the analog ROM signal has been accessed and, if so, the program resets DI-11 latch 615 with discrete output signal DO-11 with program operation 635. Testing of discrete input signal DI-11 can be accomplished with a skip-on-discrete instruction, which will cause the program to continue to loop back along the RESET path around test 634 when discrete input latch 615 is reset and to branch to the next program operation along the SET path when discrete input latch 615 is set. For example, if latch 615 is reset, the skip-on-discrete instruction can disable the skip operation and can cause the program to execute the next instruction which may be a transfer instruction transferring back to the skip-on-discrete instruction. When discrete latch 615 is set, the skip-on-discrete instruction can cause the program to skip over the transfer instruction that provides the looping back around operation 634 and can resume sequential program operations along the SET path from operation 634. The program can then execute a discrete output 11 instruction 635 generating the DO-11 signal to reset latch 615.

A programmable time delay may be implemented with operations 636–638. The program loads a time delay parameter $T_k$ into the T-scratchpad register with operation 636. The T-parameter is successively decremented with operation 737 to provide a time delay and is tested with operation 638 to detect when the time delay has expired. Operations 637 and 638 can be implemented with a decrement-and-transfer-on-non-negative instruction, where the $T_k$ parameter in the T-register can be decremented and the program operation can be transferred until the T-parameter is decremented to a negative number. The conditional transfer on the T-parameter being non-negative is shown by the looping back from test operation 638 to the decrement operation 637 along the positive path. When the T-parameter has been decremented to a negative number, the conditional transfer is disabled and the program operations continue in sequence to operations 639 and 640.

Program operations 639 and 640 control looping within the subroutine for accessing a block of analog ROM parameters in sequence. Decrement operation 639 and test operation 640 can be implemented as discussed for program operations 637 and 638 using a decrement-and-transfer-on-non-negative instruction. As long as the N-parameter is non-negative, program operations will branch back from test operation 640 along the positive path to operation 632. A new address parameter is output for each iteration or looping back from operation 640 until the N-parameter is decremented to a negative number, as indicative of completion of accessing of the block of sequential signals from the analog ROM. When the N-parameter is decremented to a negative number, operation branches along the negative path from test operation 640 to exit the subroutine through operation 641.

A multiple-block access arrangement will now be discussed with reference to FIG. 6C in the form of accessing a sequence of analog signals from an analog ROM having a controlled rate and a controlled amplitude. This preferred embodiment is intended to exemplify the more general features of the invention including accessing of digital signals or other signals, processing of signals that are not necessarily stored signals, and different applications thereof. Although this inventive feature will be discussed in the context of a particular embodiment, it is intended that this embodiment be exemplary of a broad range of other embodiments and uses thereof.

In an illustrative embodiment, computer 112R generates an output timing control parameter to $C_f$-register 324R for controlling rate multiplier 651. Rate multiplier 651 generates a programmable clock signal 177 in response to programmable rate signal 310R such as for controlling CCD control logic 175 and word counter 316 to operate at different memory access rates. The arrangement of computer 112R and $C_f$-register 324R communicating with OW clock signal 340R, data signal $A_OQ$ 342R, and feedback signal 300R are similar to the operation discussed with reference to corresponding elements in FIG. 3 U.S. Pat. No. 4,016,540 and are similar to the computer communication arrangement discussed with reference to FIG. 6A herein. $C_f$-register 324R stores a rate-related parameter which is used to control rate multiplier 651 with signals 310R. Rate multiplier 651 may be a SN74167 rate multiplier that generates an output pulse rate Z that is proportional to the input clock pulse rate and also proportional to the programmed word 310R. Rate multiplier 651 is disclosed in detail in the TI TTL Data Book at pages 347-350; discussing operation, interconnections, expandability, etc.

Computer 112R loads a programmable rate parameter into $C_f$ register 324R for controlling rate multiplier 651 with signals 310R. Master clock MCK 650 has a rate that is divided down to provide the programmable rate of output clock signal CK 177 under control of program word 310R. Controllable rate clock 177 may be used to clock the appropriate circuitry such as CCD control logic 175 and word counter 316 to control access rate of the analog ROM.

Similar to the computer arrangement for the controlling clock rate, a computer controlled arrangement for controlling amplitude 192A can be implemented in combination with or in place of the programmable clock rate arrangement. For example, output circuit 192 (FIGS. 1 and 6A) can include sample-and-hold 652 and multiplying digital-to-analog converter 654 for generating analog output signal 189B in response to analog input signal 180. Sample-and-hold 652 can perform the function discussed for a sample-and-hold with reference to FIG. 6A above. DAC 654 can perform the function of controlling amplitude of signal 189B in response to programmable word 310R from $C_f$ register 324R. Multiplying DAC 654 provides output signal 189B having an analog amplitude that is proportional to both the amplitude of analog input signal 653 and the magnitude of the digital parameter 310R from register 324R. DAC 654 may be used to process signal 653 from sample-and-hold 652 as shown in FIG. 6C or alternately DAC 654 may be located before sample-and-hold 652, where DAC 654 may then process input signal 180 prior to processed with sample-and-hold 652.

The arrangement shown in FIG. 6C may provide access rate control, or amplitude control, or both access rate and amplitude control. Providing of either access rate or amplitude control independently can be implemented with $C_f$-register 324R exciting either rate multiplier 651 or DAC 654 as discussed above. When providing the combination capability, the same $C_f$-register 324R can be used to excite rate multiplier 651 and DAC 654 having rate control and amplitude control words packed together in $C_f$-register 324R or can be implemented with separate registers on separate computer output channels such as by using $C_f$-register 324R (FIG. 6C) for controlling rate multiplier 651 and by using Z-register 624 (FIG. 6A) for controlling DAC 654. Generating and outputting of packed words on the same output channel or separate words on different channels are well known in the art and are disclosed in the referenced patent applications.

For convenience of discussion, access rate control is discussed using a rate multiplier and amplitude control is discussed using a multiplying DAC. Other arrangements are known in the art. For example, rate multiplier 651 can be replaced with various rate controlling devices such as voltage controlled oscillators and multiplying DAC 654 can be replaced with various known amplitude control devices, where interfacing to these alternate devices will become obvious from the teachings herein.

The arrangement discussed with reference to FIG. 6C for multiple-block accessing, rate control, and amplitude control can also be used to provide other controllable capabilities. For example, word counter 316 can be preloaded with an initial word from computer 112R (FIG. 6A) defining the start address of the block to be accessed. Further, an auxiliary register (not shown) similar to Z-register 624 (FIG. 6A) can be preloaded with a block length parameter for defining the accessed number of samples in the block. For example, this preloaded register can be implemented in the form of a preloadable down-counter such as an SN74192 preloadable down-counter, wherein the down-counter can be indicative of the last word in the block to be accessed. This last word indication can be used to discontinue memory accesses for the selected block and to initialize the circuitry for the next block to be accessed. Alternately, interface controllers having first address and last address registers or first address and block length registers for accessing blocks of information from computer peripherals such as a disk memory are well known in the art, wherein these memory block access arrangements can be implemented for the analog ROM of the present invention from the teachings herein. Further, other memory access, control, and utilization arrangements known in the art can be used with the analog ROM of the present invention.

A computer subroutine will now be discussed with reference to FIG. 6D to illustrate how computer 112R (FIGS. 6A and 6C) may be programmed to control multiple-block memory accesses and to provide different control parameters for different blocks. Computer 112R may enter subroutine 602 through operation 660 and may exit subroutine 602 through operation 671 with wellknown subroutine operations. For example, ENTER operation 660 may include a calling sequence such as saving the return address to the main program or to the executive program and EXIT operation 671 may include fetching the stored return address and transferring back to the main program location defined with the return address, as is well known in the computer programming art.

After entering subroutine 602 through operation 660, the program may inizialize the subroutine such as by loading parameters or constants into various registers and memory locations. For example, a memory address index word $P_K$ may be loaded into the P-scratchpad register and the base address location $B_K$ may be loaded into the B-scratchpad register such as shown in program operation 661, and a time delay parameter $D_K$ may be loaded into the D-scratchpad register such as shown in program operation 666; wherein these scratchpad register designations are provided for convenience and may be assigned to any scratchpad registers or other storage locations in the computer.

The program may fetch the appropriate parameter for output control such as with a table-lookup type operation with operation 662 and may output the table-lookup parameter to the $C_I$-register (FIG. 6C) with operation 663. The address word may be fetched from the memory location defined by the sum of the base address (stored in the B-register) and the index address (stored in the P-register) with operation 662, where the fetched word may be loaded into the A-register with an indexed memory access instruction. The fetched word stored in the A-register can be output to the $C_I$-register as the $A_OQ$ signal 342R (FIG. 6C) with operation 663 (FIG. 6D).

After outputting the control parameter with operation 663, the program transfers to subroutine 601 to output a block of memory signals; as discussed relative to FIG. 6B. Therefore, the control parameter in the $C_I$-register (FIG. 6C) is applied to each block of signals output from the analog ROM. Alternately, the control parameter may be changed for each output signal in the block of signals or may be implemented in other forms which will now become obvious from the teachings herein.

After execution of subroutine 601, the program returns to perform time delay operations 666–668 using the return address discussed for EXIT operation 641 in subroutine 601 (FIG. 6B).

A programmable time delay may be implemented with operations 666–668. The program loads a time delay parameter $D_K$ into the D-scratchpad register with operation 666. The D-parameter is successively decremented with operation 667 to provide a time delay and is tested with operation 668 to detect when the time delay has expired. Operations 667 and 668 may be implemented with a decrement-and-transfer-on-non-negative instruction, where the $D_K$ parameter in the D-register can be decremented and the program operation can be transferred until the D-parameter is decremented to a negative number. The conditional transfer on the D-parameter being non-negative is shown by the looping back from test operation 668 to the decrement operation 667 along the positive path. When the D-parameter has been decremented to a negative number, the conditional transfer is disabled and the program operations continue in sequence to operations 669 and 670.

Program operations 669 and 670 control looping within the subroutine for accessing a plurality of blocks of analog ROM parameters in sequence; wherein a different block control parameter may be provided for each block. Decrement operation 669 and test operation 670 can be implemented as discussed for program operations 667 and 668 using a decrement-and-transfer-on-non-negative instruction. As long as the P-parameter is non-negative, program operations will branch back from test operation 670 along the positive path to operation 662. A new control parameter is output for each iteration or looping back from operation 670 until the P-parameter is decremented to a negative number, as indicative of completion of accessing of the plurality of sequential signals from the analog ROM. When the P-parameter is decremented to a negative number, operation branches along the negative path from test operation 670 to exit the subroutine through operation 671.

The program operation discussed with reference to FIGS. 6B and 6D have been disclosed in a form that illustrates applicable programming methods, although many other implementations can be provided by those skilled in the art from the teachings herein. Further, various operations discussed may be redundant, unnecessary, and/or simplified for purposes of illustration. For example, time delay operations implemented with operations 636–638 (FIG. 6B) and operations 666–668 (FIG. 6D) may not be necessary or may not be desirable, particularly in view of the discrete signal handshaking operations with operations 634 and 635 (FIG. 6B) and implemented with latch 615 (FIG. 6A); but these time delay operations are disclosed to illustrate various alternate methods that may be used to interface computer 112R with the analog ROM of the present invention.

The arrangement discussed with reference to FIG. 6 may be a sequential accessing arrangement, a random accessing arrangement, or other such arrangement. Relative to a random accessing arrangement, computer 112R outputs any randomly defined address into Z-register 624 for random access of the analog ROM. Alternately, computer 112R may output a sequence of adjacent addresses to Z-register 624 such as by incrementing or decrementing the address parameter with well-known computer programming operations. Yet further, Z-register 624 may be implemented as a counter arrangement which may be initially loaded from computer 112R for a start address and may be incremented or decremented such as under control of signal DI-11, or signal 224B, or signal 225B, or signal 225, or other signals such as signals indicative of accessing of the previously selected stored analog ROM signal.

Because of the capability to sequentially access or randomly access audionic signal samples from the analog ROM as discussed above and because of the capability to manipulate analog signals such as by adding and subtracting analog signals, the arrangements discussed in U.S. Pat. No. 4,016,540 such as with reference to FIGS. 4–6 therein may be implemented with the analog ROM of the present invention. Such arrangements include superposition, iterative processing, subroutining, and other such methods. Further, the other means, methods, applications, etc set forth in said U.S. Pat. No. 4,016,540 may also be used in combination with the various inventive features of the present invention.

The system of the present invention has advantages in the area of signal generation and function generation, particularly for analog signals and analog functions. For example, a sequence of stored analog signals can be output as signal 189 with the arrangement discussed with reference to FIG. 6A, wherein this sequence of signals can be used to synthesize analog functions. In one embodiment, the sequence of signals 189 can synthesize a sound or speech function. In another embodiment, the sequence of signals 189 may synthesize various mathematical functions; exponential functions such as power and root functions; and other functions. In yet another embodiment, signal 189 may be used to generate arbitrary functions such as empirically derived functions that may not be analytically definable. In still another embodiment, signals can be provided to an analog or a hybrid signal processing circuit for processing signals 189 as either analog or digital signals in an analog or hybrid signal processor or data processor arrangement.

In a yet further embodiment, output circuit 192 can include an A/D converter such as the converter discussed with reference to FIG. 3 in U.S. Pat. No. 4,016,540 or various known converters for generating digital output signals as signals 189 in response to analog output signals 180. Digital signals from the A/D converter can be used to load a digital memory such as a digital integrated circuit RAM or shift register, a bubble memory, a core memory, a rotating memory, a digital CCD memory, or other known memories. Loading of a digital memory can be performed under control of a computer such as computer 112R, or can be provided under direct memory access (DMA) control as is well known in the art, or can be loaded in other known forms. In this embodiment, the analog ROM can be used as an off-line memory for generating off-line digital signals 189 to be loaded into an on-line digital memory such as a computer main memory in a manner well known in the art for conventional off-line memories such as magnetic disk, drum, and tape memories. This arrangement may be characterized as a hybrid ROM and may be utilized in a manner discussed with reference to FIG. 9 for the hybrid CCD memory arrangement having an analog memory with a digital output arrangement.

The arrangement described with reference to FIG. 6 may be used for multitudes of different applications. Some of these applications will be briefly described hereinafter to exemplify the wide range of applications.

An audionic arrangement such as discussed in U.S. Pat. No. 4,016,540 can be implemented with the system of the present invention. Memory arrangement 600 (FIG. 6A) corresponds to system 110 (FIG. 1A of U.S. Pat. No. 4,016,540). For example, the analog ROM arrangement of FIG. 6A generally corresponds to part of main memory 130 or to auxiliary memory 152 of said FIG. 1A as an audionic memory that is under computer control except that the analog output signals need not be processed with converter 102 and need not be output directly from the computer but can be output from the off-line analog ROM under computer control as discussed with reference to FIG. 6 herein and/or under control of non-computerized circuitry. In such an arrangement, a block of analog samples accessed from the analog ROM can pertain to a desired sound, word, or phrase. The block of analog samples can be used to drive a speaker such as speaker 104R (FIG. 6A) to produce the desired sound. A sequence of blocks can be accessed for providing a sequence of sounds such as for synthesizing a more complex sound, a word, a phrase, or a message, etc. An arrangement for generating a more complex sound from a plurality of blocks of simpler sounds is discussed with reference to FIG. 6D herein. In one audionic embodiment, the system may be a voice response system for building up speech messages. In this speech message embodiment, each block of analog signal samples pertains to a different word for building up a multi-word speech message. In another embodiment, a whistling toy may be provided wherein each note of a tune is synthesized by accessing a block of analog samples implemented as discussed with reference to FIGS. 6A and 6B and wherein the multi-note tune may be synthesized by accessing a sequence of tone blocks as discussed with reference to FIGS. 6C and 6D.

A signal generator arrangement may be implemented with the system of the present invention. For example, analog signals such as sinewave signals, cosinewave signals, and other trigonometric signals; squarewave and pulse type signals; triangular and sawtooth type signals, arbitrary signals that may not be analytically definable; and other signals may be generated with this signal generator arrangement. Generation of a particular type of signal can be provided by selecting the block of samples for that particular type of signal such as discussed with reference to FIGS. 6A and 6B and outputting the block of analog signal samples such as signal 189 from sample-and-hold 192. The block of analog samples may pertain to time-related samples of the particular waveform represented by the selected block. Related signals such as sinewave and cosinewave signals can be synthesized with the same block of samples, wherein the starting address of the block may be different for different but related signals. For example, the sinewave can start at the zero amplitude signal sample and the cosinewave can start at the peak amplitude signal sample, consistent with the 90-degree phase relationship therebetween.

A test system can be implemented with the system of the present invention. For example, analog circuits can be tested by generating a waveform or a plurality of waveforms to excite circuits under test using the waveform generating embodiment discussed above.

A servo system can be implemented with the system of the present invention. Servo systems are implemented with signal generators for supplying sinewaves, squarewaves, and other waveforms such as discussed in referenced applications Ser. No. 134,958 and Ser. No. 135,040 and as is known in the art. The analog signal generator discussed above can be used for generating these servo waveforms.

A display arrangement can be implemented with the system of the present invention. In a display embodiment, accessing of a block of samples or a plurality of blocks of samples can provide display functions such as character generation and symbol generation.

A pattern recognition system can be implemented with the system of the present invention. For example, a block of samples are accessed from the analog ROM for comparison with an input signal to establish correlation therebetween. Comparison between analog samples and digital samples is provided with a hybrid multiplier such as a multiplying DAC or with a hybrid summer such as including a DAC and an analog summer. Comparing of two analog signals samples can be implemented with analog multipliers which are well known in the art or with analog summers such as differential amplifiers.

A sample filter arrangement can be implemented with the system of the present invention. For example, reference samples can be accessed from the analog ROM of the present invention for processing with input signal samples. In one embodiment, a Fourier transform processor can be implemented with sum-of-the-products operations, where digital input samples are multiplied by analog ROM samples (representing Fourier transform trigonometric functions) using a multiplying DAC for generating an analog product signal which is then summed with other analog signals to provide a sum-of-the-products operation.

A multiple ROM arrangement can be implemented with the system of the present invention. For example, a plurality of analog ROM devices can be simultaneously accessed, wherein the outputs of a plurality of analog ROMs can be processed together. For example, an output sample from a first analog ROM can be processed with an output sample from a second analog ROM such as with a differential amplifier for addition or subtraction to generate a combination output signal in response to the plurality of input signals from a plurality of analog ROMs. Similarly, analog signals stored in an analog alterable CCD memory or digital signals stored in a digital memory can be processed with analog signals stored in an analog ROM. For example, analog samples of an input signal can be stored in an analog memory and can be processed in response to analog samples from an analog ROM for providing correlation therebetween, wherein the analog ROM information can be the reference information for the correlation operation. Therefore, it is herein intended that the memory arrangements set forth in the instant application and in the copending related applications, and the memory arrangements known in the prior art be usable in combinations therebetween to provide further advantages.

Although the memory access arrangement of the present invention has been described in a computer controlled embodiment, many other arrangements can be used for implementing the memory access arrangements of the present invention. For example, computer 112R (FIGS. 6A and 6C) can be replaced with hardwired logic, wherein hardwired logic can be used to implement the flow diagrams shown in FIGS. 6B and 6D by one skilled in the art.

Accessing of the CCD analog ROM has been discussed with reference to a computer 112R (FIG. 6A) in a preferred embodiment. In an alternate embodiment, the analog ROM can be accessed with a simple arrangement such as hardwired limited access arrangement. One hardwired arrangement will now be discussed with reference to a talking doll embodiment.

Figure 8:
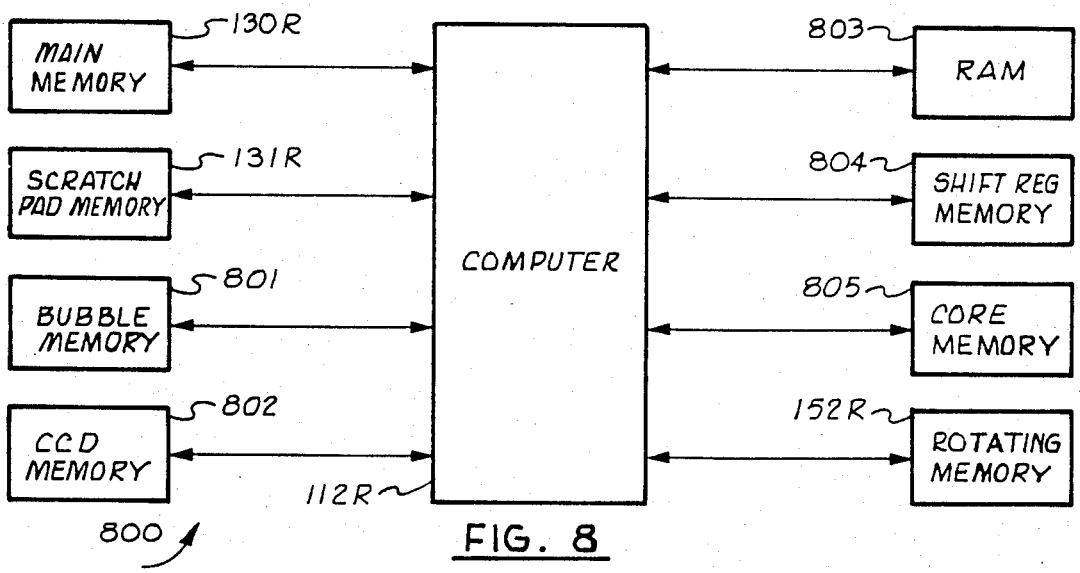
FIG. 8 comprises a block diagram of a system having a plurality of memory devices.

A talking doll embodiment has been discussed at pages 71 et seq with reference to FIG. 8 of related application Ser. No. 849,812 filed on Nov. 9, 1977; being a batch-fabricated arrangement having switches 815, transducer 817, and electronic circuits 812, 813, and 814. In this embodiment, the talking doll may have a limited number of switches such as four switches or eight switches, wherein each switch is related to a different sound, word, phrase, or other audionic message. Depressing one of a plurality of switches results in generation of a related one of a plurality of sound messages.

In an alternate hardwired switch embodiment, switch signals may be encoded and used to load an address register such as register 624 (FIG. 6A herein), wherein the switches and encoder can be used in place of computer 112R for loading register 624 to access a block of sound samples from the analog ROM. One embodiment of encoded switch signals loading a register is shown in referenced application Ser. No. 101,881 and in referenced U.S. Pat. No. 4,038,640. In said patent, switches 34 (FIG. 1 therein) generate signals to encoder (FIGS. 1 and 3 therein) for encoding into digital codes (FIGS. 1 and 3 and Table IV at column 8 lines 40-65 therein) and loading into register 20 under control of the ENABLE switch detection signal from delayed one shot 62 (FIG. 3 therein). Register 20 (FIGS. 1 and 3 therein) may be used in place of address register 624 (FIG. 6A herein) to access a block of signals related to the selected switch from the analog ROM. Such an arrangement can be implemented with the system of FIG. 6A herein. Depression of one of a plurality of switches can be used to select one of a plurality of blocks of audionic information for generating a sound message in response thereto.

In view of the above, a non-computerized audionic arrangement can be implemented such as being directly responsive to manually accuated switches for accessing a block of analog signal samples for driving a transducer substantially directly without use of the stored program computer or the D/A converter discussed for a preferred embodiment with reference to FIG. 1 of U.S. Pat. No. 4,060,848.

Sampled Filter Arrangement

A sampled filter arrangement 700 having important advantages over prior art filters will now be discussed with reference to FIG. 7. Arrangement 700 incorporates many inventive features including a sample-on-the-fly arrangement, an improved memory arrangement, a hybrid arrangement, and other inventive features. For convenience of discussion, the sampled filter arrangement of the present invention will be discussed in the embodiment of a discrete Fourier transform (DFT) arrangement, which is intended to exemplify more general filter methods including other Fourier transforms, correlators, convolvers, compositors, FIR filters, and other filter arrangements.

The DFT arrangement of the present invention will now be discussed with reference to FIGS. 7A-7D to illustrate the processing method. Elements $t_0-t_3$ represent time domain samples; where the first sample is $t_0$, the second sample is $t_1$, the third sample is $t_2$, and the fourth sample is $t_3$. These samples may be analog samples, digital samples, single-bit samples, or other samples. The time domain samples are mapped into frequency domain samples through appropriate constants such as by multiplying the input sample by the appropriate constant and summing the product thereof into the appropriate output sample storage location. Output samples are designated as the $f_0-f_3$ samples wherein the $f_0$ sample is the lowest frequency sample, the $f_3$ sample is the highest frequency sample, and the $f_1$ and $f_2$ samples are intermediate frequency related samples of ascending frequency significance.

For simplicity of discussion, time domain samples $t_0-t_3$ are assumed to be equally spaced in time and frequency domain samples $f_0-f_3$ are assumed to be equally based in frequency; but such equal time spacing and equal frequency spacing is not necessary for implementation of the system of the present invention. Further, for simplicity of discussion the number of time domain samples $t_0-t_3$ is shown equal to the number of frequency domain samples of $f_0-f_3$; although there may be fewer time domain samples than frequency domain samples or there may be fewer frequency domain samples than time domain samples. Therefore, for the general method, any number of time domain samples having any desired time spacing therebetween may be mapped into any number of frequency samples having any frequency spacing therebetween.

The mapping of any time sample $t_n$ into any frequency sample $f_n$ can be performed in the following manner. The time sample $t_n$ is multiplied by an appropriate constant and added into the related frequency sample or frequency bin. The constant is a function of the time relationship of the time domain sample $t_n$ and the frequency relationship of the frequency domain sample $f_n$. For example, the constants may be a pair of trigonometric constants, being the sine and cosine functions of the argument wt; where $w=2\pi f$ and wherein the f and t values of this argument are derived from the time-related source and frequency-related destination of the particular operation. Alternately, other constant terms may be used.

Figure 7A:
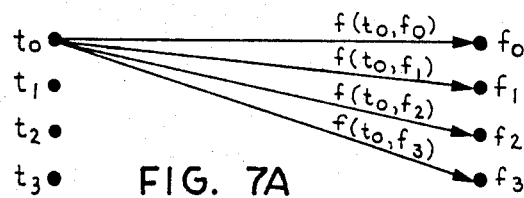
FIGS. 7A–7F illustrates a sampled filter arrangement in accordance with the system of the present invention wherein FIGS. 7A–7D set forth signal flow diagrams for a filter implementation, FIG. 7E sets forth a filter system block diagram, and FIG. 7F sets forth a hybrid filter arrangement in accordance with the block diagram of FIG. 7E.
Figure 7B:
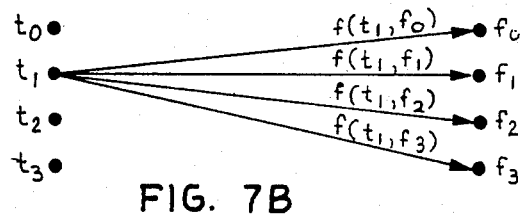
Figure 7C:
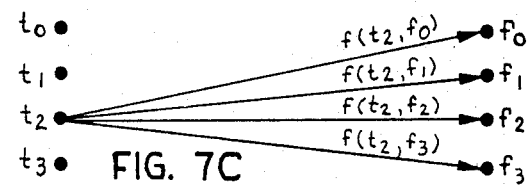
Figure 7D:
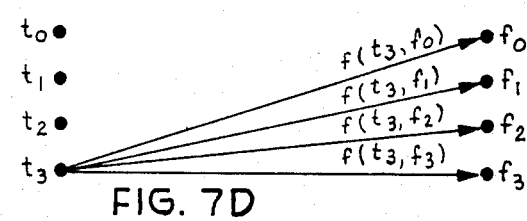

An example of operation will now be provided relative to FIGS. 7A-7D. As shown in FIG. 7A, the first time domain sample $t_0$ is mapped into each of a plurality of frequency domain samples $f_n$ by multiplying the $t_0$ sample by the appropriate constant (which is a function of the $t_0$ time source and the related $f_n$ frequency destination) and then summing that product into the appropriate frequency sample $f_n$. As shown in FIG. 7B, the second time domain sample $t_1$ is mapped into each of a plurality of frequency domain samples $f_n$ by multiplying the $t_1$ sample by the appropriate constant and then summing that product into the appropriate frequency sample $f_n$. Similarly and as shown in FIGS. 7C and 7D, the third and fourth time domain samples $t_2$ and $t_3$ are mapped into each of a plurality of frequency domain samples $f_n$ by multiplying the t sample by the appropriate constant and then summing that product into the appropriate frequency sample $f_n$. Therefore, for each of four time domain samples $t_0$-$t_3$ updating each of four frequency domain samples $f_0$-$f_3$ (FIGS. 7A-7D), each frequency domain sample $f_0$-$f_3$ will be updated four times, once for each input sample $t_0$-$t_3$. Alternately, input sampling can continue past the $t_3$ sample for subsequent updating of each of the four frequency domain samples $f_0$-$f_3$ or conversely a limited number of time domain samples such as four time domain samples $t_0$-$t_3$ can each be used to update a large number of frequency domain samples such as 64 frequency domain samples.

For simplicity of discussion, a single time domain sample is shown updating a single frequency domain sample (FIGS. 7A-7D). As is well known in the DFT art, updating of samples is typically performed using a complex (real and imaginary) number representation characterized by in-phase and out-of-phase updates, or sine and cosine updates, etc. In one embodiment, two time domain samples may be provided for each time domain sample period $t_0$-$t_3$ and each of the pair of time domain samples can be multiplied by the appropriate constant to update the corresponding one of a pair of complex frequency domain samples. Therefore for example, the $t_0$ time domain sample (FIGS. 7A-7D) may represent a pair of complex time domain samples, the $f_0$ frequency domain sample (FIGS. 7A-7D) may represent a pair of complex frequency domain samples, and the constant being a function of $t_0$ and $f_0$ may represent a pair of constants being a sine function and a cosine function of the time and frequency related argument. Alternately, the time samples $t_0$-$t_3$ may be single (not complex) samples, wherein each time sample t may be multiplied by a complex pair of constants to generate a complex pair of frequency-related updates for updating a complex pair of frequency domain samples f for each frequency. As another alternative, a complex pair of time domain samples may be generated by using a pair of non-complex time domain samples offset in time such as offset by one-half of the sampling period. Many other methods for satisfying the complex number require-ments of a DFT will now become obvious from the teachings herein.

For simplicity of discussion, the methods shown in FIGS. 7A-7D use only four time domain samples t and four frequency domain samples f. In an actual implementation, such sets of four may be quadrature signals having zero and unity trigonometric functions and therefore represente an extremely simple configuration. It is herein intended that these groupings of four be exemplary of larger groupings that represent more practical implementations of a DFT.

The transform on-the-fly method of the present invention will now be discussed. When the $t_0$ sample is received (FIG. 7A), it is multiplied by the four constants that are functions of the $t_0$ time sample and of frequency and used to update each of the four frequency samples. When the $t_1$ sample is received (FIG. 7B), it is multiplied by the four constants that are functions of the $t_1$ time sample and of frequency and used to update each of the four frequency samples. When the $t_2$ sample is received (FIG. 7C), it is multiplied by the four constants that are functions of the $t_2$ time sample and of frequency and used to update each of the four frequency samples. When the $t_3$ sample is received (FIG. 3D), it is multiplied by the four constants that are functions of the $t_3$ time sample and of frequency and used to update each of the four frequency samples. Therefore, it can be seen that each time domain sample is fully processed and fully updates the frequency samples to implement the process-on-the-fly arrangement of the present invention.

A process-on-the-fly implementation has been discussed for a correlator processor in application Ser. No. 550,231; which arrangement is equally applicable to a DFT processor or other filter arrangement to provide other arrangements such as a DFT.

A general implementation of a filter exemplified by a DFT will be discussed with reference to FIG. 7E and a specific hybrid embodiment will be discussed with reference to FIG. 7F hereinafter. The sampled filter arrangement may be implemented in analog, digital, or hybrid signal processing form. Preferred embodiments of all three forms will be discussed hereinafter to exemplify the more generally applicable features of the present invention.

Many filtering and processing arrangements can be characterized as the sum-of-the-product arrangements, wherein an input sample 712 may be multiplied by a reference sample 713 using a multiplier 714 and summed with a summer 717, with the output sample stored in output memory 718. For example, a sequence of reference samples 713 can be provided by memory 710 to be processed with a sequence of input samples 712 such as from input memory 711 to be multiplied with multiplier 714 and summed with summer 717. Each input sample 712 can processed with a corresponding reference sample 713 such as disclosed in application Ser. No. 550,231 with reference to FIG. 6D therein.

Arrangement 700 is shown in block diagram form, wherein the elements and methods used therefor have been disclosed in detail in the instant application and in related applications. For example, reference memory 710 may be the analog ROM as discussed with reference to FIGS. 1-3 of the instant application or may be a digital ROM as discussed with reference to application Ser. No. 550,231 such as ROM 625 at FIG. 6D therein. Further, multiplier 714 may be an analog multiplier as is well known in the art, a hybrid multiplier such as a multiplying DAC, or a digital multiplier such as a single-bit multiplier or a whole-number multiplier as discussed in application Ser. No. 550,231 and as discussed herein. Further, summer 717 may be an analog summer or a digital summer and output memory 718 may be an analog memory or a digital memory as discussed herein and as further discussed in application Ser. No. 550,231.

Further control arrangements, addressing methods, and other concepts for sample filters are set forth in detail in application Ser. No. 550,231 and various addressing and control arrangements are set forth in the instant application, wherein the methods set forth in application Ser. No. 550,231 may be implemented in the structural form set forth herein from the teachings herein. For example, a start address for accessing an ROM may be derived as set forth in application Ser. No. 550,231 and may be preloaded into word counter 316 (FIG. 6A herein) to provide accessing the analog ROM of the present invention in accordance with the addressing method of application Ser. No. 550,231. Other adaptations of the system of the present invention and the methods and arrangements set forth in application Ser. No. 550,231 will now become obvious from the teachings herein.

Arrangement 700 characterizes a general sampled filter arrangement in accordance with the system of the present invention. Reference memory 710 provides constant or reference information 713. Memory 710 may be an analog ROM in accordance with the present invention or a digital ROM in accordance with the arrangement set forth in application Ser. No. 550,231 such as ROM 625 at FIG. 6D therein. Alternately, reference memory 710 may be an RAM, a core memory, or any other memory arrangement. Input memory 711 may be a CCD or other serial memory or other memory arrangement disclosed herein and/or known in the art. Alternately, a process-on-the-fly method in accordance with the disclosure in application Ser. No. 550,231 may be used, wherein input signal 712A may be sampled directly from front-end 709 as signal 712 and processed-on-the-fly without the need for input memory 711.

Figure 7E:
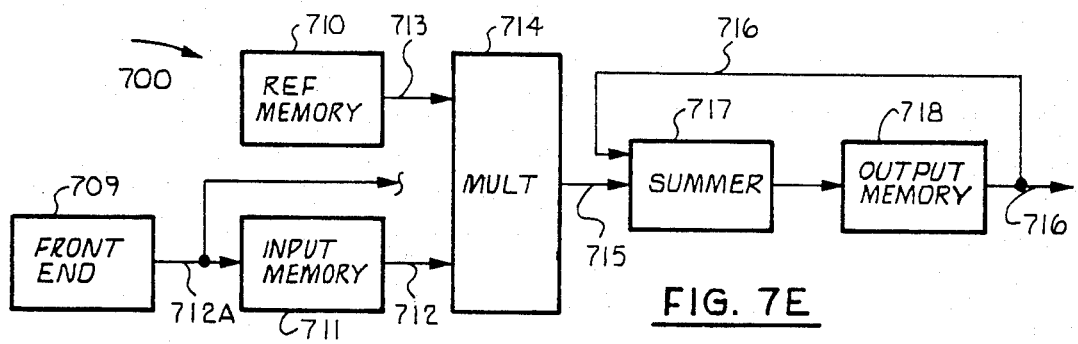
Figure 7F:
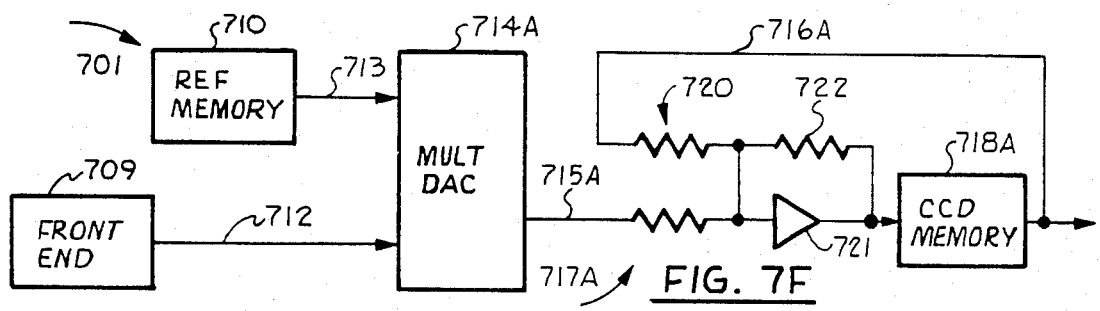

Because of the large number of combinations of analog and digital signal processors that may be implemented with the arrangement of FIG. 7E, the various combinations are summarized in tabular form in the TABLE OF PROCESSING ALTERNATIVES set forth herein. In this table; the elements (710, 711, 714, 717, and 718) are set forth in columns and the embodiments (P0 to P31) are set forth in rows. For each embodiment, the elements in the columns are identified as either an analog element with a "0" symbol or a digital element with a "1" symbol. The table is organized in truth table form as a binary progression to identify all combinations in a convenient manner. For example, the first embodiment is a fully analog embodiment having all "0" elements and the last embodiment is an all-digital embodiment having all "1" elements, wherein all other embodiments may be considered to be hybrid embodiments having combinations of analog and digital ("1" and "0") elements. For convenience of reference, the binary numerical value of the combination of "1" and "0" terms in an embodiment is characterized by the decimal numerical value of the P reference number for that particular embodiment. For example, a "00111" embodiment can be characterized as a 7 based upon the weighted binary numerical value and defined as the P7 embodiment having digital elements 710, 711, and 714 defined with "1" symbols and having analog elements 717 and 718 defined with "0" symbols.

For convenience of discussion and to limit the size of the TABLE OF PROCESSING ALTERNATIVES to a practical level, elements are defined as analog elements or digital elements by the analog or digital nature of the signals output therefrom. For example, reference memory 710 may be the analog ROM of the present invention and may be characterized as an analog element if output signal 713 is in analog signal form. Alternately, if an A/D converter is used in combination with the analog ROM for reference memory 710, signal 713 will be a digital signal and therefor element 710 will be characterized as a digital element.

TABLE OF PROCESSING ALTERNATIVES

| REF NO → | 718 | 717 | 714 | 711 | 710 | EMBODIMENT ↓ |
|---|---|---|---|---|---|---|
| P0  | 0 | 0 | 0 | 0 | 0 | ANALOG |
| P1  | 0 | 0 | 0 | 0 | 1 | HYBRID |
| P2  | 0 | 0 | 0 | 1 | 0 | HYBRID |
| P3  | 0 | 0 | 0 | 1 | 1 | HYBRID |
| P4  | 0 | 0 | 1 | 0 | 0 | HYBRID |
| P5  | 0 | 0 | 1 | 0 | 1 | HYBRID |
| P6  | 0 | 0 | 1 | 1 | 0 | HYBRID |
| P7  | 0 | 0 | 1 | 1 | 1 | HYBRID |
| P8  | 0 | 1 | 0 | 0 | 0 | HYBRID |
| P9  | 0 | 1 | 0 | 0 | 1 | HYBRID |
| P10 | 0 | 1 | 0 | 1 | 0 | HYBRID |
| P11 | 0 | 1 | 0 | 1 | 1 | HYBRID |
| P12 | 0 | 1 | 1 | 0 | 0 | HYBRID |
| P13 | 0 | 1 | 1 | 0 | 1 | HYBRID |
| P14 | 0 | 1 | 1 | 1 | 0 | HYBRID |
| P15 | 0 | 1 | 1 | 1 | 1 | HYBRID |
| P16 | 1 | 0 | 0 | 0 | 0 | HYBRID |
| P17 | 1 | 0 | 0 | 0 | 1 | HYBRID |
| P18 | 1 | 0 | 0 | 1 | 0 | HYBRID |
| P19 | 1 | 0 | 0 | 1 | 1 | HYBRID |
| P20 | 1 | 0 | 1 | 0 | 0 | HYBRID |
| P21 | 1 | 0 | 1 | 0 | 1 | HYBRID |
| P22 | 1 | 0 | 1 | 1 | 0 | HYBRID |
| P23 | 1 | 0 | 1 | 1 | 1 | HYBRID |
| P24 | 1 | 1 | 0 | 0 | 0 | HYBRID |
| P25 | 1 | 1 | 0 | 0 | 1 | HYBRID |
| P26 | 1 | 1 | 0 | 1 | 0 | HYBRID |
| P27 | 1 | 1 | 0 | 1 | 1 | HYBRID |
| P28 | 1 | 1 | 1 | 0 | 0 | HYBRID |
| P29 | 1 | 1 | 1 | 0 | 1 | HYBRID |
| P30 | 1 | 1 | 1 | 1 | 0 | HYBRID |
| P31 | 1 | 1 | 1 | 1 | 1 | DIGITAL |

Further, A/D converters may be used for generating digital output signals in response to analog input signals and D/A converters may be used to generate analog output signals in response to digital input signals to satisfy the conditions of the TABLE OF PROCESSING ALTERNATIVES. For example, relative to the P7 term; signals 712, 713, and 715 from elements 711, 710, and 714 respectively are digital signals while signals output from elements 717 and 718 are analog signals. In order to facilitate this embodiment, it may be necessary to provide a D/A converter to convert digital signal 715 to analog signal form for processing with analog summer 717 and analog output memory 718.

An analog sampled filter embodiment will now be discussed with reference to arrangement 700. Reference memory 710 may be the analog ROM of the present invention for generating analog samples 713 to multiplier 714. Input signal sample 712 may be an analog signal sample such as from an analog input memory 711 which may be a CCD or other analog memory. Alternately analog sample 712 may be sampled with a sample-and-hold circuit or other circuit or may be sampled implicit in multiplier 714; wherein such input signal sampling arrangements are discussed in application Ser. No. 550,231. Multiplier 714 can be any known analog multiplier. Further, multiplier 714 can have sample-and-hold circuits for processing input signals 712 and 713 and/or for processing product signal 715. Product signal 715 can be added to stored signal 716 with summer 717 and stored back into output memory 718 in accordance with the arrangement discussed in application Ser. No. 550,231 such as with reference to FIG. 6D therein. In this analog embodiment, summer 717 can be an analog summer such as a differential amplifier, a resistor summing network, or other known analog summing arrangements. Output memory 718 can be implemented as an analog output memory such as the CCD analog memory of the present invention or other analog memory arrangements.

A digital sampled filter arrangement will now be discussed with reference to arrangement 700. Reference memory 710, input memory 711, and output memory 718 can be any known digital memory devices such as ROM 625 and RAM 614 as discussed in application Ser. No. 550,231 relative to FIG. 6D therein. Input signal 712 and reference signal 713 can be digital signals processed with digital multiplier 714 to generate digital product signal 715 for summing with digital summer 717 and for storing in digital output memory 718. Such a digital arrangement is discussed in application Ser. No. 550,231 such as relative to FIG. 6D therein.

A hybrid sampled filter arrangement will now be discussed with reference to arrangement 700. A hybrid arrangement is herein intended to mean an arrangement combining analog and digital signal processing. Hybrid embodiments may be implemented by various combinations of the analog and digital sampled filter arrangements discussed above.

In one hybrid embodiment discussed with reference to FIG. 7E; reference signal 713 may be an analog signal and input signal 712 may be a digital signal. Reference memory 710 may be the analog ROM of the present invention for generating analog reference signal 713. Input memory 711 may be a digital memory for generating digital input signal 712 or alternately digital signal 712 may be derived directly from an A/D converter in a process-on-the-fly implementation. Multiplier 714 may be a hybrid multiplier such as a multiplying DAC for generating product signal 715 as an analog signal that is related to the product of analog reference signal 713 and digital input signal 712.

In another hybrid embodiment discussed with reference to FIG. 7F; reference signal 713 may be a digital signal and input signal 712 may be an analog signal. Reference memory 710 may be a digital ROM for generating digital reference signal 713 and input signal 712 may be an analog input signal such as received from front-end circuitry 709 such as transducers and signal processors. Multiplier 714A may be a hybrid multiplier such as a multiplying DAC for generating analog product signal 715A in response to the product of digital reference signal 713 and analog reference signal 712. Analog product signal 715A may be summed with output signal 716A with an analog summer such as summer 717A having input summing resistors 720, operational amplifier 721 and feedback resistor 722. The analog sum signal from summer 717A may be stored in output CCD memory 718A for subsequent updating with other product signals and for outputting as signal 716.

In other hybrid embodiments, A/D converters may generate digital signals in response to analog signals and D/A converters may generate analog signals in response to digital signals to provide different combinations of hybrid signal processing.

Many other sampled filter embodiments can be provided from the teachings of the present invention and the teachings of the referenced applications; wherein arrangement 700 is provided merely to exemplify a preferred embodiment of the broadly related teachings of the present invention.

Various types of filters may be implemented with arrangement 700 and with the various alternate embodiments from the teachings herein. For example, arrangement 700 may be used to implement a correlator sampled filter, a Fourier transform filter, a compositor filter, and multitudes of other filters; as will be exemplified with several descriptions of preferred embodiments hereinafter.

A sample on-the-fly filter implementation will now be discussed for arrangement 700. The on-the-fly filtering method has been described in detail in application Ser. No. 550,231; wherein this on-the-fly method will now be discussed relative to FIG. 7E. Input signal 712 is processed on a sample-to-sample basis, wherein each sample of input signal 712 is used to fully update a plurality of output samples prior to updating output samples with a next input sample. In this arrangement, input memory 711 may be eliminated, wherein input signal 712 may be a real time signal processed without memory buffering. In this arrangement, as each sample of input signal 712 is provided to multiplier 714, a plurality of reference samples 713 are provided to multiplier 714 for that single input sample 712 to update a plurality of output samples in response to the single input sample 712 and a plurality of reference samples 713. In one embodiment, reference memory 710 may be the analog ROM of the present invention that is sequentially accessed for blocks of reference samples and output memory 718 may be the alterable analog memory of the present invention. In this embodiment, a block of reference samples 713 from analog ROM 710 are accessed in synchronization with the accessing of a block of output signal samples 716 from output memory 718 for a particular input sample 712 to update each of the sequence of output samples 716 from output memory 718 in response to the corresponding sample in the block of analog reference samples 713 from reference memory 710. Block accessing of an analog memory has been described herein with reference to FIG. 6 and processing of input samples on-the-fly together with control logic, etc has been described in detail in application Ser. No. 550,231.

A conventional (non-on-the-fly) arrangement will now be discussed for arrangement 700. In a conventional arrangement, input samples are stored in input memory 711 and reference samples are stored in a reference memory 710. A block of input samples 712 are accessed from input memory 711 and a block of corresponding reference samples 713 are accessed from reference memory 710 in synchronization therebetween for providing the proper reference sample as signal 713 when a corresponding input sample is provided as signal 712. Therefore, a sequence of corresponding signal pairs 712 and 713 are provided to multiplier 714 in sequence for generating the product therebetween and for summing the sequence of products with summer 717 for storing of the sum of these products as a single sample in output memory 718. A change in the block of input samples accessed from input memory 711 and/or a change in the block of reference samples stored in reference memory 710 is then made to provide a new combination of signal sample pairs to multiplier 714 to generate the next sample for storage in output memory 718. Accessing of the appropriate blocks of samples from input memory 711 and from reference memory 710 for generating the particular output samples stored in output memory 718 is well known in the art and, for example, is described in the reference by Rabiner and Gold. Selection of the appropriate block in memory may be provided with well-known addressing and selection arrangements and may be provided with the preferred embodiment discussed with reference to FIG. 6 herein such as by preloading a start address into word counter 316 from computer 112R (FIG. 6A).

A correlator sampled filter will now be discussed for arrangement 700. A real-time correlator can be implemented by multiplying an appropriate reference sample 713 stored in memory 710 by appropriate input sample 712 using multiplier 714 and adding together the appropriate product signals 715 to generate output samples stored in output memory 718. Conventional (non-on-the-fly) methods are well known in the art and non-conventional (on-the-fly) methods are discussed in detail in application Ser. No. 550,231 such as with reference to FIG. 6D therein. For a process-on-the-fly embodiment, for each input sample 712; all output samples from memory 718 are accessed with the same start address and in the same sequence and a plurality of reference samples 713 are accessed from memory 710 with a start address that changes as a function of a propogation or shifting method such as by being incremented for each iteration of the processor, as discussed in detail in application Ser. No. 550,231 such as with reference to L-counter 618 and J-counter 617 in FIG. 6D therein. This changing in the accessing start address of reference memory 710 can be implemented with hard-wired counter logic such as discussed with reference to said FIG. 6D in application Ser. No. 550,231. Alternately, the accessing start address can be implemented under stored program processor control such as discussed with reference to FIG. 6 herein by preloading word counter 316 with a start address determined under program control in computer 112R as defined with the flowcharts set forth in FIGS. 5A and 5B in application Ser. No. 550,231. Therefore, the on-the-fly correlator of application Ser. No. 550,231 can be implemented with the analog ROM and/or the control arrangements of the present invention in the embodiment discussed with reference to FIG. 7A herein. Alternately, other correlator arrangements may be implemented with the arrangement shown in FIG. 7A using well-known methods for accessing reference samples 713, input samples 714, and output samples 716.

A Fourier transform processor arrangement will now be discussed for arrangement 700. For simplicity of discussion, a discrete Fourier transform (DFT) implementation will be discussed. A DFT is a well-known method of generating frequency-domain information from time-domain information, wherein each input signal sample is multiplied by a pair of complex (real and imaginary) trigonometric samples and used to update the appropriate complex (real and imaginary) output samples. For an on-the-fly DFT implementation, as each input sample 712 is made available to multiplier 714, a block of reference samples 713 are accessed from reference memory 710 to update a block of output samples 716 accessed from output memory 718. The block of reference samples 713 represent a sequence of complex pairs of trigonometric functions, having progressively increasing phases related to progressively increasing frequencies for a particular time delay, which are used to update output samples having progressively increasing frequencies corresponding to the frequency-related phases of the reference signals providing the updates. This method can be implemented with the correlator control arrangement set forth in application Ser. No. 550,231 with reference to FIG. 6D by storing the appropriate trigonometric constants in ROM 625 and by properly controlling the advancing of J-counter 617 for each input sample processed. In this DFT embodiment, the start address of J-counter 617 will be stepped to a start address related to the next block of reference samples rather than the next reference sample as implemented for the correlator mechanization. For example, the first block of DFT reference samples will correspond to the zero time phase shifts for each of the output frequency parameters, the second block of reference samples will correspond to the first sample time related phase shift for each of the output frequency parameters, etc. One form of this implementation would be to use L-counter 618 to identify the most significant part of the address and to use J-counter 617 for the least significant part of the address, being reset to zero and then incremented through the reference sample addresses of the selected block. In this form, J-counter 617 provides the least significant portion of the address, being the samples within the block, and L-counter 618 provides the most significant portion of the address, being the sample counter or block counter for accessing ROM 625 (application Ser. No. 550,231 at FIG. 6D therein).

A compositor arrangement will now be discussed for arrangement 700. A compositor is conventionally implemented by summing corresponding input samples from a plurality of different signals. In arrangement 700, reference memory 710 and multiplier 714 may not be necessary, wherein input signal 712 may be provided directly to summer 717 as signal 715 for summing with output signal samples 716 and for storage in output memory 718. This arrangement is similar to the compositor arrangement discussed with reference to FIG. 9E herein.

A beamformer arrangement will now be discussed for arrangement 700. In a preferred embodiment, the beamformer is implemented as a single-bit beamformer in conjunction with a Fourier transform processor but the beamformer may also be implemented in other forms such as in whole number form. The beamformer and/or Fourier transform arrangements discussed herein may be implemented for a single beam or for a plurality of beams.

A beamformer can be implemented by summing the appropriate time and space-related samples together for a particular beam angle. Because summation is implicit in a Fourier transform arrangement, beamforming and Fourier transformation (or beamforming and other filter arrangements) can be implemented together for a simplified implementation. Time and spacial domain input samples 712 can be obtained from a front-end transducer array 709, summed together with summer 717 and stored in output memory 718. The proper time and spacial domain samples to be summed together can be defined by well-known beamformer concepts.

If Fourier transformation is also required such as for time domain beamforming and for frequency domain analysis, then each time and spacial domain sample can be multiplied by an appropriate Fourier transform constant with multiplier 714 prior to summing of each update sample with summer 717 and storage of the updated sample in output memory 718. The proper product samples to be generated and summed together are defined by well-known beamformer and Fourier transform concepts.

A two-dimensional Fourier transformation can be implemented such as for frequency domain beamforming and frequency domain analysis in the form of a time domain and then a spacial domain transform. Each time domain and spacial domain sample may be multiplied by a pair of appropriate Fourier transform constants with multiplier 714 or with a pair of multipliers prior to summing of each update sample with summer 717 and storage of the updated sample in output memory 718. The proper product samples to be generated and summed together are defined by well-known beamformer and two-dimensional Fourier transform concepts.

In another embodiment, the analog ROM of the present invention can be used in combination with an analog alterable CCD memory for sampled data filtering such as for correlation, Fourier transformation, etc. For example, the analog ROM can contain reference signal samples or pilot signal samples and the analog alterable CCD memory can contain input signal samples. These reference and input signal samples can be correlated together as disclosed in a preferred embodiment in application Ser. No. 550,231 or as is well known in the art such as for shift register correlation arrangements.

It is herein intended that the single-bit processing arrangements of applications Ser. No. 550,231 and/or Ser. No. 754,660 be usable with the system of the present invention. For example, the single-bit arrangement discussed with reference to FIG. 6D of application Ser. No. 550,231 is intended to be usable with arrangement 700 discussed herein such as for a single-bit Fourier transform processor. Further, the memory arrangements of the present invention can be used for constant register 453 and/or remainder register 451 (FIG. 4D) of application Ser. No. 754,660. For example, the analog CCD ROM of the present invention can be used for said constant register 453 and the analog CCD alterable memory of the present invention can be used for said remainder register 451.

Filtering operations provide an implicit enhancement of signal-to-noise ratio (SNR) and processing gain such as with the summation operation. Therefore, signals can be processed with low resolution, low accuracy, and/or low SNR circuits up to the summation operation; often without significant degradation of the final solution. Therefore, in a preferred embodiment, signals can be processed with relatively low precision, resolution, and/or SNR circuits such as analog, hybrid, low resolution digital, and/or low precision digital circuits before the summation operation and can be processed with relatively high precision, resolution, and/or SNR circuits such as high resolution and precision digital circuits for the summation operation for subsequent processing.

Because analog and/or hybrid signal processing can be lower in cost than digital signal processing and because digital signal processing preserves resolution, precision, and SNR characteristics; therefore analog and/or hybrid circuits can be used for front-end signal processing where resolution, precision, and SNR are less significant and digital circuits can be used for rear-end signal processing where resolution, precision, and SNR are more significant. A preferred embodiment of the present invention is represented by a hybrid embodiment having analog front-end signal processing and digital rear-end signal processing. Such an arrangement is characterized by embodiments P24 and may also be characterized by embodiments P16 to P30 and particularly embodiments P24 to P30 as set forth in the TABLE OF PROCESSING ALTERNATIVES herein. For example, in embodiment P24 reference memory 710 may be the analog CCD ROM of the present invention, input memory 711 may be the analog alterable CCD memory of the present invention or alternately may be eliminated by processing signal 712A from front-end 709 directly with multiplier 714, multiplier 714 may be any well-known analog multiplier, summer 717 may be any digital summer and may include an analog-to-digital converter for converting analog product signal 715 from analog multiplier 714 to a digital signal for summing with digital stored signal 716, and output memory 718 may be a digital output memory such as a digital RAM as discussed in application Ser. No. 550,231 with reference to FIG. 6D therein.

Another feature of the filtering arrangement of the present invention provides for output signal processing after filtering in a form that is inexpensive, efficient, and eliminates many error mechanisms. For simplicity of illustration, this inventive feature will be described in the embodiment of a single bit or incremental signal processing arrangement, but it will now become obvious from the teachings herein that other arrangements may be used.

In prior art systems such as fast Fourier transforms, output information is represented by complex (real and imaginary) information such as sine and cosine functions. Magnitude information is conventionally derived by calculating the square-root-of-the-sum-of-the-squares, or root-sum-of-the-squares (RSS) or vector sum to obtain magnitude information from the two trigonometric (complex) components. For an incremental or single-bit processor, the output quadrature components have been found to be linear components, not trigonometric components; wherein the two output quadrature components of a single-bit output signal can be summed directly as magnitudes and need not be vector summed as quadrature trigonometric components. This capability provides a simple magnitude implementation, reduces or eliminates phase-related errors, and provides other advantages. Simplicity is achieved, wherein the two quadrature components can be directly summed and need not be vectorially summed, thereby providing simpler processing circuitry.

In prior art systems such as Fourier transform type systems, samples are taken over a time aperture or sampling period, transformed to frequency-domain complex (real and imaginary) samples, then added into the proper frequency "bins". Each transformed sample represents magnitude of an inphase or quadrature component of the particular frequency value. The amplitudes of the inphase and quadrature complex samples represent vectorial components and therefore must be added vectorially such as with an RSS calculation to obtain a magnitude parameter. Because different time domain samples are taken at different times, any phase variations in the input samples will cause phase variations in the output complex samples over the time aperture of the samples. Therefore, for a particular output frequency bin, transformed samples having different phases will be added together linearly because of the sum of the products processing; where linear addition of phase varying complex components will introduce errors in prior art vectorially related quadrature signals. There phase-related errors can be reduced or eliminated by various methods in accordance with the present invention. A first method involves providing a vectorial computation on all quadrature components before being summed either together for magnitude information and/or before being summed with transformed components related to another input sample. A second method involves providing linear (not a trigonometric or vector) quadrature signals for direct or linear (not trigonometric or vector) addition for sum of the products and/or for magnitude type summing.

For the first method, when a pair of complex samples are transformed, then an RSS computation is performed thereon before summing with the other transformed samples. For the second method, a single-bit transform computation is provided to generate linearly related single-bit transformed samples that may be added directly without an RSS type computation. These two methods will now be discussed with reference to FIG. 7.

For the first method an RSS (square-root-of-the-sum-of-the-squares) computation will be inserted in each path that maps time samples $t_0$-$t_3$ into transformed samples $f_0$-$f_3$. For example, each of the two components of the $t_0$ complex sample would usually be multiplied by a related complex constant f ($t_0$, $f_0$) and added into the related complex output bins $f_0$. For the instant feature of the present invention, the two complex products would be combined with an RSS computation into a single magnitude product and added to other magnitude products in a single $f_0$ bin (not a pair of complex $f_0$ bins). Alternately, the RSS computation before summation can be replaced with other intermediate computations, where for example a simple sum-of-the-squares computation (without a square root computation) could be used to generate sum-of-the-squares or magnitude-squared outputs instead of RSS outputs. Therefore, because different transformed samples are added together in magnitude form, phase variations between input samples $t_0$-$t_3$ do not degrade precision of the output filtered signals. This feature of the present invention may be characterized as a magnitude-of-the-products calculation before sum-of-the-products calculation, or magnitude-before-summation calculation, or sum-of-the-magnitude calculation, or squaring-before-summing in place of the prior art sum-of-the-products calculation, or magnitude-after-summation calculation, or sum-of-the-complex-product calculation, or summing-before (or without) squaring respectively.

RSS or vector sum computations are well known in the art. An exact solution involves squaring the two components, then adding the squares, then taking the square root of the sum. A simplified approximate solution involves taking the absolute magnitude such as by changing any negative numbers to positive numbers, determining which is the larger of the two numbers, then adding the larger to one-fourth of the smaller of the numbers; wherein the sum thereof represents an approximation of the RSS.

For the second method, a single-bit arrangement is provided, where input samples are single-bit and products are single-bit in accordance with the disclosure herein and in the referenced patent applications. Because single-bit products have a linear relationship and may be summed directly without an RSS computation, the effects of phase variations over the input aperture are inherently improved.

In view of the above an incremental, or single-bit, etc. Fourier transform processor such as an FFT or DFT processor or other filter arrangement can provide significant improvements over conventional whole-number processors. A single-bit processor arrangement will now be discussed with reference to FIG. 7E. Front-end 709 provides an analog time-domain signal 712 to incremental multiplier 714 to be incrementally multiplied with an incremental reference single-bit signal 713 from reference memory 710 using incremental multiplier 714. Incremental input signal 712 may be derived with a comparitor circuit such as a $\mu$A710 comparitor in front-end 709. Reference memory 710 stores the most significant bit or sign bit of the sine and cosine functions. Multiplier 714 can be an exclusive-OR circuit for generating single-bit output signal 715 in response to single-bit input signal 712 and single-bit reference signal 713. Summer 717 adds incremental product 715 such as by incrementing a counter, wherein the number to be conditionally incremented is stored in memory 718 and recirculated to summer 717 to be incremented or to be not incremented in response to product signal 715. This arrangement is similar to the correlator arrangement shown in FIG. 6D of parent application Ser. No. 550,231 wherein reference memory 710, front-end 709, incremental multiplier 714, incremental summer 717, and output memory 718 of FIG. 7E of the instant application may correspond to P-ROM reference memory 625, front-end element 623 and 624, incremental multiplier 616, incremental summer 613, and output memory 614 respectively as shown in FIG. 6D of application Ser. No. 550,231. Implementation of the arrangement shown in FIG. 6D of said application Ser. No. 550,231 in the form of a Fourier transform processor in accordance with the present invention has been discussed above such as by making minor changes to the logic associated with J-counter 617 and L-counter 618 and by entering the proper constants into P-ROM 625.

In one embodiment, the real and imaginary outputs may be preserved separately. In another embodiment, the real and imaginary outputs may be combined to form a vector sum or magnitude frequency related parameter for each output frequency value. In the former arrangement, each one of the two complex quadrature signals for each frequency value can be preserved separately, wherein input signal samples can be incrementally multiplied by incremental reference parameters and used to update the output complex parameters. In a vector magnitude embodiment, both the real incremental product and the imaginary incremental product can be used to update the same output frequency sample as a magnitude output frequency sample, wherein a complex input sample can be incrementally multiplied by each of two referenced samples and the two related incremental products can be added to the same frequency-related output signal sample.

In view of the above, the simple, efficient, low-cost implementation of a Fourier transform magnitude calculation is provided that reduces sensitivity to error mechanisms such as phase variations, phase jitter, noise, and other such effects.

This single-bit output signal processing feature of the present invention may be characterized as linear signal summation in contrast to vector signal summation or quadrature signal summation as implemented in prior art systems. In simple form, if a prior art signal processor were reduced in resolution to provide processing of single-bit signals and if output quadrature signals were added linearly rather than vectorially, then the improvements of the instant feature of the present invention is being practiced. Although this inventive feature represents a significant simplification over prior art signal processors in addition to the reduction in error mechanisms inherent in prior art signal processors, prior art signal processors are still implemented with the more expensive and more error prone arrangements, wherein the simplification provided by this feature of the present invention is certainly not obvious to prior art designers.

Combination Memory Arrangement

In accordance with another feature of the present invention, a combination memory arrangement 800 is provided as illustrated in FIG. 8. Computer 112R or other processor can be used in conjunction with main memory 130R and scratchpad memory 131R as disclosed in U.S. Pat. No. 4,016,540; application Ser. No. 101,881; and applications related thereto. Further, other memory devices can be used in combination such as bubble memory 801, CCD memory 802, random access memory (RAM) 803, shift register memory 804, core memory 805, and rotating memory 152R.

Computer 112R may be similar to the computer arrangement described in the related applications or may be other computer or processor arrangements such as other general purpose computer arrangements, special purpose computer arrangements, data processor arrangements, signal processor arrangements, or other arrangements. Main memory 130R may be an integrated circuit read only memory or a core memory as discussed in the related patent applications or may be any other main memory arrangement. Scratchpad memory 131R may be a shift register scratchpad memory as discussed in said related patent applications, may be integrated circuit RAMs or other types of memories. Main memory 130R and scratchpad memory 131R may be on-line memories as discussed in said related patent applications or may be other memory structures such as off-line memories.

Other memory technologies may be used in combination with the above-described memory technologies and/or with each other in various combinations. Such other memory technologies may be well-known integrated circuit random access memories (RAMs) 803, well-known integrated circuit shift register memories 804, well-known core memories 805, well-known rotating memories 152R such as disk and drum memories; etc. Various combinations of these memories and other memories can be provided in combinations of on-line and/or off-line memories.

Various types of memories can be used to replace conventional off-line rotating memories. For example, bubble memory 801 and CCD memory 802 can be used either in combination therewith or separately to provide rotating memory replacement. Interface controllers can be used for bubble memory 801 and CCD memory 802 similar to interface controllers used for well-known prior art rotating memories.

Bubble memory 801 can be any bubble memory and CCD memory 802 can be any CCD memory such as those manufactured by Texas Instruments Inc. Bubble memory 801 and/or CCD memory 802 can be used as a shift register memory in an on-line manner such as the shift registers used to implement scratchpad memory 131R discussed in detail in application Ser. No. 101,881. Alternately, bubble memory 801 and CCD memory 802 can be implemented as off-line memories such as rotating memories (disk and drum type memories) as used in prior art systems. For example, such rotating memories generate sequential bit streams of data similar to data provided with shift register memories, wherein a serial bubble memory 801 and/or a serial CCD memory 802 can be used in a manner similar to use of prior art rotating memories.

Bubble memory 801 or CCD memory 802 can be used independently such as for a rotating memory replacement or can be used in combinations. For example, bubble memory 801 can be a non-volatile memory and CCD memory 802 can be a volatile memory. Also bubble memory 801 can be more expensive than CCD 802. Therefore, it may be desirable to use bubble memory 801 in combination with CCD memory 802 to achieve non-volatility as provided with bubble memory 801 and to achieve lower cost as provided with CCD memory 802. In one embodiment, a rotating memory replacement can use bubble memory 801 for certain selected non-volatile higher-cost memory channels and can use CCD memory 802 for volatile lower-cost channels; wherein a bubble memory or CCD memory channel can correspond to a portion of a rotating memory such as a track, a group of tracks, or a portion of a track.

Because rotating memories are conventionally interfaced to processors with interface controllers, the interface controller typically provides accessing, writing, and addressing capabilities. The address structure of bubble memory 801 and CCD memory 802 can be organized consistent with the track structure of rotating memories to permit bubble memory and CCD memory addressing consistent with rotating memory addressing. Certain tracks can be implemented as non-volatile memory tracks using bubble memory 801 and other tracks can be implemented as volatile memory tracks using CCD memory 802. Addressing can be in the form of paging, blocking, or other well-known addressing arrangements to distinguish between the various tracks and thereby distinguishing between the various memory devices.

Addressing a plurality of memory elements with common address structures (or with separate address structures) is well known in the art. For example, many integrated circuit memories such as RAMs have a memory disable line that is controlled by decoding the most significant bits of an address word (or with separate address signals) for selecting one of a plurality of memory circuits which are accessed with the less significant bits of the address word. Further, memory pages or memory blocks can be selected by decoding the most significant bits or an address word (or with separate address signals) to select the page or block; wherein the less significant bits of the address words can be used to select the particular data in the selected memory block. In similar form, a memory addressing arrangement can be implemented from the teachings herein to select different pages or blocks or tracks of memory with a common address word (or with separate address words), wherein different memory technologies and different types of memories can be used to implement different blocks, or pages, or tracks. Therefore, the different memory types discussed herein and/or known in the art can be used in combinations theretogether such as by decoding a common address word (or providing separate memory words) to select the particular memory unit and to select the particular data stored in that selected memory unit. For separate address word arrangements, separate address words can be provided on separate channels such as to address a disk memory on one channel, a magnetic tape memory on another channel, and a core memory on still another channel such as with prior art computer systems.

Charge Couple Device Signal Processor (FIG. 9)

Charged couple devices (CCDs) may be used to provide signal processing in accordance with the present invention. CCDs are well known in the art, being monolithic integrated circuits having charge storage and charge transfer capability. The CCD may have one or more input terminals, one or more output terminals, and a plurality of charge transfer stages to "shift" the charge between stages. Arrangement of input stages, output stages, and transfer circuits are well known in the art. For simplicity of discussion, a CCD will be considered as a circuit having input signal lines, output signal lines, and various shiftable stages coupling input and output lines. The monolithic implementation of such a CCD is well known in the art and therefore will not be discussed herein.

CCD signal processors will be discussed with reference to FIG. 9 hereinafter in the embodiment of an acoustic imaging system. These CCD signal processor arrangements are intended to be generally applicable for many signal processing uses that will become obvious to those skilled in the art from the teachings of the present invention. For example, this CCD signal processor arrangement may be used as a demodulator, multiplexer, or sample-and-hold circuit for use in systems including data acquisition, analog signal processing, computer peripheral, telemetry, and other systems. Further, a hybrid memory embodiment may be used as an off-line computer memory, an on-line computer memory, a disc memory replacement, an analog memory for an analog or hybrid computer, and other arrangements.

A signal processing arrangement in accordance with the present invention may use an analog memory device such as a charge coupled device (CCD) for processing analog signals. Array input signals may be demodulated such as with electronic switches excited in response to a reference generator with the demodulated output signals being processed by a CCD memory. Each of the demodulated input signals may be applied to an input line of a CCD for accumulation of the synchronously switched signals by integrating current in charge storage elements. After sufficient cycles have been demodulated, demodulation control signals may be deactivated and shifting control signals may be initiated to shift the analog signals stored in the CCD to provide a sequence of analog output signals related to a plurality of parallel input signals. If an ensonifying signal is a chirp signal, the reference generator may provide a chirp demodulation signal to synchronously demodulate input chirp signals. The CCD may provide a multi-function capability including filtering of demodulated input signals and converting input signals from a parallel form to a serial form for sequential processing with time-shared chrcuits.

In a beam forming embodiment of the present invention, trace signals from transducers may be applied to a CCD in parallel at a plurality of input taps while the CCD is being clocked to shift the analog signal samples between taps. If the spacing between taps in relation to the clock frequency is controlled to be related to a wavelength characteristic of the signals from the transducer array, then the analog signals applied to each of a plurality of taps in sequence may be enhanced if the input signal period is similar to the inter-tap shifting period and the signals may be degraded if the above periods are not similar. Therefore, the CCD clock control signal and tap spacing may select a particular input spacial frequency period for enhancement, wherein the input spacial frequency period may be related to a direction of incident illumination which is herein termed beam forming. Variation of the CCD clock signal frequency will vary the inter-tap shift period and therefore will vary the period of input signal spacial frequency that will be enhanced, thereby controlling the direction of incident illumination that will be enhanced and therefore the incident illumination component that will be processed by the beam forming network.

A hybrid memory arrangement may be provided with an analog memory such as a CCD memory, wherein digital information may be provided to and received from the memory arrangement and wherein the memory arrangement may store information in an analog signal form. Conversion of input information from digital form to analog form may be provided with a digital-to-analog converter for storage of analog signals and conversion of output signals from analog form to digital form may be provided with an analog-to-digital converter for outputting of digital information in response to stored analog information. In a shift register embodiment, recirculation may be provided with analog signals or with digital signals. In the digital recirculation embodiment, the analog samples from the CCD memory may be converted to digital form with an analog-to-digital converter, recirculated to the digital input, and converted from digital to analog signal form with a digital-to-analog converter for storage in the CCD memory in analog signal form. Refreshing of analog signals and digital signals may be provided to compensate for degradation of analog signals as they are shifted through the CCD memory.

In a digital refresh embodiment for an analog memory device, digitial signals output from a hybrid memory may be rounded high to compensate for degradation towards a low level or may be rounded low to compensate for degradation towards a high level, wherein degradation of a signal shifted through an analog memory may be compensated by rounding the degraded output signal to a reference level, and wherein the degradation of the analog signal shifted through the memory may be less than the digital resolution of the round-off operation.

A refresh arrangement for a hybrid memory may be provided for detecting the amount of degradation of analog signals shifted through the memory and for refreshing the analog signals in response to the detected degradation. In a preferred embodiment, a reference signal having a reference analog amplitude may be multiplexed with analog data signals input to an analog memory and shifted through the analog memory. Refresh circuitry may sample the reference signal as indicative of the magnitude of the degradation and may refresh the analog signals from the analog memory in response to the amount of degradation of the reference signal. A multiplexer arrangement may be provided for multiplexing an analog reference signal with the input analog data signals, where the multiplexer may be an analog mixer for selecting either an analog recirculation signal or an analog input signal and interspersing an analog reference signal therewith. Selection may be provided with digital logic controlling analog switches for selecting the appropriate source of an analog signal for input to the analog memory such as from a recirculation source, an input source, or a reference source.

Hybrid memory refresh circuitry may include a sample-and-hold network for sampling and storing the reference signal from the analog memory. The output signal from the sample-and-hold circuit may be used to control a refresh circuit for controlling gain of an amplifier to selectively amplify the degraded analog signals to compensate for degradation caused by shifting through the analog memory. In one embodiment, the sampled reference signal may be used to control an AGC circuit for refreshing the analog signals. In another embodiment, the sampled reference signal may be used to control a multiplier circuit for multiplying the degraded signals by a signal related to the degradation of the signals. An implicit servo arrangement may be provided for multiplying the degraded signals by the reciprocal of the reference signal amplitude, wherein the amount of gain or multiplication may be related to the proportional degradation of the signals. The refresh circuitry may be implemented with analog signal processors, digital signal processors, and hybrid signal processors, where analog, digital, and hybrid mulitpliers are well known in the art.

An analog compositor may be implemented by inputting an analog trace signal to an analog shift register memory such as a CCD memory and shifting the analog memory to effectively sample the input trace signal, wherein each clock interval of the analog memory shift clock may be related to a sample interval of the analog signal input to the analog memory. Control logic may initiate shifting of the analog memory in response to a synchronization signal related to the start of a trace signal. As the analog memory is shifted and recirculated, each input sample may be added in analog signal form to a corresponding recirculated analog sample from the analog memory, wherein the adding of corresponding samples may be defined as a compositing operation. A reference signal as described above for a hybrid memory refresh arrangement may be used in conjunction with the analog compositor arrangement for mitigating effects of degradation due to shifting of analog signals. After a plurality of composites has been accomplished, the analog signal samples may be shifted out of the analog memory to an analog-to-digital converter such as for correlation with a digital correlator or for processing with other analog or digital signal processing circuits.

CCD Demodulator and Multiplexer (FIG. 9A)

In accordance with the present invention, a phase sensitive demodulator and a multiplexer arrangement will now be described with reference to FIG. 9A. To exemplify this embodiment of the present invention, it will be described relative to the channel processing arrangement for an acoustic imaging system.

An array of transducer elements 910 is provided to generate transducer signals 912 with each element 911 generating an output signal 913 in response to acoustic inputs sensed by elements 910. Signal processors 914 provide signal processing operations on signals 912, where these signal processing operations may include buffering, amplification, and noise filtering. Processed transducer signals 915 and 916 may each be input to one switch or a pair of switches shown as field effect transistor (FET) switches 917 and 918. One of each pair of switches may be controlled by an in-phase (0°) reference signal 930 and the other switch may be controlled by a quadrature (90°) reference signal 931. Reference generator 929 generates in-phase signal 930 and quadrature signal 931 for complex demodulation of processed signals 915. In one embodiment, reference generator 929 may have substantially the same frequency as the acoustic signals sensed by elements 910. As is well known in the art, sampling or switching an AC signal with a reference signal will provide an output signal that is related to the component of the input signal that is in-phase with the reference signal. Therefore, in-phase reference signal 930 controls in-phase FETs 917 to provide in-phase demodulated signals and quadrature reference signal 931 controls quadrature FETs 918 to provide quadrature demodulated signals. CCD 920 is implemented to receive and store a plurality of demodulated input signals 919 with corresponding charge storage and shift elements, where each storage element in CCD 920 sums or integrates the charge provided by each corresponding signal 919 which are switched or demodulated with FETs 917 and 918. The amount of charge that is accumulated in each CCD storage element is related to the amplitude of the input signal and the time that switches 917 and 918 are conducting. The summation of samples controlled with FETs 917 and 918 cause a charge to be stored that has a magnitude related to the phase related components of the input signal 915 which is sampled in-phase with the corresponding reference signal 930 or 931. Input FETs 917 and 918 may have a charging time constant associated therewith such as with the on-resistance of the FET and the charging capacitance of the CCD. The charging time constant may be increased by connecting resistors in series with FETs 917 and 918 or by reducing turn-on excitation of FETs 917 and 918 to provide a desired charging rate. The charging time constant should be longer than the frequency of the input and reference signals to filter the demodulation switching transients.

Mode logic 921 controls system operations. A plurality of modes may be provided with control signals including demodulate and integrate mode signals 924, shift signal 922 and convert signal 923. These signals control the sequential modes of operation of the system. For example, demodulate and integrate signal 924 enables reference generator 929 to generate in-phase signal 930 and quadrature signal 931 to sample input signals 915 with switches 917 and 918 to build-up charge in corresponding elements of CCD 920, which demodulates and filters processed signals 915. After a pre-determined period of time or quantity of integration samples, the shift and convert mode may be enabled, and the demodulate and integrate mode may be disabled; thereby causing signals 930 and 931 to turn off or "open" switches 917 and 918 to prevent further charge accumulation in CCD 920. Mode logic 921 may then generate clock pulses 922 to shift the stored charge through CCD 920 to output signal line 925. Analog-todigital converter (ADC) 926 may be controlled with convert signal 923 to covert analog output signal 925 to digital form as digital signals 927. Clock signal 922 and convert signal 923 may be interleaved so that each analog signal 925 that is shifted out of CCD 920 will be converted with ADC 926 to provide sequential digital output signals 927. Therefore, the plurality of demodulated and integrated signals may be stored in CCD 920 and may be sequentially or serially shifted out of CCD 920 as analog output signals 925 and may be converted to sequential digital signals 927 with ADC 926. This arrangement provides a parallel-to-serial signal converter, which is known in the art as a multiplexer.

Mode logic 921 may be a well known counter and decoder arrangement such as a Texas Instruments counter S/N 7490 and decoder 7442. Gating of clock signals and generation of quadrature signals is discussed in copending patent applications which are incorporated herein by reference.

The arrangement described with reference to FIG. 9A further exemplifies a CCD arrangement for summing analog signals. Input signals 919 excite related CCD elements when switches 917 and 918 are conducting, where the CCD elements effectively add new charge that is related to the amplitude of input signal 919 to the charge previously stored in the corresponding CCD element.

Prior art phase sensitive demodulators provide a switching arrangement and a filtering arrangement, wherein the filtering arrangement "smooths" switching transitions to provide a steady state output signal. In system 900, switches 917 and 918 in conjunction with CCD 920 provide operations similar to that used in prior art phase sensitive demodulators. For example, switches 917 and 918 will switch processed signals 915 in-phase with reference signals 930 and 931 and charge storage elements of CCD 920 will integrate or filter the sampled processed signals 919 to provide a steady state charge signal proportional to the phase related component of processed signals 919 as a steady state charge amplitude without switching transients.

The CCD demodulator and multiplexer embodiment has been described for a combined phase sensitive demodulator and multiplexer arrangement. It is herein intended that the demodulator arrangement and the multiplexer arrangement may be usable as separate arrangements and may be combined in a preferred embodiment of the present invention. Further, any reference to a demodulator with reference to the embodiment shown in FIG. 9A is also intended to exemplify a sample-and-hold arrangement wherein the demodulator arrangement described with reference to FIG. 9A provides a sample and storage operation under control of mode signals and therefore further exemplifies a sample-and-hold arrangement. Still further, a plurality of samples may be added or integrated under control of the reference signals 930 and 931 using the storage and charge adding or charge integrating capabilities of the CCDs, exemplifying analog summation or integration and particularly analog summation or integration under control of digital logic signals.

Beam Forming (FIG. 9B)

A beam forming arrangement may be provided with a plurality of transducer elements for receiving incident illumination and a delay line having taps for introducing received energy from the transducers into the delay line. Assuming that the taps are equally spaced relative to the time delay therebetween, if the period of a signal introduced into the plurality of taps is equal to the time delay between taps, that signal may be reinforced at each tap and may exit the delay line having an amplitude related to the incident energy. If the period of the signal is different from the time delay between taps, the signal may not be reinforced to the same degree as in the above-mentioned case. Still further, if the waveform period is half the delay between taps, alternate taps would provide a signal 180 degrees out-of-phase with the preceding tap signal thereby cancelling the signal introduced at two adjacent taps. This is analogous to the operation of a well known phase sensitive demodulator wherein an input signal has a first frequency characteristic and wherein the reference signal has a frequency characteristic that is equal to the input signal frequency, different from the input signal frequency, or half of the input signal frequency respectively relative to the three delay line examples discussed above.

In one beam forming embodiment, a plurality of transducers 910 are shown receiving illumination along lines 969 from source 964. Transducer output signals 968 are connected to taps on CCD delay line 966. The input signals 968 propagate along CCD delay line 966 in the direction shown by arrow 970 to be generated as output signal 971, which is related to the time varying summation of input signals 968 having time delays T1 on input lines 968. If the time delay between signal taps 968 is a fixed delay T1 corresponding to a wavelength and if the spacing between transducers 910 is related to wavelength $\lambda 1$, then the delay line 966 will enhance the signals by summing the input components in-phase and outputting the time variying summation on signal line 971. If the incident illumination 969 has a frequency f1 with a wavelength $\lambda 1$, then energy coming from source 964 propagating in direction 973 parallel to the plane of transducers 910 will provide in-phase signal components at each of the transducers 910 for enhancement of signal 971. For frequencies lower than frequency f1, an angle $\theta$ may exist wherein the incident illumination projected upon transducer array 910 will have a wavelength component equal to $\lambda 1$ and thereby satisfying the conditions for enhancement of output signal 971. Therefore, there is a relationship between spacing $\lambda 1$ of transducer elements 901, time delay T1 between delay line taps 968, frequency of incident illumination, and angle-of-incidence $\theta$ for signal enhancement.

In accordance with one feature of the present invention, a beam forming arrangement is provided having a controllable illuminating frequency which defines the angle $\theta$ viewed by the array 910. A variable transmitter frequency such as provided with a VIBROSEIS chirp generator may be used with the beam forming arrangement of this inventive feature. It can be seen that the signal that will be enhanced with delay line 966 is related to the frequency of the illumination and the angle $\theta$ of incident illumination, wherein the component of wavelength in the plane of sensors 910 must be equal to distance $\lambda 1$. Therefore, the lower the frequency the greater must be the angle $\theta$ and the higher the frequency the smaller must be the angle $\theta$ for enhancing signal 971. Further, signal 971 is related to the illuminated environment at an angle $\theta$ that is determined by the frequency of the incident illumination. Therefore, the direction of received beam $\theta$ is related to the frequency of the illumination, wherein the beam direction can be controlled by the illuminating frequency.

In accordance with the present invention, a variable frequency illuminator is provided to control the direction of the received beam 969 and therefore the portion of the environment to be interrogated, where the information is output as signal 971. Various well known arrangements may be used in conjunction with the system of the present invention including arrangements for controlling the transmitting frequency to sweep through a controllable angle $\theta$ to interrogate an environment.

In another embodiment of the present beam forming inventive feature, delay line 966 may be replaced with a CCD, as described above with reference to FIG. 9A. In this embodiment, CCD 920 receives input signals 919 from transducers 910. A clock generator 921 provides clock signals 922 to shift information along CCD 920 to the output signal 925. In this arrangement, the time delay between taps 919 is controlled by the frequency of clock 922, where the time delay is related to the clock frequency and to the number of shift stages between taps 919. For simplicity, it will herein be assumed that taps 919 are located one shift stage apart, wherein each clock pulse 922 will shift the charge that is accumulated at a particular tap 919 by one tap toward output signal 925.

CCDs have the characteristic of accumulating charge in relation to (1) the signal magnitude on an input line and (2) the time for which the signal is present. Therefore, the output signal on line 925 is related to the magnitude of signals 919 and the time of charge accumulation related thereto. Assuming that the time of charge accumulation is related to the shift frequency, the output signal 925 will be related to the signal magnitude on lines 919 for the time of charge accumulation. As discussed relative to FIG. 9B for the delay line 966, the output signal 925 will be related to the frequency of the illuminating energy, the time delay between shifting stored signals between input lines 919 and the angle of incidence $\theta$ of the illumination. Assuming that the frequency is constant and the time delay between input signal lines 919 is related to the frequency of shift clock signal 922, then beam angle $\theta$ that will cause signal 925 to be enhanced is inversely related to the frequency of clock signal 922, wherein a high clock frequency will steer the beam to a low angle and a low clock frequency will steer the beam to a high angle for enhancement of signals 925 and 971 related to the particular beam angle.

Therefore, beam forming may be achieved with a CCD arrangement and beam angle $\theta$ may be controlled by the frequency of clock signal 922.

The CCD arrangement set forth in FIG. 9A has been used to exemplify the CCD arrangement of the beam forming inventive feature. In this embodiment, switches 917 and 918 may be used for demodulating the input signals 916 or may be controlled to be conductive or "on" to provide greater similarity to the delay line embodiment discussed with reference to FIG. 9B. Further, the modes of integrate or shift as discussed for the demodulator and multiplexer arrangement with reference to FIG. 9A are interleaved as alternate integrate (sample) and shift commands for the beam forming feature of the present invention; wherein mode logic 921 may command integrate, shift, integrate, shift, etc. as alternate operations or interleaved operations for beam forming of input signals.

Background on beam forming concepts may be obtained from the prior art literature such as the reference to Dolph listed hereinafter and the references cited therein.

Hybrid Memory (FIGS. 9C et seq)

Memories for storing digital information in digital form are well known in the art and include digital shift registers, disc memories, and magnetic tape. In one embodiment of the present invention, a "digital" memory is provided for storing information in analog signal form and for operating in conjunction with a digital system as a digital memory. The storage of information in analog signal form and the conversion between digital and analog signals for storage, for input, or for output will herein be termed a hydrid memory arrangement.

A CCD memory degrades signals as they are shifted through the memory due to charge transfer inefficiencies. Several CCD memory refresh mechanizations will be described with reference to FIGS. 9A-9J to illustrate refresh embodiments. Refreshing may be provided in the digital domain as will be described with reference to FIG. 9C, in the analog domain as will be described with reference to FIGS. 9F and 9G, or in the hybrid (analog and digital) domain as will be discussed with reference to FIG. 9J. A digital refresh embodiment provides re-establishment of signal amplitudes with digital circuit elements substantially operating on digital signals in the digital domain. An analog refresh embodiment provides re-establishment of signal amplitudes with analog circuit elements substantially operating on analog signals in the analog domain. A hybrid refresh embodiment provides re-establishment of signal amplitudes with a combination of analog and digital circuit elements operating on analog signals and digital signals in combined analog and digital domains. A digital refresh embodiment is discussed with reference to FIG. 9C; where digital circuits add a digital "non-significant" bit to a digital signal to re-establish digital signal amplitude. An analog refresh embodiment is discussed with reference to FIGS. 9H and 9I; where analog circuits control gain with an analog sampled signal to re-establish analog signal amplitude. A hybrid refresh embodiment is discussed with reference to FIG. 9J where digital circuits set the gain of an analog amplifier with a digital gain setting number to control an analog signal.

The hybrid memory feature of the present invention will now be described. This feature provides improved storage utilization. For example, analog signals may be stored and shifted within CCD memory 932 to an accuracy that, for this example, will be assumed to be better than one part in 256 or 8-bits of digital resolution. An analog signal having such resolution may require only a single shiftable memory cell. Digital signals stored and shiftable in CCD memory 932 having such digital resolution would require 8-bits of digital resolution to provide a resolution of one part in 256. Therefore, for this example an improvement in storage capacity by a factor of eight may be achieved, where 8-bit resolution analog information may be stored and shifted in CCD memory 932 requiring only one-eighth of the number of storage elements that would be required to store and shift 8-bit resolution digital information in CCD memory 932.

A hybrid memory arrangement using a CCD will now be described with reference to FIGS. 9C and 9D, Hydrid memory system 902 comprises CCD memory 932, input digital-to-analog converter (DAC) 933 and output analog-to-digital converter (ADC) 934. CCD memory 932 comprises a plurality of shiftable analog storage elements, wherein an analog input signal 949 is stored in a first CCD element and, under control of clock signal 943, input analog signal 949 is shifted through a plurality of CCD analog charge memory stages until it reaches an output stage which provides the shifted analog charge signal as output signal 936. Output analog signal 936 may be converted with ADC 934 to provide digital output signals 935 for use by a digital data processing system. Input digital signals 938B to DAC 933 are converted to analog signal 949 for storage in CCD memory 932. Information shifted out of CCD memory 932 may be recirculated as input information in analog signal form along recirculation path 939 or may be recirculated as digital signals from 938A to signals 938B. Information in CCD memory 932 may be changed by opening the recirculation path, either analog recirculation path 939 with switch 947 or digital recirculation path 938B with logic 940 and enabling digital input signals 938C with well known selection logic 940 or analog input signal 944 with switch 945.

Control logic 937 provides sequential control signals for clocking CCD memory 932 with clock signal 943 and for controlling the conversion of input and output information with convert signals 941 and 942. In one embodiment having digital recirculation, control logic 937 may provide clock signal 943 to provide a new output signal 936, then provide convert signals 941 and 942 to convert analog output signal 936 to digital signal 938A with ADC 934 and to convert digital signals 938B to analog signal 949. Signal 938A may be available to the digital system and may be further available for recirculation.

Operation and error reduction for a hybrid memory will now be discussed. An example will be provided to illustrate the relationships between signal degradation by a CCD memory and resolution of DAC 933 and ADC 934. In a preferred embodiment, ADC resolution is worse than DAC resolution which is worse than signal degradation through the CCD; where DAC and ADC resolution can be set to be worse than signal degradation. ADC 934 is assumed to have a conversion precision of 8-bits or one part in 256 for the present example, where this resolution is assumed to be greater than the degradation of the stored information in CCD memory 932. Further, DAC 933 is assumed to have a resolution greater than the resolution of ADC 934, which will be 9-bits or one part in 512 for the present example. Therefore, it can be seen that DAC 933 may have greater resolution than ADC 934, where the state of the least significant bit of DAC 933 may be considered to have no "significance" and therefore may be set to either the one or the zero state without affecting the operation of hybrid memory 902. Therefore, in accordance with the present invention, the least significant bit of DAC 933, which is a "non-significant bit", will be set to the one-state so that input analog signal 949 will always be on the high side of the permissible input signal variation, where any signal degradation through CCD memory 932 will merely be degradation of a part of the "non-significant" information or degradation of information that is always on the high side of the permissible variations within the resolution of ADC 934. Although analog signal 949 is degraded as it is shifted through CCD memory 932, the degradation will be less than the "insignificant" bit or "bias" imposed on signal 949 by DAC 933. This bias does not overlap to the next count of ADC 934 because it is also less than the resolution of ADC 934. Therefore, degradation of analog signal 949 through CCD memory 932 may be less than the bias signal due to this "insignificant" bias bit in DAC 933 and therefore can never be degraded to the next lower count associated with ADC 934. Therefore, DAC 933 will re-establish the level of signal 949 independent of degradation through CCD memory 932, but neither re-establishment of the signal level with DAC 933 nor degradation of the signal shifted through CCD memory 932 will overlap the next highest count or degrade below the next lower count of ADC 934.

The error reduction concept can be better understood with reference to FIG. 9D, where a resolution increment of ADC 934 is shown bracketed by upper limit 955 and lower limit 956. Analog output signal 936 is shown having an amplitude 957 into ADC 934. ADC 934 converts signal 957 and rounds-off the output digital nunber to amplitude 956. The digital number related to amplitude 956 is recirculated as signals 938A and 938B to DAC 933 which converts amplitude 956 to an analog signal level and introduces an "insignificant" bit or bias having an amplitude VB which is less than the resolution increment between resolution amplitudes 956 and 955 but which is greater than the degradation of the signal 949 when shifted through CCD memory 932. Therefore, input signal 949 will have an amplitude that is equal to amplitude 956 plus the bias amplitude VB for a total amplitude shown as amplitude 958. As the analog input signal 949 is shifted through memory 932, it is degraded toward amplitude 959 and output as signal 936. Again, conversion of signal 936 having amplitude 959 with ADC 934 provides amplitude 956, which is again recirculated and converted to amplitude 950 and again shifted through CCD memory 932. Therefore, the roundoff with ADC 934 and the introduction of bias VB with DAC 933 automatically compensates for degradation of the signal shifted through memory 932, thereby precluding an accumulation of error; neither round-off, nor bias, nor memory shift related degradation.

In still another example, output analog signal 936 may be degraded to level 951, where ADC 934 converts analog signal 951 to digital form and "rounds high" to the next higher increment of amplitude 952. Signal amplitude 952 is then degraded through recirculation, D/A conversion and shifting as described above to amplitude level 953 (the same as amplitude 951) as output signal 936 but is again converted with ADC 934 to digital form and again "rounded-high" to amplitude 954 (the same as amplitude 952) before again recirculating.

Rounding high may be accomplished with well known analog biasing, digital biasing, adding one digital increment, or other well known rounding techniques. For example, a "non-significant" or bias bit may be set to a fixed state to bias the digital number to the high side for a "round-high" arrangement.

In view of the above, degradation of an analog signal such as due to shifting, can be limited to a finite error or resolution region and can be prevented from accumulating without limit. Therefore, limiting the magnitude of error accumulation permits analog signal degradation to be tolerated and permits unlimited shifting operations with only a limited error accumulation.

The above described embodiments of elimination of accumulating error has been described relative to recirculation for a hybrid memory. It should be understood that this inventive feature has broad applicability, where this inventive feature may be practiced with any embodiment that either biases an input analog signal or rounds-off an output analog signal or both, biases an input signal and rounds-off an output signal as discussed relative to FIGS. 9C and 9D above.

In the above example, biasing and round-off of signals has been shown using digital techniques. Other bias and round-off techniques may be used. For example, analog biasing such as with summing resistors or by scaling the signals may be used. Similarly, round-off may be achieved with digitizing a signal. Other arrangements will now become obvious to those skilled in the art from the teachings of the present invention.

An adaptive refresh arrangement will now be described with reference to FIG. 9F. CCD memory 932 stores information under control of clock signal 943. The information is loaded as signal 949 and output as signal 936 in serial form. These signals may be analog level signals or digital single-bit signals. Refresh circuit 996 refreshes memory output signal 936 for output and for recirculation as signal 960. The output signal from the memory system may be the unrefreshed memory signal 936 or the refreshed signal 960, shown as outputs from memory 932 by arrows pointing out of the memory system to other systems. Refreshed signal 960 may be recirculated back to the input of memory 932 under control of selection circuitry and a FET electronic switch 947.

Input signals to memory 932 are selected with input selector switches 947, 991 and 992 to generate input signal 949. Switch 947 selects recirculation signal 960 from memory output. Switch 991 selects analog input signal AI to load new information into memory 932. Switch 992 selects a reference signal REF. Switches 947, 991, and 992 may be controlled with a digital gate such as AND-gates 987 and 988 and inverter-gate 989 respectively. When decoder signal 990 is low, AND-gates 987 and 988 are disabled and inverter 989 is enabled for non-selecting switches 947 and 991 and for selecting switch 992. When decoder signal 990 is high, AND-gates 987 and 988 are enabled and inverter 989 is disabled for selecting either switch 947 or 991 in response to recirculation mode command signal RECIRC and input mode command signal INPUT or for non-selecting switch 992 respectively. Recirculation is enabled with recirculation command signal RECIRC to gate 987 and input signal AI is enabled with input command signal INPUT to gate 988. Therefore, memory 932 may load recirculated information, input information, or a reference signal under control of signals to gates 987, 988, and 989.

An arrangement will now be discussed for adaptively controlling refreshing of information stored in memory 932 by using a reference signal to control gain of the refresh circuitry 996. Clock pulses 943 will herein be assumed to be from a free-running clock for simplicity of discussion, where memory 932 is continually clocked to load either recirculation signal 960, analog input signal AI, or reference signal REF under control of logical signals 948, 967, and 968 from gates 987, 988, and 989; respectively. Clock signal 943 may clock a counter 993 to provide a count that is indicative of the number of clock pulses received and therefore the position of the information shifted into memory 932. For example, counter 993 provides operation similar to the bit, word, and sector counters associated with well known prior art disk memories which are used for counting disk memory clock pulses to keep track of the location of information on a rotating disk. Counter output signals 994 are provided to decoder 995 generating decoder output signal 990 in response to a particular code of counter signals 994 from counter 993. Well known decoders such as the Texas Instruments S/N 7445 decoder provides a high signal output when the input code is not true and provides a low signal output when the input signal code is true. Therefore, when counter 993 increments through a selected code, decoder 995 may provide a low output signal 990; which may enable switch 992 through inverter 989 and which may disable switches 947 and 991 through gates 987 and 988 respectively to load a reference signal REF into memory 932 through switch 992 as signal 949. In one embodiment, the selected code in counter 993 lasts for one period of clock signal 943, where the next clock pulse increments counter 993 to a different code condition. Therefore, decoder output signal 990 may have a single clock pulse width and reference signal REF loaded into memory 932 may be loaded into a single-bit position.

Mode selection may be performed with a mode flip-flop M1 for selecting a recirculation mode with the $\overline{Q}$ signal RECIRC or for selecting an input mode with the Q signal INPUT. The state of the mode flip-flop M1 may be controlled with well known logic arrangements such as toggling a S/N 74743 J-K flip-flop or loading a mode condition into a S/N 7474 D flip-flop. The recirculation mode is commanded when the M1 flip-flop generates a high recirculation mode signal RECIRC thereby enabling gate 987, where recirculation control signal 948 becomes high for the period of time that decoder signal 990 is high. Recirculation control signal 948 controls recirculation switch 947 to be conductive for the period of time decoder signal 990 is high to conduct recirculation signal 960 to the input of CCD memory 932 as signal 949. Similarly, the input mode is commanded when the M1 flip-flop generates a high input mode signal INPUT, thereby enabling gate 988, where input control signal 967 becomes high for the period of time that decoder signal 990 is high. Input control signal 967 controls input switch 991 to be conductive for the period of time decoder signal 990 is high to conduct input signal AI to the input of CCD memory 932 as signal 949. Mode command signals RECIRC and INPUT are mutually exclusive, where only one of these mode command signals may be high at a time, which is characteristic of flip-flop Q and $\overline{Q}$ output signals. Therefore, either the recirculation switch 947 will be conductive as enabled by recirculation control signal 948 being high, or the input switch 991 will be conductive as enabled by input control signal 967 being high, or neither recirculation switch 947 nor input switch 991 will be conductive as disabled by decoder signal 990 being low.

Figure 9G:
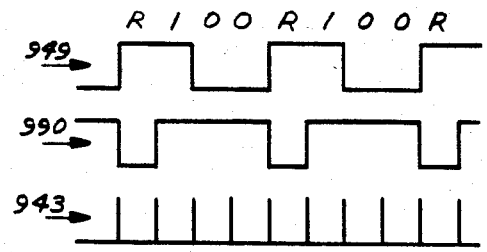
FIG. 9G illustrates the signal forms associated with the adaptive memory refresh arrangement of FIG. 9F.

Decoder signal 990 is high for the data load portion of a memory cycle and low for a reference load portion of a memory cycle as will be discussed with reference to FIG. 9G. A memory cycle may be defined as a storage sequence of a combination of data and reference signals. In a simplified example used herein, a memory cycle may be the number of clock pulses required to shift a stored signal from the input of memory 932 to the output of memory 932. For example, a memory having a 512 data-bit capacity and a one reference-bit capacity may have a memory cycle of 513 clock pulses. Therefore, the decoder signal 990 will be high for the 512 data-bit portion of the memory cycle and will be low for the one reference-bit portion of the memory cycle. When decoder signal 990 is high, inverter 989 will be disabled and gates 987 and 988 will be enabled; where data will be recirculated through switch 947 or data will be input through switch 991 under control of mode signals RECIRC or INPUT. When decoder signal 990 is low, inverter 989 will be enabled and gates 987 and 988 will be disabled independent of the state of mode signals RECIRC and INPUT. Inverter 989 will invert a low decoder signal 990 to produce a high reference control signal 968 to make reference switch 992 conductive, which results in reference signal REF being input to memory 932 as signal 949 where reference signal REF will be input through switch 992.

Reference signals can be introduced into selected bit positions of memory 932 with counter 993, decoder 995, and input circuitry 908. Reference signal REF may be a precise amplitude signal, wherein the precision of the amplitude may be preserved with a good quality electronic switch 992 or other switch which are well known in the art, wherein a precision reference amplitude signal input to CCD memory 932 through switch 992 as signal 949 may be stored in a selected bit position. The reference signal bit may be shifted through memory 932 under control of clock signal 943 and shifted out of memory 932 as output signal 936 to refresh circuitry 996. The reference signal may be degraded as it is shifted through memory 932, consistent with the charge transfer inefficiency of the CCD type memory devices. Reference signal REF stored in and shifted through memory 932 may be degraded by substantially the same amount as other signals stored in and shifted through memory 932. Because reference signal REF was initially stored in memory 932 as a precise signal amplitude, the amplitude of the reference signals when shifted out of memory 932 is indicative of the degradation through memory 932. Therefore, the reference signal output from memory 932 may be used to control the refresh circuitry to provide an adaptive control for amplitude reconstruction. Adaptive control is herein intended to mean control that is adjusted to the actual conditions, where refresh circuitry 996 operating under control of a degraded reference signal may be used to control refresh operations as a function of actual degradation of the signal and may therefore be used over a range of degradation variables such as over a temperature range, over a clock pulse frequency range, and over variations between different CCD memory devices and may further be used to adaptively compensate for other variations such as charge leakage, aging of CCD memory elements, and other such effects.

In a simplified embodiment, it may be assumed that counter 993 contains a number of counts equal to the number of bits in memory 932 and that a particular count code, which may be the first count code for the present simplified example, is detected with decoder 995 to generate decoder signal 990. For the first count of each memory shifting sequence, the output of decoder 995 will go low thereby commanding loading of reference signal REF into memory 932 as discussed above and simultaneously enabling refresh circuitry 996 with decoder signal 990 to sample or otherwise monitor a signal being shifted out of memory 932; wherein the synchronization counter 993 provides another frame, or initialization point, or start of the shift operation with a reference signal being loaded into memory 932 and the last prior reference signal being simultaneously available as the output signal 936 of memory 932. Therefore, decoder 995 may enable loading of a new reference signal into memory 932 and may also enable sampling of the degraded reference signal as signal 936 output from memory 932 with refresh circuitry 996.

In a simplified example, it will be assumed that memory 932 has a four-bit storage capacity and that counter 993 is a two-bit counter for a four-count operation, known as a modulo-3 counter. This example will now be discussed with reference to the waveforms shown in FIG. 9G. Clock signal 943 is represented as a sequence of clock pulses. Signal 990 is shown as a squarewave signal which is low for each fourth-bit time, which is consistent with decoder 995 decoding the output of a two-bit four-state counter 993. Data signal 949 is shown in digital squarewave form for convenience but may also be implemented as analog amplitude signals. Data waveform 949 is shifted into memory 932 and similarly is shifted out of memory 932 as signal 936 after a four-bit time shift delay. Therefore, signals 949 and 936 are substantially the same signal except that signal 936 has been delayed by four-clock pulse periods and has been degraded by the shifting operations through memory 932. It will further be assumed for this example that recirculation control signal RECIRC is high and the input control signal INPUT is false. Therefore, three data-bits will be recirculated during the high period of decoder signal 990 and one reference-bit will be loaded during the low period of decoder signal 990. As shown in FIG. 9G, data signals (shown as a "1" and a pair of "0"s following the reference signal R) will be recirculated as signal 990 through switch 947 under control of decoder signal 990 and mode signal RECIRC. Therefore, when decoder signal 990 goes low, gate 987 will cause control signal 948 to go low thereby making switch 947 non-conductive and disabling recirculation signal 960. Further, when decoder signal 990 goes low, inverter 989 will cause control signal 968 to go high thereby enabling reference signal REF to load a precision voltage into the CCD memory, shown in FIG. 9G as signal R in waveform 949. Similarly, when decoder signal 990 goes high, recirculation signal 960 will be enabled with gate 987 and switch 947 and reference signal REF will be disabled with inverter 989 and switch 992, thereby permitting the three data-bits shown as a "100" code to be recirculated as signal 960 into memory 932 as signal 949. Therefore; as counter 993 increments from a count of 0 to a count of 3, decoder 995 enables the reference signal REF to be loaded into memory 932 at the count of 0 and the digital data in memory 932 (consisting of a "100" sequence) to be recirculated and loaded into memory 932 at the counts of 1, 2, and 3. Refresh circuitry 996 monitors the reference signal shifted out of memory 932 as signal 936, identified by a low decoder output signal 990 to refresh circuitry 996; where refresh circuitry 996 will adaptively re-establish the amplitude levels of the data in response to the reference signal, as described in detail hereinafter.

A simplified embodiment of a refresh circuit will now be described with reference to FIG. 9H. Output signal 936 from memory 932 is processed with amplifier 963. Sample-and-hold circuit 961 samples the output signal 936 under control of the decoder sample signal 990; where decoder signal 990 going low enables sample-and-hold 961 to sample the reference bit of output signal 936; thereby providing output signal 962 indicative of degradation of the reference signal through memory 932. Amplifier 963 may be an RCA Model No. CA3080 transconductance amplifier, wherein the gain through amplifier 963 is controlled by control signal 962. Therefore, memory output signal 936 is adjusted in amplitude with amplifier 963 as a function of control signal 962, thereby providing refreshed recirculation signal 960. Control signal 962 may be connected to control input $I_{ABC}$ of amplifier 963 and signal 936 may be applied to the inverting input of amplifier 963, wherein the output signal 960 is related to the product of the signals 962 and 936. It may be desired that the amplitude of signal 960 be inversely proportional to the control signal 962, wherein control signal 962 may be implemented as a complement signal by subtraction from a reference signal or may be inverted as a reciprocal signal inversely proportional to the sampled signal 936 for complement or inverse control of amplifier 963. Reciprocal and subtraction circuits are well known in the art and may be introduced in signal line 962 to complement or invert the signal from sample and hold 961.

Figure 9H:
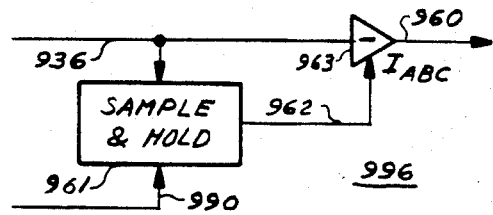
FIG. 9H illustrates a first refresh circuit.
Figure 9I:
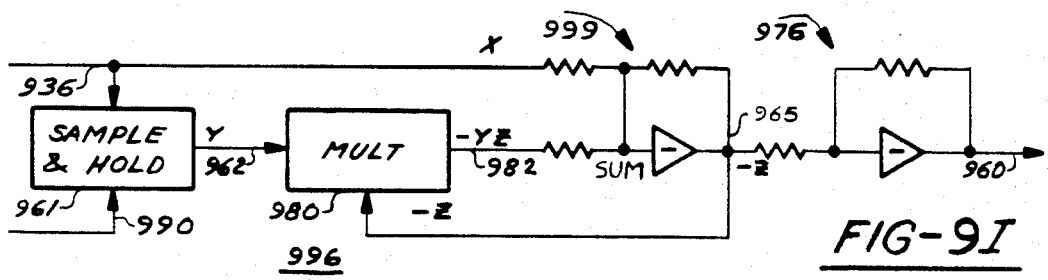
FIG. 9I illustrates refresh circuitry having an analog implicit servo.

An alternate embodiment of refresh circuitry 996 is shown in FIG. 9I, where memory output signal 936 is loaded into sample-and-hold 961 under control of decoder signal 990, as described with reference to FIG. 9H, and signal 936 is further processed with an inverting circuit to provide an output amplitude that is inversely proportional to the degradation of the reference signal. An implicit servo is shown in FIG. 9I, implemented with multiplier 980 and summer 999, wherein an implicit servo is well known in the art and is described in the reference by Levine listed hereinafter. The sampled reference signal is provided as signal 962 to multiplier 980. Multiplier 980 generates a product signal 982 which is proportional to the sampled signal 962 and the memory output signal 965 ($-Z$). The product signal 962 and the input signal 936 are algebraically summed with summing amplifier 999 to provide an implicit servo output signal 965; which can be shown to be related to input signal 936 divided by sampled signal 962. Amplifiers 999 and 976 may be used to adjust the scale factor of signal 965 to the desired value with feedback and input resistors and may be used to provide amplification, buffering, and inversion of summation signal SUM. Output signal 960 can be shown to have an amplitude proportional to the amplitude of input signal 936 and inversely proportional to the amplitude of degraded reference signal 962 stored in sample-and-hold circuit 961.

The implicit servo shown in FIG. 9I will now be described. The implicit servo discussion will reference equation (10) through equation (14) below to provide a simplified explanation of operation. Signals will be represented in equations (10)-(14) by the reference designation of the signal as shown in FIG. 9I provided in parentheses () in the equation as being indicative of the signal magnitude.

$$(SUM) = (936) + (982) \approx 0 \quad \text{equation (10)}$$

$$(982) = (962)(965) = -YZ \quad \text{equation (11)}$$

$$(SUM) = (936) + (962)(965) = X - YZ \approx 0 \quad \text{equation (12)}$$

$$(965) = -(936)/(962) \quad \text{equation (13)}$$

$$Z = X/Y \quad \text{equation (14)}$$

Summation signal SUM is equal to the difference between product signal 982 and input signal 936. Because output signal 965 is fedback in servo form to multiplier 980 to close a servo loop, signal SUM is controlled to be a very low magnitude near zero signal, as shown by the approximately zero ($\approx 0$) symbol in equation (10). Multiplier signal 982 from multiplier 980 is equal to the product of signal 965 and adaptive scale factor signal 962, as shown in equation (11). Substitution of equation (11) into equation (10) to eliminate the signal 982 term yields equation (12). Grouping of terms, factoring of the signal 965 term, and solving for the signal 965 yields the input signal 936 term divided by adaptive scale factor signal 962; as shown in equation (13). This solution is based upon the assumption that signal 965 is servoed to a very low signal amplitude then amplified with amplifier 999 to generate signal 965 for output and for feedback. In a high gain servo, the error in assuming that signal SUM is approximately equal to zero may be very small and will be assumed to be negligible. Equation (13) shows that different signal 965 is approximately equal to input signal 936 divided by the adaptive scale factor signal 962; wherein the greater the degradation through memory 932, the smaller will be adaptive scale factor signal 962 and therefore the larger will be the signal 965. In other words, the degraded signal 936 is multiplied by the reciprocal of the sampled reference signal to increase the signal 936 to a level related to the amount of degradation, as defined by adaptive scale factor signal 962. Other analog signal processing and implicit servo arrangements will now become obvious to those skilled in the art such as providing various function generation circuits to adjust the amplitude of degraded signal 936 as a function of adaptive control signal 962.

An alternate discussion of an implicit servo will now be presented with reference to the textbook by Levine listed hereinafter; wherein the following description is similar to the example provided on page 157 therein and wherein signals 936, 962, and 965 will be referred to as signals X, Y, and Z respectively for compatibility with the description in the book by Levine. It is desired to solve the equation $Z = X/Y$ as shown in equation (14), wherein Z is the corrected output signal 965, X is the degraded memory signal 936, and Y is the adaptive control signal 962 defining the magnitude of the required re-scaling. The servo output signal ($-Z$) is fedback to multiplier 980 to be multiplied with adaptive scale factor signal Y 962 to provide output signal ($-YZ$) as signal 982. Signal 982 ($-YZ$) is added to the uncorrected signal X 936 at the summing junction of operational amplifier 999 to generate the summation signal SUM which is amplified with amplifier 999 to provide output signal ($-Z$) 965 as a solution to equation (14).

The corrected signal ($-Z$) 965 is processed with inverting amplifier 976 to generate a non-inverted output and recirculation signal 960. Scale factors may be readjusted by a fixed amount by selecting feedback resistors of operational amplifiers 999 and 976.

Figure 9J:
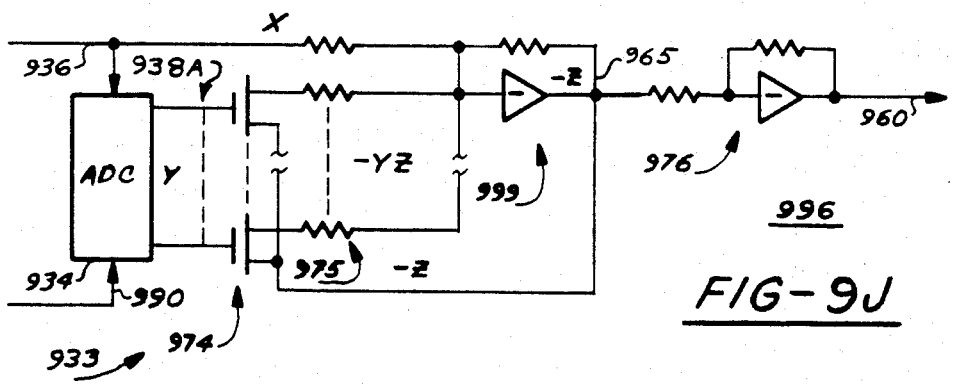
FIG. 9J illustrates hybrid refresh circuitry having an implicit servo.

Still another embodiment of the refresh circuit 996 is shown in FIG. 9J. Decoder signal 990 may be used to enable analog-to-digital converter (ADC) 934 to convert a reference bit of the memory output signal 936 to provide a digital output number Y 938A proportional to the degraded reference signal. Output word 938A may be used to excite multiplying digital-to-analog converter (DAC) 933. The DAC is implemented with analog switches 974 and weighted summing resistors 975 in a well known arrangement. Multiplying DAC 933 generates an output signal to the summing junction of operational amplifier 999 that is proportional to the digital number (Y) 938A and proportional to the excitation signal (−Z) 965 fedback from the output of operational amplifier 999. Similar to the mechanization discussed for FIG. 9I above, feedback signal (−Z) 965 is multiplied by digital input number (Y) 938A to generate output analog signal −YZ. Signal −YZ is summed with input signal X at the summing junction of operational amplifier 999 to generate output signal (−Z) 965 for feedback and for output. Buffer amplifier 976 is used for inversion, scaling, and buffering as discussed with reference to FIG. 9I above.

The instant reference signal refresh feature of the present invention has been described in detail with reference to FIGS. 9F-9J for scale factor compensation related error mechanisms such as charge transfer inefficiencies. In accordance with another feature of the present invention, a reference signal bias refresh compensation arrangement will now be discussed with reference to FIGS. 9F-9J.

An important CCD error mechanism may be relatively independent of signal magnitude scale factor such as being related to time, temperature, and/or other variables. This error mechanism may be defined as a bias error mechanism and may be caused by thermal leakage, recombination, or other well known affects as described in the article by Carnes and Kosonowsky referenced hereinafter. Compensation for bias errors may be accomplished in a manner similar to the arrangement discussed above for scale factor errors.

A bias reference signal may be multiplexed into a CCD memory as discussed for the scale factor reference signal with reference to FIGS. 9F-9J above. For simplicity of discussion, the bias reference signal REF (FIG. 9F) and R (FIG. 9G) may be described as a zero magnitude reference signal but the bias reference signal may be any convenient magnitude signal. As the bias reference signal is shifted through CCD memory 932, the magnitude will change as a function of leakage and other bias error mechanisms. The bias reference signal will be shifted out of CCD memory 932 to refresh circuit 996 for compensating the data signal 936 for bias errors. The bias reference signal may be loaded into sample and hold 961 to generate stored bias reference signal 962 (FIG. 9H). Bias reference signal 962 may be subtracted from memory output signal 936 to generated refreshed or compensated output signal 960.

The arrangement shown in FIG. 9H has been implemented to illustrate scale factor compensation, where changes to FIG. 9H will now be discussed relative to FIG. 9M to illustrate bias compensation. Amplifier 977 may be connected as well known differential amplifier, wherein memory output signal 936 may be connected to the negative input and stored reference signal 962B may be connected to the positive input or conversely to generate differential output signal 960. Differential signal 960 may represent memory output signal 936 with the bias error signal subtracted out therefrom, thereby compensating for bias errors.

The scale factor and bias compensation arrangements discussed with reference to FIGS. 9F-9J above may be combined to form a combination scale factor and bias compensation arrangement which will now be discussed with reference to FIGS. 9K-9O. Decoder 995 may generate a first output signal 990A and a second output signal 990B for controlling multiplexing of scale factor reference signal REF and bias reference signal GND respectively into different samples of CCD memory 932 (samples B and R as shown in FIG. 9L) with multiplexing circuits 989A and 989B respectively and switches 992A and 992B respectively of multiplexer 908 and for controlling sampling of scale factor reference signal REF and bias reference signal GND respectively with different sample and hold circuits similar to sample and hold circuits 961 for scale factor and bias compensation respectively. Scale factor compensation may be performed with product circuits 963, 980, and 974 shown in FIGS. 9H-9J and bias compensation may be simultaneously performed with differential circuits by subtracting the bias reference signal from the memory output signal such as before scale factor compensation with differential amplifier 963 or after scale factor compensation with differential amplifier 976. In alternate arrangements, the bias reference signal may be sampled before or after scale factor compensation, the scale factor reference signal may be sampled before or after bias compensation, and the memory output signal may be compensated for bias errors before or after it is compensated for scale factor errors by appropriate arrangements of circuit placement and input signal selections.

An adaptive refresh arrangement having combined scale factor and bias capability will now be described with reference to FIG. 9K in the same context as discussed for the scale factor capability alone with reference to FIG. 9F. CCD memory 932 stores information under control of clock signal 943. The information is loaded as signal 949 and output as signal 936 in serial form. These signals may be analog level signals or digital single-bit signals. Refresh circuit 996 refreshes memory output signal 936 for output and for recirculation as signal 960. The output signal from the memory system may be the unrefreshed memory signal 936 or the refreshed signal 960, shown as outputs from memory 932 by arrows pointing out of the memory system to other systems. Refreshed signal 960 may be recirculated back to the input of memory 932 under control of selection circuitry and a FET electronic switch 947.

Input signals to memory 932 are selected with input selector switches 947, 991, 992A and 992B to generate input signal 949. Switch 947 selects recirculation signal 960 from memory output. Switch 991 selects analog input signal AI to load new information into memory 932. Switch 992A selects a scale factor reference signal REF. Switch 992B selects a bias reference signal GND. Switches 947, 991, 992A and 992B may be controlled with digital gates such as AND-gates 987 and 988 and NOR-gates 989A and 989B respectively. When one of the decoder signals 990A or 990B is low, AND-gates 987 and 988 are disabled and one of the NOR-gates 989A or 989B is enabled for non-selecting switches 947 and 991 and for selecting one of the two switches 992A or 992B. When both decoder signals 990A and 990B are high, AND-gates 987 and 988 are enabled and NOR-gates 989A and 989B are disabled for selecting either switch 947 or 991 in response to recirculation mode command signal RECIRC and input mode command signal INPUT and for non-selecting switches 992A and 992B respectively. Recirculation is enabled with recirculation command signal RECIRC to gate 987 and input signal AI is enabled with input command signal INPUT to gate 988. Therefore, memory 932 may load recirculated information, input information, a scale factor reference signal or a bias reference signal under control of signals to gates 987, 988, 989A and 989B respectively.

Figure 9K:
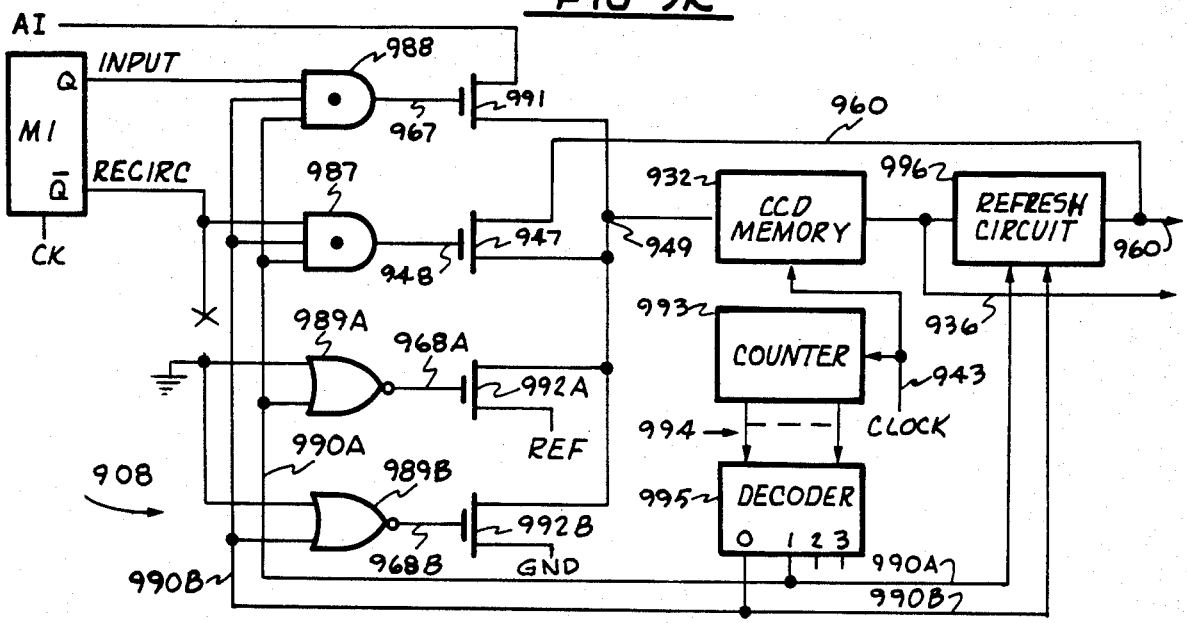
FIG. 9K illustrates an adaptive memory refresh arrangement having a plurality of reference signals.
Figure 9L:
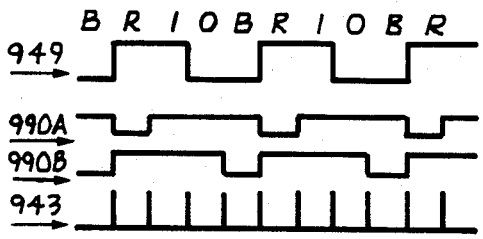
FIG. 9L illustrates signal forms associated with the adaptive memory refresh arrangement of FIG. 9K.

With reference to FIG. 9K, gates 989A and 989B provide the primary function of inverting decoder signals 990A and 990B to control switches 992A and 992B respectively, as discussed with reference to FIG. 9F for inverter 989 controlling switches 992. In one embodiment, it may be desirable to reestablish the reference signals for each recirculation by introducing a new reference signal for each recirculation, as discussed with reference to FIG. 9F using inverted 989 for selection. In an alternate embodiment, it may be desirable to permit the reference signals to degrade with the data signals over a plurality of recirculations and to be reestablished only at certain times. Such an alternate embodiment will now be described with reference to FIG. 9K wherein NOR-gates 989A and 989B are used in place of inverters for gating the reference signals under control of an enable signal. For example, the reference signals may be disabled during the recirculation mode and enabled during the input mode controlled with mode flip-flop MI (FIG. 9K) by disabling NOR-gates 989A and 989B during the recirculation mode with the true RECIRC signal and correspondingly enabling NOR-gates 989A and 989B during the input mode with the false RECIRC signal. Many other embodiments related thereto will now become obvious to those skilled in the art from the teachings herein.

The arrangement shown in FIG. 9K may be used to illustrate both reference signal insertion embodiments; the first embodiment being where reference signals are inserted for input and for recirculation and the second embodiment being where reference signals are inserted for input but not for recirculation. For the first embodiment where reference signals are inserted for input and for recirculation; AND-gate 987 is disabled with signals 990A and 990B as shown in FIG. 9K and NOR-gates 989A and 989B are not disabled with the RECIRC signal such as by connecting the upper signal line of each of NOR-gates 989A and 989B to ground. For the second embodiment where reference signals are inserted for input but not for recirculation; AND-gate 987 is not disabled with signals 990A and 990B such as by leaving the lower two signal lines of AND-gate 987 open or by connecting the lower two signal lines of AND-gate 987 to a "one", high, or true voltage level and NOR-gates 989A and 989B are disabled with the RECIRC signal such as by connecting the upper signal line of NOR-gates 989A and 989B to the RECIRC signal.

In the second reference signal insertion embodiment shown in FIG. 9K, reference signals are not multiplexed into CCD memory 932 for each recirculation to permit the effects of refreshing with refresh circuit 996 to accumulate in the reference signals in addition to the stored data signals such as permitting bias and scale factor error components to build up over many refresh recirculations. In this second embodiment, reference signals may be multiplexed into CCD memory 932 when analog input data AI is loaded into CCD memory 932 in response to the input mode signal INPUT but not when signals are being recirculated to CCD memory 932 from refresh circuit 996 as signal 960 in response to the recirculation mode signal RECIRC to gate 987 for controlling switch 947. In this second embodiment, the input mode may enable selection of switches 992A and 992B and the recirculation mode may disable selection of switches 992A and 992B. This may be accomplished by using a well-known two-input NOR-gate in place of inverter 989 (FIG. 9F) enabled with recirculation mode signal RECIRC (which is the same as the complement of the input mode signal $\overline{\text{INPUT}}$) to enable decoder signal 990A to NOR-gate 989A and decoder signal 990B to NOR-gate 989B for enabling switches 992A and 992B respectively; but only when the recirculation mode signal RECIRC is false as indicative of the input mode signal INPUT being true. Therefore, the reference signals will be multiplexed into CCD memory 932 while analog input signal AI is being multiplexed into CCD memory 932 and the reference signals will be preserved in whatever degraded form may occur during recirculation of reference, bias, and data signals through CCD memory 932 and refresh circuit 996. Other arrangements for conditionally multiplexing reference signals into CCD memory 932 will now become obvious to those skilled in the art from the teachings herein.

An arrangement will be discussed hereinafter in the context of the first reference signal insertion embodiment for adaptively using reference signals to control scale factor and bias of the refresh circuitry 996. Clock pulses 943 will herein be assumed to be from a free-running clock for simplicity of discussion, where memory 932 is continually clocked to load either recirculation signal 960, analog input signal AI, scale factor reference signal REF, or bias reference signal GND under control of logical signals 948, 967, 968A, and 968B respectively from gates 987, 988, 989A and 989B respectively. Clock signal 943 may clock a counter 993 to provide a count that is indicative of the number of clock pulses received and therefore the position of the information shifted into memory 932. For example, counter 993 provides operation similar to the bit, word, and sector counters associated with well-known prior art disk memories which are used for counting disk memory clock pulses to keep track of the location of information on a rotating disk. Counter output signals 994 are provided to decoder 995 generating decoder output signals 990A and 990B in response to particular codes of counter signals 994 from counter 993. Well-known decoders such as the Texas Instruments S/N 7445 decoder provides a high signal output when the input code is not true and provides a low signal output when the input signal code is true. Therefore, when counter 993 increments through a selected code, decoder 995 may provide a low output for either signal 990A or signal 990B which may enable either switch 992A or 992B respectively through NOR-gates 989A or 989B respectively which may disable switches 947 and 991 through gates 987 and 988 respectively to load a scale factor reference signal REF or a bias reference signal GND respectively into memory 932 through switch 992A or switch 992B respectively as signal 949. In one embodiment, the selected code in counter 993 lasts for one period of clock signal 943, where the next clock pulse increments counter 993 to a different code condition. Therefore, decoder output signal 990A or 990B may have a single clock pulse width and scale factor reference signal REF or bias reference signal GND loaded into memory 932 may each be loaded into a single-bit position.

Decoder 995 generates signals 990A and 990B in mutually exclusive form; wherein if one of these two signals is selected, the other of these signals is non-selected. For example, when gate 989B is enabled with signal 990B to select switch 992B, then gate 989A is disabled to non-select switch 992A and, conversely, when gate 989A is enabled with signal 990A to select switch 992A, then gate 989B is disabled to non-select switch 992B. Further, when either of signals 990A and 990B select the reference and bias signals respectively, signals 990A and 990B automatically disable gates 987 and 988 to non-select the analog input signal AI and to non-select the recirculation signal 960 through switches 991 and 947 respectively.

Mode selection may be performed with a mode flip-flop M1 for selecting a recirculation mode with the $\overline{Q}$ signal RECIRC or for selecting an input mode with the Q signal INPUT. The state of the mode flip-flop M1 may be controlled with well-known logic arrangements such as toggling a S/N 7473 J-K flip-flop or loading a mode condition into a S/N 7474 D flip-flop. The recirculation mode is commanded when the M1 flip-flop generates a high recirculation mode signal RECIRC thereby enabling gate 987, where recirculation control signal 948 becomes high for the period of time decoder signals 990A and 990B are both high. Recirculation control signal 948 controls recirculation switch 947 to be conductive for the period of time decoder signals 990A and 990B are both high to conduct recirculation signal 960 to the input of CCD memory 932 as signal 949. Similarly, the input mode is commanded when the M1 flip-flop generates a high input mode signal INPUT, thereby enabling gate 988, where input control signal 967 becomes high for the period of time that decoder signals 990A and 990B are both high. Input control signal 967 controls input switch 991 to be conductive for the period of time decoder signals 990A and 990B are both high to conduct input signal AI to the input of CCD memory 932 as signal 949. Mode command signals RECIRC and INPUT are mutually exclusive, where only one of these mode command signals may be high at a time, which is characteristic of flip-flop Q and $\overline{Q}$ output signals. Therfore, either the recirculation switch 947 will be conductive as enabled by recirculation control signal 948 being high, or the input switch 991 will be conductive as enabled by input control signal 967 being high, or neither recirculation switch 947 nor input switch 991 will be conductive as disabled by one of the signals 990A or 990B being low.

Decoder signals 990A and 990B are both high for the data load portion of a memory cycle and alternately become low for a reference load portion of a memory cycle as will be discussed with reference to FIG. 9L. A memory cycle will be defined as a storage sequence of a combination of data and reference signals. In a simplified example used herein, a memory cycle may be the number of clock pulses required to shift a stored signal from the input of memory 932 to the output of memory 932. For example, a memory having a 512 data-bit capacity and a two reference-bit capacity may have a memory cycle of 514 clock pulses. Therefore, the decoder signals 990A and 990B will be high for the 512 data-bit portion of the memory cycle and will go low in sequence, one and only one at a time, for the two reference-bit portion of the memory cycle. When decoder signals 990A or 990B are high, gates 989A and 989B will be disabled and gates 987 and 988 will be enabled; where data will be recirculated through switch 947 or data will be input through switch 991 under control of mode signals RECIRC or INPUT. When one of the decoder signals 990A or 990B goes low, the related NOR-gates 989A or 989B respectively will be enabled, the non-related NOR-gates 989A or 989B will be disabled, and gates 987 and 988 will be disabled independently of the state of mode signals RECIRC and INPUT. NOR-gates 989A and 989B will invert a low decoder signal 990A and 990B respectively to produce a high reference control signal 968A and 968B respectively to make reference switches 992A and 992B respectively conductive, which results in a scale factor reference signal REF and a bias reference signal GND respectively being input to memory 932 as signal 949 where scale factor reference signal REF will be input through switch 992A and bias reference signal GND will be input through switch 992B.

Reference signals can be introduced into selected bit positions of memory 932 with counter 993, decoder 995, and input circuitry 908. Scale factor reference signal REF and bias reference signal GND may be precise amplitude signals, wherein the precision of the amplitude may be preserved with good quality electronic switches 992A and 992B or other switches which are well known in the art, wherein a precision reference amplitude signal input to CCD memory 932 through switches 992A and 992B as signals 949 may be stored in selected bit positions. The reference signal bits may be shifted through memory 932 under control of clock signal 943 and shifted out of memory 932 as output signal 936 to refresh circuitry 996. The reference signals may be degraded as they are shifted through memory 932, consistent with the charge transfer inefficiency, thermal bias, and other error mechanisms of the CCD-type memory devices. Reference signals stored in and shifted through memory 932 may be degraded by substantially the same amount as other signals stored in and shifted through memory 932. Because the reference signals were initially stored in memory 932 as precise signal amplitudes, the amplitude of a reference signal when shifted out of memory 932 is indicative of the degradation through memory 932. Therefore, the reference signals output from memory 932 may be used to control the refresh circuitry to provide an adaptive control for amplitude reconstruction. Adaptive control is herein intended to mean control that is adjusted to the actual conditions, where refresh circuitry 996 operating under control of a degraded reference signal may be used to control refresh operations as a function of actual degradation of the signal and may therefore be used over a range of degradation varables such as over a temperature range, over a clock pulse frequency range, and over variations between different CCD memory devices and may further be used to adaptively compensate for other variations such as charge leakage, aging of CCD memory elements, and other such effects.

In a simplified embodiment, it may be assumed that counter 993 contains a number of counts equal to the number of bits in memory 932 and that particular count codes, which may be the first and second count codes for the present simplified example, are detected with decoder 995 to generate decoder signals 990A and 990B. For the first and second counts of each memory shifting sequence (decoder outputs 0 and 1 respectively), the output signals 990A and 990B respectively of decoder 995 will go low thereby commanding loading of the scale factor reference signal REF and the bias reference signal GND respectively into memory 932 as discussed above and simultaneously enabling refresh circuitry 996 with decoder signals 990A and 990B respectively to sample or otherwise monitor a signal being shifted out of memory 932; wherein the synchronization counter 993 provides another frame, or initialization point, or start of the shift operation with a reference signal being loaded into memory 932 and the last prior corresponding reference signal being simultaneously available as the output signal 936 of memory 932. Therefore, decoder 995 may enable loading of a new reference signal into memory 932 and may also enable sampling of the corresponding degrading reference signal as signal 936 output from memory 932 with refresh circuitry 996.

In a simplified example, it will be assumed that memory 932 has a four-bit storage capacity and that counter 993 is a two-bit counter for a four-count operation, known as a modulo-3 counter. This example will now be discussed with reference to the waveforms shown in FIG. 9L. Clock signal 943 is represented as a sequence of clock pulses. Signals 990A and 990B are shown as squarewave signals, where each one is low for each corresponding fourth-bit time, which is consistent with decoder 995 decoding the output of a two-bit four-state counter 993. Data signals 949 is shown in digital squarewave form for convenience but may also be implemented as analog amplitude signals. Data waveform 949 is shifted into memory 932 and similarly is shifted out of memory 932 as signal 936 after a four-bit time shaft delay. Therefore, signals 949 and 936 are substantially the same signal except that signal 936 has been delayed by four-bit pulse periods and has been degraded by the shifting operations through memory 932. It will further be assumed for this example that recirculation control signal RECIRC is high and the input control signal INPUT is false. Therefore, three data-bits will be recirculated during the high period of decoder sgnals 990A and 990B and one of each of the reference bits will be loaded during the low period of the related decoder signals 990A and 990B. As shown in FIG. 9L, data signals (shown as a "1" and a "0" following the reference signal R) will be recirculated as signal 960 through switch 947 under control of decoder signals 990A and 990B and mode signal RECIRC. Therefore, when one of the decoder signals 990A or 990B goes low, gate 987 will cause control signal 948 to go low thereby making switch 947 non-conductive and disabling recorculation signal 960. Further, when one of the decoder signals 990A or 990B goes low, the corresponding NOR-gate 989A or 989B respectively will cause the related control signal 968A or 968B respectively to go high thereby enabling the corresponding reference signal REF or GND respectively to load a precision voltage into the CCD memory, shown in FIG. 9L as signal R or as signal B respectively in waveform 949. Similarly, when decoder signals 990A and 990B go high, recirculation signals 960 will be enabled with gate 987 and switch 947 and reference signals REF and GND will be disabled with gates 989A and 989B respectively and switches 992A and 992B respectively, thereby permitting the two data-bits shown as a "10" code to be recirculated as signal 960 into memory 932 as signal 949. Therefore, as counter 993 increments from a count of 0 to a count of 3, decoder 995 enables the reference signal REF to be loaded into memory 932 at the count of 0, enables the reference signal GND to be loaded into memory 939 at the count of 1, and enables the digital data in memory 932 (consisting of a "10" sequence) to be recirculated and loaded into memory 932 at the counts of 2 and 3. Refresh circuitry 996 monitors the reference signals shifted out of memory 932 as signal 936, identified by low decoder output signals 990A and 990B to refresh circuitry 996; where refresh circuitry 996 will adaptively reestablish the amplitude and bias levels of the data in response to the reference signal, as described in detail hereinafter.

The information stored in CCD memory 932 will now be discussed in greater detail with reference to FIG. 9L for a 2-bit 4-state counter. The first state of counter 993 decoded with decoder 995 selects "zero" output signal 990B of decoder 995 to multiplex bias signal B in waveform 949 into CCD memory 932. The second state of counter 993 decoded with decoder 995 selects "one" output signal 990A of decoder 995 to multiplex scale factor bias signal R in waveform 949 into CCD memory 932. The last two states of counter 993 are decoded with decoder 995 to select the "two" and "three" output signals of decoder 995; thereby disabling signals 990A and 990B for disabling gates 989A and 989B and for enabling gates 987 and 988. If for example gate 987 is selected with flip-flop M1 to recirculate signal 960 through switch 947; recirculated signal 960 (consisting of a "one" state followed by a "zero" state as shown in waveform 949 in FIG. 9L) is multiplexed into CCD memory 932 following sequential B and R reference signals.

In view of the above, a four-bit CCD memory 932 continually recirculates and refreshes signals with refresh circuit 996; comprising a bias reference signal B, a scale factor reference signal R, and a one-zero sequence of data signals (waveform 949) as shown in FIG. 9L). Each recirculation selects reference bias signal GND with switch 992B in response to selected decoder signal 990B; followed by selection of scale factor reference signal REF with switch 992A in response to selected decoder signal 990A; and followed by one-zero sequence of data signals through recirculation switch 947 or input switch 991 in response to non-selected signals 990A and 990B and selected mode signal RECIRC.

Refreshing of signal 936 with refresh circuit 996 may be performed with a single refresh circuit, as discussed with reference to FIGS. 9H-9J above, or may be performed with a plurality of refresh circuits, as discussed with reference to FIGS. 9K-9T hereinafter. For example, a scale factor refresh circuit and a bias refresh circuit may be combined to compensate for both scale factor and bias errors using the arrangement discussed with reference to FIG. 9K. This plurality of refresh circuits may be arranged in various combinations. In one embodiment, bias compensation may be provided before scale factor compensation wherein scale factor compensation is applied to a bias compensated signal, as discussed with reference to FIGS. 9M-9O hereinafter. In another embodiment, scale factor compensation may be provided before bias compensation wherein bias compensation is applied to a scale factor compensated signal, as discussed with reference to FIGS. 9P and 9Q hereinafter. In still another embodiment, it may be desirable to apply both bias and scale factor compensation to an uncompensated signal for a parallel rather than a sequential refresh arrangement, as discussed with reference to FIGS. 9R-9T hereinafter. These alternative sequential and parallel refresh arrangements are presented to illustrate the broader teachings of the present invention related to refreshing of signals with a plurality of refresh circuits connected in sequential and parallel arrangements and exemplified by scale factor and bias refresh circuits.

A bias refresh circuit will not be discussed with reference to FIGS. 9M-9O. Decoder signal 990B (FIG. 9M) is related to the bias reference signal from CCD memory 932 as memory output signal 936. Decoder signal 990B controls sampling of bias reference signal 936 with sample and hold circuit 961B. Sampled bias signal 962B is provided to differential amplifier 977 through input resistor R2 to be differentially compared with memory output signal 936 through input resistor R1 to generate differentially refreshed output signal 978 having reduced bias errors. Bias refreshed signal 978 may then be input to a scale factor refresh circuit (FIG. 9N or FIG. 9O).

Figure 9M:
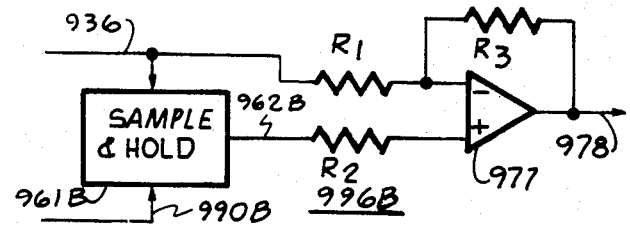
FIG. 9M illustrates a bias refresh circuit.
Figure 9N:
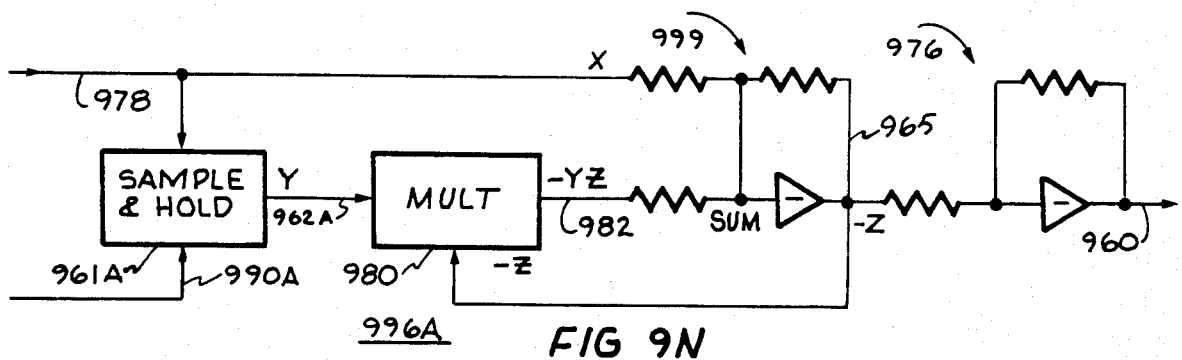
FIG. 9N illustrates a refresh circuitry having an analog implicit servo.

In FIG. 9N, bias refreshed signal 978 may be sampled with sample and hold circuit 961A in response to decoder signal 990A to sample the scale factor reference signal from CCD memory 932 after the scale factor reference signal has been bias compensated with the circuits shown in FIG. 9M. The bias compensated scale factor signal is stored in sample and hold circuit 961A as signal 962A. Bias compensated scale factor reference signal 962A is input to an implicit servo comprising multiplier 980 and operational amplifier 999 to generate bias and scale factor refreshed signals 965 and 960, having first been bias compensated with the circuit of FIG. 9M and then scale factor compensated with the explicit servo of FIG. 9N. The operation of the scale factor compensation arrangement shown in FIG. 9N has been discussed in detail with reference to FIG. 9I above.

Figure 9O:
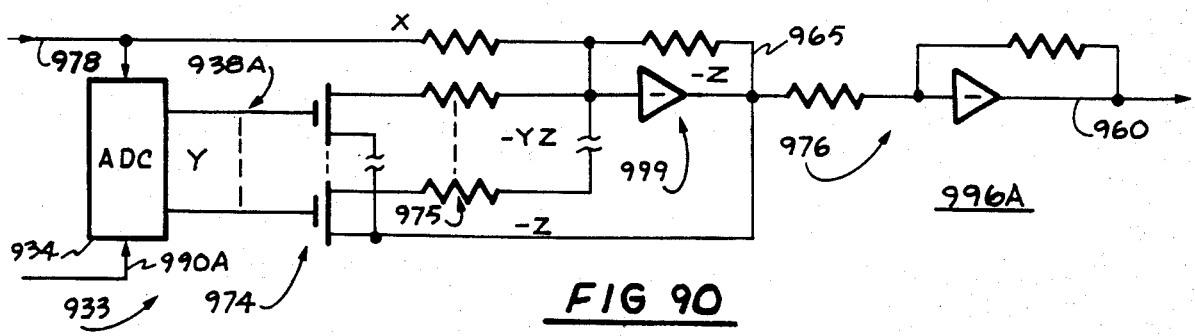
FIG. 9O illustrates a hybrid refresh circuit having a hybrid implicit servo.

In FIG. 9O, bias compensated signal 978 is converted to a digital number 938A with converter 934 in response to the scale factor related decoder signal 990A. Therefore, digital number 938A is related to the scale factor reference signal that has been bias compensated with the circuit shown in FIG. 9M. Operation of the circuit shown in FIG. 9O has been discussed in detail with reference to FIG. 9J above, where the primary difference is that the scale factor signal sampled in response to scale factor decoder signal 990A has already been bias compensated with the circuit discussed with reference to FIG. 9M; thereby providing output signals 965 and 960 having both bias and scale factor compensation.

Figure 9P:
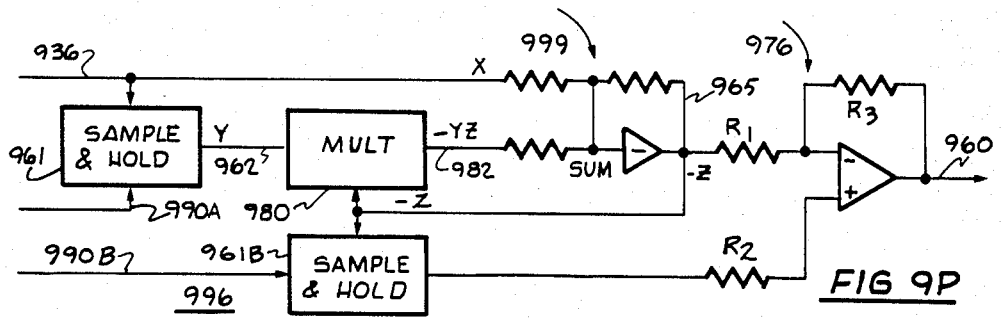
FIG. 9P illustrates an analog scale factor refresh implicit servo in combination with a bias refresh circuit.
Figure 9Q:
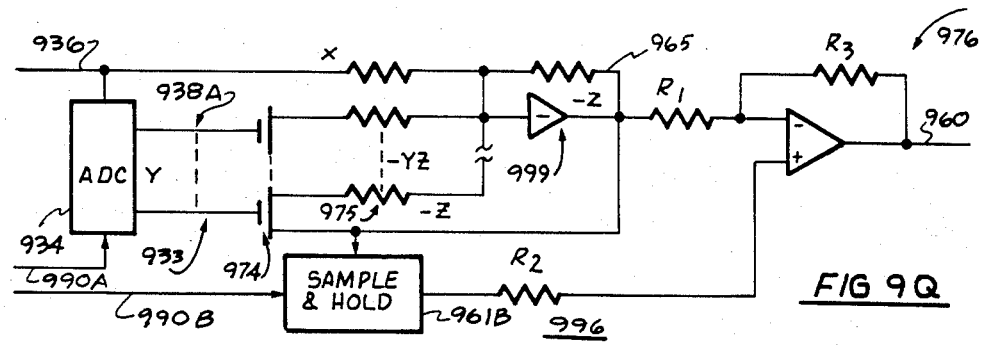
FIG. 9Q illustrates a hybrid scale factor refresh implicit servo in combination with a bias refresh circuit.

The circuits shown in FIGS. 9P and 9Q provide first for compensating memory output signal 936 for scale factor errors and then for bias compensating the scale factor compensated signal to provide a scale factor and bias compensated output signal 960. The scale factor compensation arrangements of FIGS. 9P and 9Q are implemented as an analog implicit servo (FIG. 9P) and a hybrid implicit servo (FIG. 9Q); discussed above with reference to FIGS. 9I and 9J respectively. In this multiple refresh embodiment, scale factor refreshed signal 965 (FIGS. 9P and 9Q) is sampled in response to decoder bias signal 990B with sample and hold circuit 961B to sample the bias reference signal from CCD memory 932 after it has been scale factor compensated. The scale factor compensated bias signal 965 is stored in sample and hold circuit 961B and is applied to differential amplifier 976 through input resistor R2 to be differentially summed with the scale factor compensated but non-bias compensated signal 965 which is applied to differential amplifier 976 through input resistor R1. Output signal is both scale factor compensated and bias compensated, where the stored bias reference signal has been scale factor compensated prior to being stored and subtracted from the scale factor compensated memory signal 965.

Figure 9R:
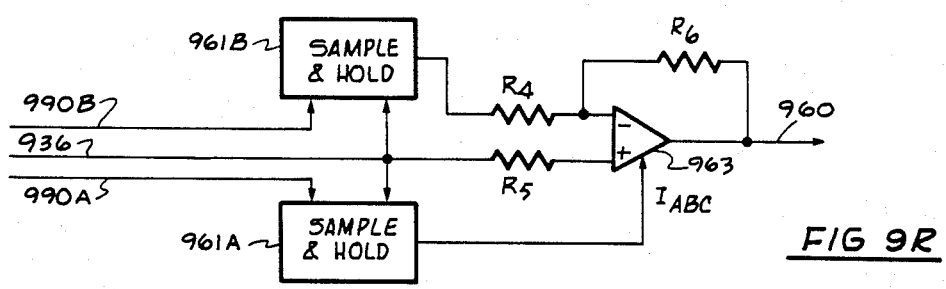
FIG. 9R illustrates combined scale factor and bias refresh circuits in parallel form.

The circuit shown in FIG. 9R provides an arrangement for compensating stored signals in parallel form, without first scale factor compensating the bias compensation signal and without first bias compensating the scale factor compensation signal. Sample and hold circuit 961B samples the bias reference signal 936 from CCD memory 932 in response to decoder bias signal 990B to generate the bias reference signal through resistor R4 to amplifier 963. Similarly, sample and hold circuit 961A samples the scale factor reference signal 936 from CCD memory 932 in response to decoder scale factor signal 990A to generate the scale factor reference signal to the IABC input of operational amplifier 963. Operational amplifier 963 may be the well-known RCA transconductance amplifier 963 discussed with reference to FIG. 9H above, wherein the bias reference signal through resistor R4 and the uncompensated data signal 936 from CCD memory 932 through resistor R5 are differentially subtracted with amplifier 963 and wherein the scale factor reference signal from sample and hold 961A to the IABC input of amplifier 963 provides a multiplication or scale factor related correction. Therefore, output signal 960 is bias compensated through the differential input circuitry of amplifier 963 and is scale factor compensated with the IABC product input of amplifier 963. One difference of the arrangement of FIG. 9R over the arrangements of FIGS. 9K-9Q is that the bias compensation signal from sample and hold circuit 961B and the scale factor signal from sample and hold circuit 961A (FIG. 9R) may not have been previously compensated, wherein the bias compensation signal has not been previously scale factor compensated and the scale factor compensation signal has not been previously bias compensated.

Figure 9S:
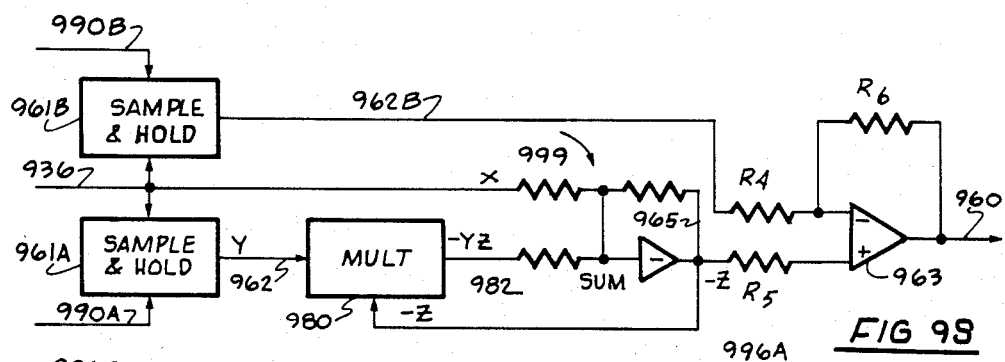
Figure 9T:
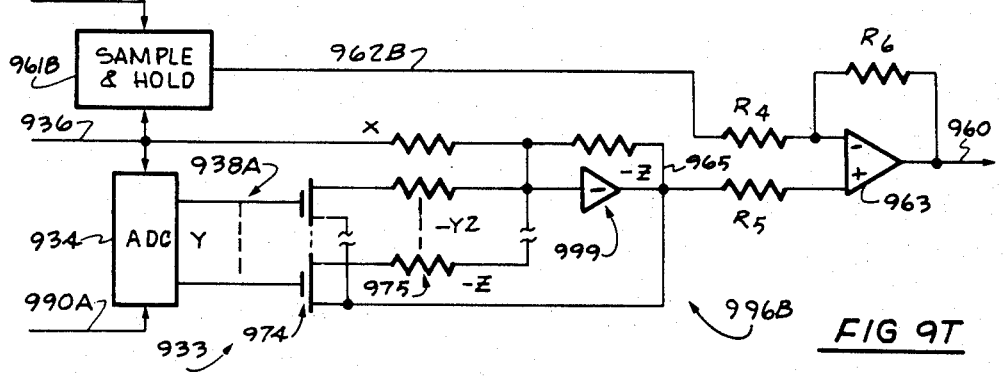

The compensation arrangement shown in FIGS. 9S and 9T conceptually similar to the arrangement discussed above with reference to FIG. 9R, wherein the bias reference signal has not been first scale factor compensated and the scale factor reference signal has not been first bias compensated; wherein compensation of the data signals are provided with both the uncompensated scale factor reference signal and the uncompensated bias reference signal. Two alternate scale factor compensation channels 996A and 996B are shown as alternatives in FIGS. 9S and 9T, where only one of these channels would usually be used in a system. The primary difference between channels 996A and 996B is that channel 996A uses an analog implicit servo and channel 996B uses a hybrid implicit servo, as discussed in detail above with reference to FIGS. 9I and 9J.

Sample and hold circuit 961B samples CCD memory output signal 936 in response to decoder bias signal 990B to generate an uncompensated bias reference signal 962B to differential amplifier 963. Implicit servo circuits 996A and 996B (FIGS. 9S and 9T respectively) are discussed in detail above with reference to FIGS. 9I and 9J respectively. These implicit servo circuits provide scale factor compensated signal 962B in differential amplifier 963 to generate compensated signal 960; which is then both scale factor compensated and bias compensated. Scale factor compensation is implemented with the implicit servo multiplying by the reciprocal of the scale factor reference signal and then being bias compensated by subtracting the bias compensation signal 962B with differential amplifier 963. FIGS. 9K-9S generally represent modified versions of FIGS. 9F-9J which have been discussed in detail above. For example, FIG. 9K is similar to FIG. 9F, FIG. 9L is similar to FIG. 9G, FIG. 9M is similar to FIG. 9H, FIG. 9N is similar to FIG. 9I, FIG. 9O is similar to FIG. 9J, FIG. 9P is similar to FIG. 9I, FIG. 9Q is similar to FIG. 9J, FIG. 9R is similar to FIG. 9H, and FIGS. 9S and 9T are similar to FIGS. 9H-9J; wherein the above discussions relative to FIGS. 9F-9J provide a basis for the discussion of FIGS. 9K-9T. Therefore, the discussions for FIGS. 9K-9T are directed primarily to the differences of FIGS. 9K-9T relative to FIGS.

9F-9J; wherein the similarities have already been described above with reference to FIGS. 9F-9J.

For the examples provided herein, a scale factor correction may be considered to be a multiplicative correction and a bias correction may be considered to be an additive or differential correction. Alternately, a bias term may be considered to be a zero order term and a scale factor term may be considered to be a first order term, wherein a bias correction may be a fixed correction independent of signal amplitude and wherein a scale factor correction may be a correction that is a function of the magnitude of the signal.

The discussions of bias (zero order) and scale factor (first order) refreshing is exemplary of other error correction methods that may be other than scale factor and bias corrections such as a second order correction or other higher order correction which will now become obvious to those skilled in the art from the teachings of the present invention. Further, the various refresh arrangements may be combined to compensate for a combination of error mechanisms, implementable from the teachings of the above disclosure. This combination of error correction arrangements is exemplified herein with separate and then with combination arrangements of scale factor and bias refresh.

Devices shown in FIGS. 9F et seq are well known in the art. For example, counter 993 may be a Texas Instruments (TI) counter S/N 7493, decoder 995 may be a TI decoder S/N 7441 S/N 7449, inverter 989 may be a TI inverter S/N 7404 and AND-gates 987 and 988 may be TI gates S/N 7408. Switches 947, 991, and 992 may be any well known switches and, in a preferred embodiment, may be electronic switches implemented with field effect transistors (FETs). CCD memory 932 may be a well known CCD memory shift register device. Sample-and-hold circuit 961 is well known in the prior art, wherein one prior art sample-and-hold circuit is manufactured by Datel Systems Inc. as Model SHM-3. Analog multipliers are well known in the art and may be implemented with any well known analog multiplier such as with a RCA model CA3080 transconductance amplifier connected as an analog multiplier. One form of analog multiplier is shown in block diagram form as multiplier 980. A RCA CA3080 transconductance amplifier form of multiplier is shown as device 963. These two forms are exemplary of the present invention which may be implemented with other well known forms of analog multipliers. Converters such as ADC 934 and multiplying DAC 934 are well known in the art, wherein commercial ADC and multiplying DAC devices are exemplified by Datel Systems Inc. devices model ADC 89 series and model DAC-HI 12B respectively. Operational amplifiers for summing and buffering operations are well known in the prior art such as the Fairchild $\mu$A709 and $\mu$A741 operational amplifiers which may be arranged with input and feedback resistors as shown with circuit 999 and 976.

The arrangements discussed with reference to the figures are presented in a simplified form to better exemplify the present invention although many other arrangements may be utilized which will now become obvious to those skilled in the prior art. For example, refresh circuitry 996 may be implemented with a well known automatic gain control (AGC) circuitry. An AGC circuit may operate from the reference signal 962 that is sampled in response to decoder signal 990 as described above. In an alternate embodiment which finds primary advantage in a digital memory arrangement, refresh circuitry 996 may integrate the signals from CCD memory 932 to provide a gain control signal related to the average of the information stored in memory 932. Information in memory 932 may include control signals to equalize the number "1" and "0" counts being loaded into memory 932 so that the integral of the output signals 936 will have an average value of zero and will have an amplitude related to the degraded signal amplitude. Further, for a digital memory arrangement, refresh circuitry 996 may merely sample digital one-bits shifted out of CCD memory 932, being indicative of signal degradation without the use of the reference signal discussed above.

In an alternate embodiment the amplitudes of the input signals 949 to memory 932 may be adjusted in relation to the degradation through memory 932 to normalize output signals 936 in contrast to the arrangement described above wherein refresh circuitry 996 re-establishes the amplitude of output signals for input of a normalized signal to memory 932 as signal 949.

Input circuitry; consisting of logic gates such as gates 987-989 and analog switches such as switches 947, 991, and 992; may be considered to be a multiplexer because this circuitry combines or multiplexes a plurality of analog signals (particularly data signal 960 or AI with a reference signal). Further, refresh circuitry 996 may be considered to be a demultiplexer because this circuitry separates or demultiplexes a plurality of analog signals (particularly the reference signal which is separated with sample-and-hold 961 from the memory output signal).

It can be seen that CCD memory 932 are electronic devices that may be shifted or not shifted under control of gated clock pulses 943 from control logic 937. Therefore, control of CCD memory may permit outputting of information on line 936 and inputting of information on line 949 while clocking CCD memory 932 or while holding the state of CCD memory 932 stationery by disabling clock 943. This is a significant advantage over the well known rotating memories such as disc memories, where a disc memory is continually rotating and may not be conveniently stopped due to the inertia of the memory and other such considerations. Therefore, a CCD memory that may be stopped under control of electronic signals will provide greater versatility in accessing and loading information and generally in operation of the memory device.

Although the present memory arrangement may be described with respect to a CCD memory and signal processing arrangement, it is intended that the inventive features described herein be applicable to signal processing and memory arrangements in general and not be limited to CCD arrangements. For example, an adaptive refresh arrangement described herein is equally applicable to other memory arrangements such as a magnetostrictive delay line memory and an LC delay line memory.

The CCD arrangements discussed with reference to FIG. 9C et seq are described for embodiments wherein signals are stored in analog signal form having analog resolution. It will now become apparent to those skilled in the art that these arrangements may also be used to store digital information such as in single-bit form. For example, ADC 934 may be a single-bit ADC such as a threshold detector. In one embodiment, a well known Schmidt trigger threshold detector may be used as a one-bit ADC 934 to detect whether the output information 936 is above or below a threshold, indicative of a binary one or a binary zero condition. If above the threshold, Schmidt trigger ADC 934 may restore the amplitude to an upper amplitude magnitude and, if below a threshold, Schmidt trigger ADC 934 may restore the signal to a lower amplitude magnitude. As described with reference to FIGS. 9C and 9D above, ADC 934 would restore the input signal 949 to an amplitude that may permit degradation through CCD memory 932 without traversing the higher level threshold, detected with ADC 934. This arrangement can be described with reference to FIG. 9D, where amplitude 956 may be defined as the high level threshold of Schmidt ADC 934, where an input signal 936 to ADC 934 above amplitude 956 such as amplitude 951 may be detected as a high level signal and may be restored to a high level recirculation amplitude 952. Shifting through CCD memory 932 would degrade amplitude 952 to amplitude level 953 which is still greater than the minimum high level amplitude 956; where ADC 934 may restore amplitude 953 to the high level recirculation amplitude 954. The system may have a characteristic where the difference between input threshold 956 and recirculation amplitude 955 is greater than the degradation of signal 949 when shifted through CCD memory 932, where this degradation may be the difference in amplitude between points 952 and 953 which is less than the difference in amplitude 955 (952) and 956. Input signals 936 to ADC 934 which are below threshold 956 may be circulated as low level magnitudes.

Degradation of low level amplitudes may be of only secondary consideration because degradation of amplitudes through CCD memory 932 may tend to reduce the amplitude of the signal, thereby minimizing the detrimental effect on low level amplitudes. According to this consideration, it may be desirable to provide a high level amplitude for a first binary state and a low level amplitude for a second binary state, where the low level amplitude may be closer to zero voltage than to a high level negative amplitude. For example, representation of two binary states with a high level positive amplitude and a low level amplitude or a high level negative amplitude and a low level amplitude are preferred over an arrangement with representation of two binary states with a high level positive amplitude and a high level negative amplitude; where degradation of high level negative signals may be comparable to degradation of high level positive signals and where degradation of low level positive or negative signals may be minimized.

Now, an example will be provided to illustrate this degradation consideration. A binary signal will be assumed representing a one-state whenever the signal amplitude is greater than a threshold amplitude 956 and a zero-state whenever the signal amplitude is less than a threshold amplitude 956. Threshold signal amplitude 956 is assumed to be three-volts, degraded signal amplitude 951 and 953 is assumed to be four-volts, restored one-level signal amplitude 952 and 954 are assumed to be five-volts, and restored zero-level signal amplitude (not shown) is assumed to be zero-volts. As restored signal 952 is shifted through CCD memory 932, the signal is shown being degraded from a five-volt amplitude 952 to a four-volt amplitude 953, but four-volts is greater than the three-volt threshold of Schmidt trigger 934. Therefore, the four-volt input signal 936 will be restored to an equivalent five-volt output signal 938A at amplitude 954. As a zero-level signal is shifted through CCD memory 932, the signal will be reduced in amplitude toward zero-volts (if it is not already at zero-volts) and will, therefore, not be degraded toward the threshold amplitude 956.

In another embodiment, the threshold signal is assumed to be zero-volts, the restored binary one signal is assumed to be plus three-volts, the restored binary zero signal is assumed to be minus three-volts, and signal degradation is assumed to be from the plus-voltage level and from the minus-voltage level toward the zero-voltage threshold level. Therefore, both the binary one and the binary zero voltage levels will degrade toward the threshold level. Therefore, this embodiment may be less desirable than the embodiment of the above example where only the binary one voltage level will degrade toward the threshold voltage level.

In still a further embodiment of the hybrid memory arrangement of the present invention, a ternary memory may be provided with a three-state ADC 934, where the recirculation line 938A from ADC 934 may have three-states including a positive-amplitude, a zero-amplitude, or a negative-amplitude. ADC 934 may be implemented with a pair of Schmidt triggers, where a positive Schmidt trigger may generate a high level amplitude or low level amplitude in response to a high level or a low level positive amplitude of input signal 936 and a negative Schmidt trigger may generate a high level amplitude or a low level amplitude in response to a high level or low negative amplitude of input signal 936. Therefore, if input signal 936 had a high level positive amplitude, the positive Schmidt trigger would be in the positive high level state and the negative Schmidt trigger would be in the low level state; if input signal 936 had a low level amplitude, both positive and negative Schmidt triggers would be in the low level state; and if input signal 936 had a negative high level amplitude, the positive Schmidt trigger would be in the low level state and the negative Schmidt trigger would be in the negative high level state. Summing of Schmidt trigger outputs would provide a high level output if the positive Schmidt trigger was in the high level state, a negative output if the negative Schmidt trigger was in the negative high level state, and low level output if both Schmidt triggers were in the low level state. It should be noted that when one of the Schmidt triggers is in a high level state, the other Schmidt trigger is in the low level state consistent with ternary signal forms and with the binary nature of Schmidt trigger threshold detectors.

CCD Compositor FIG. 9E

Compositors are well known in the geophysical art. One well known prior art compositor is implemented in the CAFDRS system sold by United Geophysical Corporation, an affiliate of Bendix Corporation located in Pasadena, Calif. which is implemented with a General Automation Corp SPC-16 computer. Another well known compositor is the trace compositor, model 1011 manufactured by Scientific Data Systems of Santa Monica, Calif. and described in Technical Manual SDA 98 02 62A dated November 1967. Such compositors accept input waveforms from geophone transducers and store the sampled waveforms in memory, where corresponding samples of each sequential waveform are added together. The sampling and adding of input waveform samples to previously sampled and added corresponding waveform samples is known as compositing. Compositing effectively sums or integrates corresponding samples in the temporal or time-domain to reduce the signal-to-noise ratio.

An improved compositor arrangement is shown in FIG. 9E using a CCD memory arrangement. CCD compositor 903 is shown for a single transducer input waveform. In a preferred embodiment, a plurality of compositor channels may be provided wherein one compositor channel per transducer may be used to composite each transducer input waveform known as a trace.

In reference to FIG. 9E, input transducer 911 generates transducer signal 913 which is preprocessed with buffer amplifier 983. Transducer signal from buffer amplifier 983 is input to CCD memory 932 through summing resistor 984. As data in CCD memory is shifted with clock pulses 943, input signal 986 is shifted into and stored in CCD memory 932. Control signal 972 enables control 937 to generate clock pulses 943 for the period of a trace, where control signal 972 enables the shifting of CCD memory 932 at the start of an input trace from transducer 911 and control signal 972 disables the shifting of CCD memory 932 at the completion of the input trace from transducer 911. The first trace may be loaded into CCD memory 932, where the recirculation path 960 is disabled by making FET switch 947 non-conductive with control signal 948, which is indicative of the first trace to be loaded into CCD memory 932. Opening of the recirculation path 960 insures that the first trace will be loaded into CCD memory 932 and that prior contents of the CCD memory will not carry-over to the new composited information. For subsequent traces following the first trace, control signal 948 controls FET 947 to be conductive to provide a recirculation path for the composited information in CCD memory 932 to be recirculated and added to the input trace through summing resistor 985 to summing point 968, where the input trace signal will be added at summing point 986 through input summing resistor 984. Therefore, when a trace subsequent to the first trace is sensed by transducer 911, this new input trace will be summed with the recirculated composited information 960 and then shifted into CCD memory 932. Therefore, CCD memory provides the operation of storing the composited information and summing resistors 984 and 985 provide the operation of adding the input information to the stored information.

The information stored in CCD memory 932 may be analog samples, wherein the shift clock 943 effectively samples a portion of input signal 913 by inputting to CCD memory on input signal line 986, then shifting under control of clock 943.

Input control signal 972 to control logic 937 may be related to the ensonifying signal such as a well known chirp signal, where the system generates a control signal to the transmitter which may be a well known VIBROSEIS device for ensonifying an underground environment. Control signal line 972 may be derived from the ensonifying signal to start the sampling and compositing of input signal 913 with CCD memory 932. Control 937 may include a timer such as a well known counter to provide clock pulses 943 for a fixed period of time starting with the transmitter command signal 145 input to control 937 as signal 972.

One distinction of the CCD compositor of the present invention is that the signals are added in the analog domain and are stored as analog signals in contrast to digital domain summing and storage in prior art systems. Another distinction is that a separate compositor channel may be used for each input channel rather than using the prior art time-shared adder and disc memory storage.

Additional distinctions and advantages may be obtained by using the hybrid memory teachings of the present invention discussed with reference to FIGS. 9C and 9D in conjunction with the compositor discussed with reference to FIG. 9E. In this arrangement, analog trace signals may be provided as analog input signal 944 to be added with recirculated signal 979 at summing point 949. Alternately, input signals may be digitized with a well known ADC and may be input as signals 938C to logic 940 which may be well known adding logic to add input signals 938C to recirculated signal 938A to provide the summed digital signal 938B for storage in CCD memory 932.

Another feature of the present invention provides for summing of analog signals which are input to a CCD. Such analog summing is exemplified with summing resistors 984 and 985 to summing junction 986 shown in FIG. 9E. Similarly, CCD input signals 919 (FIG. 9A) may be summed or otherwise combined with other analog signals. Further, input signal 944 and recirculation signal 936 from hybrid memory arrangement 902 shown in FIG. 9C may be summed as input signal 949 if recirculation control signal 948 makes recirculation FET 947 conductive at the same time that input control signal 946 makes input FET 945 conductive. In one embodiment, summing may be performed with summing resistors as is well known in the art such as with summing resistors 984 and 985 to summing junction 986 as shown in FIG. 9E. For simplicity, summing resistors may not be shown such as for recirculation signal 936 and input signal 944 to summing junction 949. Still further, other analog summing arrangements are well known in the art.

In CCD compositor arrangement 903, an arrangement may be used to reduce signal degradation, as discussed with reference to FIGS. 9C et seq. Further, recirculation signal 960 may be scaled to the proper amplitude such as with well known scaling techniques using ADC 934 or, alternately, by adjusting summing resistors 984 and 985.

CCD Correlator

A CCD correlator may be provided in accordance with the present invention using CCD memory and analog signal processing techniques. This CCD correlator will now be discussed relative to FIGS. 4, 6, 7, and 9 of copending application Ser. No. 550,231.

One embodiment of a CCD correlator will now be discussed with reference to FIG. 4. Loading of a pilot signal into register 412 and loading of a trace signal into register 417 have been described for single-bit digital signal samples with reference to FIG. 4 above. If registers 412 and 417 are CCD registers, then analog signal samples may be stored therein. For a CCD correlator embodiment, pilot signal samples may be processed with amplifier 410 and trace signal samples may be processed with amplifier 415 which may be $\mu A709$ operational amplifiers. Gates 411 and 416 have been discussed above as digital gates for a digital embodiment but may be analog gates such as FET analog switches in an analog embodiment. Pilot signal samples may be loaded into CCD register 412 in analog signal form with a LOAD P signal in the zero-state inverted with inverter 414 for selecting input pilot signal from amplifier 410 with FET switch gate 411 for loading into register 412. Similarly, the LOAD P signal in the zero-state may be inverted with inverter 418 to select input trace signal from amplifier 415 with analog gate 416 for loading into CCD register 417 as analog trace signal samples. When the LOAD P signal and LOAD T signal go to the one-state, input pilot and trace signals from amplifiers 410 and 415 respectively are disabled with inverters 414 and 418 respectively and recirculation signals are enabled. Pilot sample register 412 may have an extra CCD shift register stage 413 for providing an extra one-bit time delay for recirculation through analog selection gate 411 and trace signal samples from CCD register 417 may be recirculated back to the input of CCD register 417 through analog selection gate 416.

Analog switches 411 and 416 may be field effect transistor (FET) switches with the outputs connected together either directly or with resistors for summing or conducting the selected signal from the selected FET switch to the input of CCD registers 412 and 417. Selection of the FET switches for conduction or for non-conduction may be provided with the LOAD P and LOAD T signals for gates 411 and 416 respectively. Therefore, analog signal gates may be provided for selection operations similar to the digital signal gates discussed above.

Product circuit 419 has been discussed as an exclusive-OR circuit for generating a single-bit product signal 424 in response to single-bit output signals from registers 412 and 417 for a digital single-bit embodiment. In the instant CCD embodiment, product circuit 419 may be any well known analog multiplier circuit such as discussed in detail for multiplier 778 (FIG. 7E).

Counter 429 and register 421 may be replaced by a CCD register for shifting analog product samples 424 as a CCD shift register for storage and for adding new correlated output signal samples to prior correlated output signal samples for compositing-after-correlation in the same form discussed for CCD compositor 903 (FIG. 9E).

In an alternate embodiment, one of the input signals may be stored as single-bit digital signal samples and the other input signal may be stored as analog signal samples. For example, pilot signal logic comprising squaring amplifier 410, inverter 414, gate 411, register 412, and flip-flop 413 may be single-bit digital logic elements as discussed above for the single-bit digital embodiment and operational amplifier 415, inverter 418, analog gates 416, and CCD memory 417 may be analog sample elements as discussed for the CCD correlator embodiment immediately above. Multiplier 419 may be implemented to multiply a single-bit digital sample and an analog sample such as a FET switch for conducting an analog signal sample from CCD register 417 in response to a one-state of the digital bit from register 412 and for non-conducting an analog signal sample from register 417 in response to a zero-state digital bit from register 412. Therefore, product signal 424 may be equal to the analog signal from CCD register 417 when the digital signal from register 412 is in the one-state and product signal 424 may be a zero signal when the signal from register 412 is in the zero-state. CCD register or compositor comprising stages 420-421 may load or sum analog signal samples generated as signal 424 into register stages 420-421 for storage and for compositing operations. Therefore, a single-bit sample and an analog sample product arrangement may be implemented using the combination of techniques discussed for the single-bit digital embodiment and for the CCD analog embodiment above.

The arrangement discussed herein with reference to FIGS. 9F-9J may be used for preserving the precision of analog signal samples stored in CCD memories such as registers 412, 417, and 420-421. Therefore, input logic to registers 412, 417, and 420-421 may include a multiplexer for multiplexing an analog reference signal with the input signal samples and the output of these registers may contain refresh circuitry operating in response to the analog reference signal sample.

In an alternate embodiment, the correlation processing may be performed in parallel word form as will be described hereinafter for a single-bit digital pilot signal and an analog trace signal. A plurality of digital pilot signal bits from register 412 may each be used to select or non-select a corresponding FET multiplier switch such as indicated by multiplier 419 to control the updating of a plurality of analog output signal sample bits stored in register stages 420-421 in response to a single analog sample from register 417. Alternately, a single output digital sample from register 412 may control a plurality of multiplier gates 419 to either select or non-select updating of a plurality of output signal samples in register stages 420-421 in response to a plurality of analog signal samples from register 417. Therefore, although the arrangement shown in FIG. 4 has been discussed for a serial arrangement wherein a plurality of serial words in register 412 and 417 may be processed with a single multiplier circuit 419 in sequential or serial form to update a plurality of output signal samples shifted between stages 420-421 in sequential serial form; the communication paths shown in FIG. 4 may also represent parallel signal communication paths or may represent combinations of serial and parallel communication paths. Further, sets of parallel processors such as parallel multipliers 419 may be provided for processing parallel signals in parallel signal paths.

The arrangement discussed with reference to FIG. 6D may also be implemented with a CCD register embodiment. For example, trace signal T may be processed with an operational amplifier 623 to provide input signal samples $T_L$. Sample device 624 may be a well known sample-and-hold circuit as discussed with reference to sample-and-hold 777 (FIG. 7E). Alternately, sample circuit 624 may be eliminated. P-ROM 625 may store single-bit digital signal samples for gating trace signal sample $T_L$ in response to a one-state pilot signal sample and for not gating trace signal sample $T_L$ in response to a zero-state pilot signal sample from P-ROM 625. Product circuit 626 may be a single FET switch as discussed with reference to FIG. 4 above for either gating or not gating the input analog trace signal samples to be summed into the output signal sample memory. Z-RAM 614 and Z-counter 613 may be replaced with a CCD memory for storing analog signal samples from product circuit 626 as discussed for a CCD embodiment with reference to FIG. 4 above and as discussed for compositor 903 with reference to FIG. 9E above. Digital detector circuits 643 and 645 have been discussed as digital detectors with reference to FIG. 6D. Alternately, detectors 643 and 645 may be implemented as analog detectors such as Schmidt triggers or other analog threshold detectors for an analog output signal sample embodiment. Control circuitry including compositor control 632, one-shot 651, counters 616-619, decoder 622, and decoder 628 which have been discussed above for a digital embodiment but may also be used in conjunction with the analog or hybrid CCD memory embodiment.

A hybrid correlator embodiment has been discussed above with reference to FIGS. 4 and 6D, wherein the term hybrid correlator is herein intended to mean a correlator that provides correlation between a first signal having a plurality of digital signal samples and a second signal having a plurality of analog signal samples processed with a hybrid multiplier such as multiplier 419 (FIG. 4) and multiplier 626 (FIG. 6D). In the hybrid embodiments discussed above, the digital signal samples were assumed to be pilot signal samples and the analog signal samples were assumed to be trace signal samples. Alternately, the digital signal samples may be trace signal samples and the analog signal samples may be the pilot signal samples. For simplicity of discussion, the digital signal samples have assumed to be single-bit digital signal samples and hybrid multiplier 419 (FIG. 4) and 626 (FIG. 6) has been assumed to be single-bit hybrid multipliers such as a single FET switch. In an alternate embodiment, the digital signal samples may be multi-bit digital signal samples such as 4-bit digital signal samples and hybrid multiplier 419 (FIG. 4) and 626 (FIG. 6) may be a multipling digital-to-analog (DAC) converter such as multiplying DAC 933 (FIG. 9J) or may be other well known multiplying DAC circuits.

For the CCD correlator arrangement discussed with reference to FIG. 6D, the Z-store may be a CCD shift register being shifted under control of clock $\overline{C2}$ as gated by composite signal $\overline{COM}$ and correlate enable signal Lm through OR-gate 629. Although Z-store has been discussed for a Z-RAM 614 with reference to FIG. 6D, replacement of Z-RAM 614 with a CCD shift register under control of the clock signal from gate 629 permits use of a CCD memory in the arrangement shown in FIG. 6D. Further, Z-counter 613 may be eliminated, wherein output signals $Z_K$ from a CCD Z-store may be recirculated and summed with analog product signal from analog multiplier 626 and analog gate 627. In this CCD compositor embodiment, CCD shift registers are not random access devices and therefore cannot be instantaneously synchronized with an input sync signal to gate 638. Therefore, it may be desirable to discontinue recirculation of the CCD shift register after completion of compositing and correlation operations under control of the Lm and $\overline{COM}$ signals to OR-gate 629. Therefore, Z-store implemented with a CCD shift register may be maintained in a static state except when compositing and correlating. As is well known in the art, a shift register such as a CCD shift register is a sequential access device under control of a clock signal, wherein accessing may not be performed in response to an address on a random access basis as discussed for Z-RAM 614 operating in response to K-addresses from K-counter 619. Therefore, K-counter 619 may not be required for accessing the Z-store but may be used primarily for initiating another load of J-counter 627 with the Jo-parameter and K-counter 619 with a zero-state or other initial condition with signal Km through NOR gate 621.

Alternate Memory Arrangements

For convenience of discussion, the hybrid memory arrangement of the present invention has been discussed in a preferred embodiment of a CCD memory arrangement. Such a hybrid memory arrangement may be applied to other memory systems such as bubble memory systems, magnetic memory systems, etc. Such other applications will now be exemplified with a discussion of a bubble memory system. Information in bubble memory systems is typically conveyed in digital form by the presence or the absence of a bubble, by a large bubble or a small bubble, or by positive-domain magnetization or negative-domain magnetization. In accordance with other features of the present invention, an analog bubble memory arrangement, a hybrid bubble memory arrangement, and an adaptive memory arrangement are provided using the techniques discussed for CCD memories with reference to FIG. 9.

The hybrid memory arrangement discussed for CCD memories with reference to FIG. 9 may also be used for the bubble memory arrangement or other memory arrangements of the present invention. For example, an analog bubble memory may be used in a digital system wherein the input signals may be digital signals that are converted to analog bubble form and the output signals may be analog bubble signals that are converted to digital signal form.

In an analog bubble memory arrangement, the analog information may be contained in the size of the bubbles or in other forms. For example, a bubble having a controlled size may be formed by applying analog techniques to well-known digital bubble formation arrangements. In one embodiment, a bubble may be formed with a bubble generator by stretching a seed bubble through attraction to an adjacent propogation structure pattern wherein field strength, field rotation, rate, and/or other such parameters permit control of bubble size or other bubble characteristics in a variable or analog form. Therefore, bubbles may be formed having analog characteristics such as bubble sizes that are related to the control of the bubble generation mechanization.

An analog output circuit may be any known output circuit adapted for analog signal processing. Typical digital bubble memory output circuits such as a pickup coil, a Hall effect generator, an optical detector, or a magneto-resistive detector which are used for digital bubble sensing in prior art systems may also be used for analog bubble sensing because the magnitude of the analog bubble parameter is proportional to the magnitude of the analog bubble parameter; i.e., the signal induced in an output sensing coil is proportional to the bubble size.

The adaptive refresh arrangement and other refresh arrangement discussed for CCD memories with reference to FIG. 9 may also be used for a bubble memory arrangement and for other memory arrangements, either analog or digital. For example, a reference signal may be multiplexed into an analog bubble memory together with data signals. The reference signal, when output from the bubble memory, may be used to compensate for errors in the data signals output from the bubble memory as discussed for the CCD memory adaptive refresh arrangement.

Similarly, other memory arrangements that are considered by the prior art to be digital memories can be used as analog memories. For example, magnetic disk, drum, and tape memories are used in the prior art as digital memories by storing digital one and zero signals, but such magnetic memories can also store analog signals such as with tape recorders storing sound information for high fidelity systems. Therefore, information can be stored in analog signal form in such magnetic memory devices; wherein the hybrid arrangement, adaptive compensation arrangement, and other features of the present invention exemplified with CCD memories can be used for such magnetic memories. For example, digital information can be stored in analog signal form on magnetic disk, drum, and tape memories; wherein the stored analog information can be output as digital information in accordance with the hybrid memory feature of the present invention. Further, reference signals can be stored in magnetic disk, drum, and tape memories for adaptively compensating for memory errors in accordance with the adaptive compensation feature of the present invention.

Still further, other types of memories such as magnetostrictive memories, core memories, optical memories, and other memories can store information in analog signal form in accordance with the analog memory arrangement of the present invention, can receive digital information and generate digital output information while storing information in analog signal form in accordance with the hybrid memory feature of the present invention, and can store reference signals for compensation of memory errors in accordance with the adaptive compensation feature of the present invention.

Memory Access Arrangement

An improved memory access arrangement 1000 will now be discussed relative to FIGS. 10A and 10B. In prior art systems exemplified by the Intel 2416 CCD serial memory described in the Intel Data Catalog 1977, serial memories are implemented as parallel combinations of multiple serial memories to enhance access time. For example, the 16,384-bit Intel 2146 memory is configured in the form of 64 independent recirculating shift registers of 256 bits each to achieve a 100-microsecond access time. Each 256-bit shift register has a separate refresh circuit in the Intel 2416 memory. Further, the Intel 2416 memory is a digital memory, wherein digital refresh is a simple operation and does not involve analog refresh complexities. In accordance with the improved memory access arrangement of the present invention, access time is significantly improved with only a minor increase in refresh circuit complexity. For example, in the Intel 2416 memory, increasing access time by 64 times requires approximately 64 times increase in refresh circuit complexity. In the memory arrangement of the present invention, increasing access time by 64 times would only double refresh circuit complexity for a 32 times improvement over the Intel 2416 memory approach. Further, use of the hybrid memory feature of the present invention provides a significant improvement in memory capacity such as a factor of five times improvement for a five-bit (one part in 32) resolution analog storage capability. Although the improved memory access arrangement of the present invention will be discussed herein for a hybrid memory having analog refresh, it will now become obvious that this improved access arrangement is also applicable to digital memories having digital refresh, analog memories having analog refresh, etc.

Arrangement 1000 (FIG. 10A) is illustrative of general accessing arrangements and is discussed for simplicity in the embodiment of accessing intermediate portions for a long serial CCD memory. To exemplify the improved accessing technique of the present invention; a plurality of CCD memory segments 932A, 932B, 932C, etc are connected in serial form as a long shift register for refreshing with refresh circuit 996C and for recirculating to multiplexer 908 as recirculation signal 960A. Such an arrangement has been discussed with reference to FIGS. 9F–9T; where multiplexer 908, refresh circuitry 996C, and CCd elements 932A, etc correspond to multiplexer 908, refresh circuitry 996, and CCD element 932 and related elements discussed with reference to FIGS. 9F–9T. For example, multiplexer 908 can include multiplexing of recirculation signal 960, analog input signal AI, and various reference signals. Further, CCD elements 932A, etc can correspond to CCD memory element 932 either as a single CCD element, or as a plurality of interconnected CCD elements, or other forms thereof. Yet further, refresh element 996C can be any refresh element and in a preferred embodiment may be the refresh elements discussed with reference to FIGS. 9F–9T. Thereore, the memory arrangement exemplified with elements 908, 932A to 932C, and 996C represents an arrangement that has been discussed in detail with reference to FIGS. 9F–9T except that the CCD memory in FIG. 10 is provided in segmented form, which can be implemented from the teachings herein.

For the improved access feature of the present invention, fast access capability is provided with a reduced number of refresh circuits, where the number of refresh circuits can be determined by the access requirements. For example, access can be improved by a factor of 1024 times with the addition of only a second refresh circuit. For that example, the arrangement shown in FIG. 10A can be configured having 1024 different memory channels such as channels 932A, etc; wherein the 1024 channel signals 1014 are processed with channel multiplexer 1012 to select the particular one of 1024 channels for processing with fast access refresh circuit 996D. Therefore, a particular channel out of 1024 channels can be selected with multiplexer 1012 for refreshing with a single refresh arrangement 996D to output a fast access refreshed signal 960B while all memory information is preserved by refreshing with refresh arrangement 996C and recirculating as refresh signal 960A to multiplexer 908.

An intermediate access arrangement is exemplified with channel multiplexer 1012 and refresh circuit 996D. Channel multiplexer 1012 receives a plurality of intermediate memory signals 1014 from intermediate memory elements such as signals 1014A from channel 932A, signal 1014B from channel 932B, and signal 1014C from channel 932C. The plurality of intermediate memory signals 1014 are multiplexed together or selected with multiplexer 1012 in response to address 1021 to provide the selected memory signal 1013 to output refresh circuit 996D to generate a refreshed output signal 960B. Channel multiplexer 1012 will be discussed in detail with reference to FIG. 10B herein and refresh arrangement 996D has been discussed in detail with reference to FIGS. 9F–9T as refresh arrangement 996 and related designations.

Channel multiplexer 1012 may be a well-known digital multiplexer such as an SN74150 multiplexer for a digital memory embodiment or may be a well-known analog multiplexer such as a DDC series 1506 analog multiplexer for an analog memory embodiment. Multiplexer 1012 will now be discussed in a preferred embodiment with reference to FIG. 10B. A plurality of channel signals 1014 can be processed with isolation and buffer amplifiers 1015 and selected with switches 1016 to provide selected channel signal 1013 to refresh circuit 996D for refreshing thereof. Buffer amplifiers 1015 can be any well-known buffer amplifier such as well-known operational amplifiers designated $\mu$A709 and $\mu$A741, or can be a transconductance operational amplifier such as discussed for amplifier 963 (FIG. 9H), or can be any other known arrangement. Switches 1016 can be any multiplexing, switching, or selection arrangement such as FET switches, relay switches, ILC Data Device Corp series 1506 multiplexer, or any other switching arrangement. One multiplexing arrangement using FETs for multiplexing analog signals has been described for multiplexer 908 (FIGS. 9F and 9K). The multiplexed signal from switches 1016 can be output directly as signal 1013 or can be loaded into buffer register 1026 for temporary storage. In a digital memory embodiment, buffer register 1026 can be a serial-in serial-out register such as an SN7491 register or can be a serial-in parallel-out register such as an SN74164 register. In an analog memory embodiment, buffer register 1026 can be a well-known sample-and-hold circuit or can be an analog register such as a serial-in serial-out register or a serial-in parallel-out register such as implemented with well-known analog CCD register technology.

A channel selection addressing structure can be implemented with address register 1020 and address decoder 1022 in forms known in the art. For example, a channel address may be provided as digital signals 1021 for temporary storage in buffer register 1020. Stored signals 1023 can be processed with decoder 1022 to generate decoded signals 1025 to control switches 1016. For a 1024-segment memory embodiment, address 1021 and 1023 can be a 10-bit word that is decoded to select one of 1024 decode signals 1025 to select one of 1024 multiplexing switches 1016.

In view of the above, an arrangement is provided having a pair of refresh circuits shared between a plurality of channels, wherein a first refresh circuit is used for refreshing all stored information and a second refresh circuit is used for refreshing information from a selected channel to be output from the memory system. Such an arrangement provides significant advantages over prior art systems such as for rapid access in combination with efficient circuitry. The arrangement in FIGS. 10A and 10B represents a preferred embodiment. Other embodiments will now become obvious from the teachings herein such as using a single refresh circuit, using more than two refresh circuits, using parallel memory channels, using combined serial and parallel memory channels, using other types of memories, etc. Also, a plurality of multi-channel serial memories can be implemented in parallel, wherein the particular channel of the particular memory can be selected with a multiplexer to generate rapid access refreshed output signals.

Arrangement 1000 (FIG. 10A) can be considered analogous to a track or channel arrangement of a rotating memory; each channel output signal 1014A, etc can be considered analogous to a different read head for a different track; multiplexer 1012 can be considered analogous to read head multiplexers in prior art rotating memories; etc. Alternately, arrangement 1000 can be considered analogous to prior art multiple head-per-track rotating memory arrangements. In this alternate analogy each memory element 932A, etc can be considered analogous to a read head sector; each channel output signal 1014A, etc can be considered analogous to a sector-related read head; multiplexer 1012 can be considered analogous to prior art read head multiplexing arrangements; etc.

A multiple-channel memory 932A, etc can be implemented as a tapped shift register arrangement which can be implemented by cascading shift registers 932A, etc.

Although the access arrangement of the present invention has been discussed with reference to FIG. 10A in the embodiment of a hybrid CCD memory; this arrangement is also applicable to other memory arrangements. For example, memory accessing arrangement 1000 can be used for analog, digital and/or hybrid memories can be used for analog or bubble memories, magnetostrictive memories, magnetic rotating memories, and other serial memories in addition to hybrid CCD serial memories. Further, memory accessing arrangement 1000 can be used for other memory arrangements such as parallel memory arrangements with adaptations to the arrangements shown in FIGS. 10A and 10B which will now become obvious from the teachings herein.

Because many error mechanisms are time related such as thermally generated leakage, shifting operations such as recirculation may be implemented as relatively high-speed operations. Also, because access time is related to shift rate, shifting operations such as recirculation may be implemented as relatively high-speed operations. Alternately, output operations such as for A/D conversion in a hybrid memory embodiment, or interfacing to a slower speed serial data channel, etc may require a lower output rate. For example, in the hybrid memory embodiment, refresh and recirculation may be relatively higher speed operations while A/C conversion may be a relatively lower speed operation. Therefore, refresh and/or recirculation may be performed at higher speed and A/D conversion may be performed at lower speed. A temporary storage device such as an output register or a sample-and-hold circuit may be used for temporary storage of analog signal samples which are shifted out of memory at higher speed so that the output operation can be performed at lower speed. In one embodiment, refresh circuit 996D can include a sample-and-hold circuit and/or an A/D converter circuit such as sample-and-hold circuit 625 (FIG. 6A), 652 (FIG. 6C), 961 (FIGS. 9H and 9I), 961B (FIGS. 9M, 9Q, 9R, 9S, and 9T), and 961A (FIGS. 9N and 9S) and such as A/D converter circuit 934 (FIGS. 9C, 9J, 9O, 9Q, and 9T). Alternately, refresh circuit 996D can include a buffer register such as CCD register 932A for being loaded at a higher shift rate consistent with the shift rate of recirculation signal 960A and for being converted or otherwise processed at a lower shift rate consistent with the shift rate of output signal 960B.

A control arrangement for rapid access memory 1000 may be implemented in many different forms. In one arrangement, the memory may be clocked at the desired output clock rate and the selected channel 1013 may be directly output through channel multiplexer 1012 as signal 1013. In an alternate embodiment, the memory may be clocked at a high clock rate greater than (or less than) the output clock rate. In this embodiment, the output data may be loaded into buffer resister 1026 at the higher (or lower) recirculation clock rate and then output from buffer register 1026 at the lower (or greater) output clock rate. In still another embodiment, buffer register 1026 may be a well-known serial-in parallel-out register where the data to be output may be loaded into buffer register 1026 in serial form and may be output from buffer register 1026 in parallel form. Yet other output embodiments will now become obvious from the teachings herein.

In one rapid access embodiment, an address counter and address register arrangement may be used such as the arrangement shown in FIG. 6A and described relative thereto, wherein the arrangement shown in FIG. 10A may be used in place of the analog ROM arrangement shown in FIG. 6A comprising elements 172, 174, 175, 179, 182, 192, 104R, and 625. Address counter 316 can be used to keep track of the location of the data in a serial shift register. Address register 624 can be used to store a desired address which may be the start address of a desired block of data to be accessed. Comparison logic 617 compares counter address 613 with register address 612, where a coincidence of addresses such as identified by coincidence signal A=B can initiate transfer of a block of data as it is shifted past the serial register output port. The address words can have a block or channel address, being the most significant part of the address word, and a bit or byte address, being the least significant part of the address word. Multiple-channel arrangement 1000 can be accessed where the bit or byte address in address counter 316 is used to identify the start of a block of data and the block or channel address in address counter 316 is used to identify the channel output which is sensing that block of data at that time. Subtraction logic can be used to subtract the block address in address counter 316 from the block address in address register 624 to generate a difference address. In this embodiment, a subtraction circuit such as an SN74181 circuit may be used in place of or in addition to comparitor 617 to perform the subtraction function. The difference address can be used to select the output channel with multiplexer 1012, where the accessed channel is the desired channel address in the address register offset by the shifted position of the data in the memory as determined by the channel address in the address counter.

Adaptive Hybrid Communication Link

The adaptive refresh and/or hybrid arrangement disclosed in the embodiment of a CCD memory may also be used to enhance communication systems with adaptive precision and with hybrid increased capacity. Further, the adaptive illumination source control arrangement of the referenced patents can be used in combination with the adaptive refresh and hybrid data processing arrangements of the present invention to provide a compound adaptive control arrangement for a hybrid optical communication arrangement such as a laser or fiber optic communication arrangement. The combination of adaptive source control, adaptive refresh, and hybrid signal processing represents a preferred embodiment although adaptive source control and adaptive refresh can be used together without hybrid communication, or adaptive refresh and hybrid communication can be used together without adaptive source control, or other combinations thereof can be used together.

The broad inventive feature of an adaptive arrangement has herein been exemplified with a hybrid adaptive memory arrangement and in particular a hybrid storage and adaptive refresh CCD memory arrangement. The general applicability of this inventive feature is further exemplified with a hybrid and adaptive communication link wherein digital, hybrid, and/or analog information can be communicated and can be adaptively processed. For example, reference and calibration signals can be communicated with the information signals over a communication link to a remote location, wherein the reference and calibration signals can be used to adaptively compensate the information signals. One embodiment of a communication link will now be discussed for a fiber optic communication link, wherein it is intended that this fiber optic communication link be exemplary of other communication links such as a transmission line communication link, a radio communication link, a microwave communication link, a laser communication link, and other communication links and further exemplary of other systems in addition to the memory systems and communication systems discussed herein.

A hybrid and adaptive communication arrangement will now be discussed in the embodiment of a fiber optic communication arrangement with reference to FIGS. 9F-9T. In FIGS. 9F and 9K, a well-known fiber optic communication link can be used in place of CCD memory 932. Input information 949 controls a fiber optic modulator such as a light emitting diode (LED) or injection laser diode for transmitting light signals along the fiber optic communication link 932. Output signals 936 are generated with a fiber optic demodulator such as a photocell.

The adaptively refreshed hybrid fiber optic communication link is herein exemplified with the adaptively refreshed hybrid CCD memory arrangement of FIGS. 9F and 9K, wherein substitution of a well-known fiber optic communication system (including electrical-to-light and light-to-electrical interfaces) for CCD memory 932 will now become obvious to one skilled in the art from the teachings herein. For example, analog data signals and analog reference signals can be multiplexed into communication link 932 as multiplexed signal 949 using FET switches 991, 992, and 947 (FIG. 9F) and FET switches 991, 992A, 992B, and 947 (FIG. 9K). Multiplexed signal 949 is communicated over fiber optic link 932 with well-known fiber optic communication equipment. Refresh circuit 996 adaptively compensates signal 936 from communication link 932 in response to the reference signals such as discussed in the embodiment of a CCD memory arrangement with reference to FIG. 9 herein.

With the substitution of a communication link for CCD memory 932 in FIGS. 9F and 9K, all of the discussions provided herein for the embodiment of a CCD memory arrangement are now directly applicable to the communication link arrangement of the instant feature of the present invention. For example, scale factor compensation discussed with reference to FIGS. 9H-9J and 9M-9T herein; bias compensation discussed with reference to FIGS. 9M-9T herein; waveform discussions with reference to FIGS. 9G and 9L herein; and other discussions related thereto apply to the communication link embodiment of the present invention and to other uses of the adaptive compensation arrangement of the present invention. Further, several of the referenced patent applications are related to illumination control, fiber optic communication, and communication links, where the adaptive communication link feature of the present invention is directly applicable thereto.

Although fiber optic communication links and other communication links are typically digital in nature, such communication links can be considered to be either analog or digital or hybrid in accordance with the features of the present invention as exemplified herein with a CCD memory arrangement.

The referenced illumination control patent applications provide adaptive source control and the arrangement of the present invention provides adaptive refresh control, wherein these two forms of adaptive control are compatible and can be used in combination to provide still further advantages. This dual adaptive control capability is generally applicable to multitudes of systems and will be described herein for the specific embodiment of a fiber optic control system to exemplify the features of this dual adaptive control arrangement.

In an adaptive source control arrangement, feedback is provided around the illumination source to linearize or otherwise compensate for illumination characteristics prior to transmission. In an adaptive refresh control arrangement, illumination is transmitted having compensation signals transmitted therewith for adaptively compensating received transmitted signals at the destination. For example, in FIG. 10 of U.S. Pat. No. 3,986,022, illumination source 100 is controlled with a feedback arrangement through elements 1014, 1016, 134, 120, 234, and 1018 to adaptively control source 100. Similarly, adaptively controlled illumination 108 can be transmitted on a fiber optic communication link. Command device 127 can be an analog command device or a digital command device and can have reference signals multiplexed therewith such as discussed with reference to multiplexer 908 of FIGS. 9F and 9K herein. Fiber optic communication link 932 can output optical communication signals as electrical signal 936 such as by providing the optical-to-electrical conversion with a photocell receiver as is well known in the fiber optic art. Output electrical signals 936 are processed with refresh circuit 996, as disclosed in the embodiment of a CCD memory arrangement herein.

Adaptive source compensation is further discussed in referenced U.S. Pat. No. 3,818,496. Source 48 generates adaptively controlled illumination which may be communicated on a fiber optic communication link, exemplified with optics 70 and 71. Sensor 56 senses illumination from source 48 and generates feedback signals 57 for comparison with command signal 55 to control source 48 using comparitor 54 through power amplifier 60. Command means 80, which may be a computer 84, generates command signals 26 which may include reference compensation signals for refresh compensation for transmission by modulating source 48 to illuminate the optical communication arrangement.

In view of the above, adaptive source compensation can be used in combination with adaptive refresh compensation to provide precision signals such as for a fiber optic communication arrangement. Further, hybrid signal processing can be used in combination with adaptive source compensation and/or adaptive refresh compensation to enhance capacity in addition to precision. Yet further, either hybrid signal processing, or adaptive source compensation, or adaptive refresh compensation can be used separately or in various other combinations thereof, or in various combinations of the features disclosed herein, disclosed in the referenced applications and patents, and/or known in the art. For example, analog signal communication can be provided over a fiber optic communication link, either with or without adaptive refresh, either with or without adaptive source control, either with A/D and/or D/A converters for a hybrid communication link or without A/D and D/A converters for an analog communication link, etc.

It should be noted that, for an adaptive and/or hybrid communication link; an adaptive source control arrangement can be located at the source side of the communication link and an adaptive refresh arrangement can be located at the destination side of the communication link remote from the source.

References

Technology associated with implementation of the system of the present invention is well known in the art such as with circuit design, logical design, and monolithic design. Further, prior art systems provide background for the system of the present invention. Still further, issued patents define well-known methods and arrangements. References are provided herein to prior art documents, systems, and patents; wherein the documents listed herein and documents listed therein describe the state of the art.

Documents on circuit design include:
1. METHODS FOR SOLVING ENGINEERING PROBLEMS USING ANALOG COMPUTERS by Levine for McGraw Hill (1964);
2. ANALOG COMPUTERS by Korn and Korn; and
3. JUNCTION TRANSISTOR ELECTRONICS by Hurley for John Wiley & Sons (1958).

Docments on logical design include:
1. DIGITAL COMPUTER DESIGN FUNDAMENTALS by Chu for McGraw Hill (1962);
2. DIGITAL COMPUTER DESIGN by Braun for Academic Press (1963);
3. THE TTL DATA BOOK by Texas Instruments Inc (1973); and
4. DATA CATALOG 1977 by Intel Corp (1977).

Documents on CCDs include:
1. CHARGE-COUPLED DEVICES AND APPLICATIONS by Carnes and Kosonocky for Solid State Engineering Magazine (April 1974);
2. CHARGE-COUPLED SEMICONDUCTOR DEVICES by Boyle and Smith for the Bell System Technical Journal (1970); and
3. EXPERIMENTAL VERIFICATION OF THE CHARGE COUPLED DEVICE CONCEPT by Amelio for the Bell System Technical Journal (April 1970).

Documents on filtering include:
1. A CURRENT DISTRIBUTION FOR BROADSIDE ARRAYS WHICH OPTIMIZES THE RELATIONSHIP BETWEEN BEAM WIDTH AND SIDE-LOBE LEVEL by Dolph in the Proceedings of the IRE On Waves And Electronics (June 1946) and
2. THEORY AND APPLICATION OF DIGITAL SIGNAL PROCESSING by Rabiner and Gold for Prentice-Hall (1975).

Documents on programming include:
1. PROGRAMMING: AN INTRODUCTION TO COMPUTER LANGUAGES AND TECHNIQUES by Maurer for Holden Day Inc (1968);
2. PROGRAMMING FOR DIGITAL COMPUTERS by Jeenel for McGraw Hill (1959); and
3. ELEMENTS OF COMPUTER PROGRAMMING by Swallow and Price for Holt, Rinehart, and Winston (1965).

General Considerations

The system of the present invention is intended to be generally applicable to the fields of signal processing, data processing, and filtering. Although the present system may be described with a preferred embodiment such as a correlator digital filter in a geophysical application, descriptions are intended to be merely exemplary of the broad scope of the present invention. For example, the correlator processor is intended to generally exemplify digital filters or signal processing arrangements having broad scope. The geophysical application is intended to exemplify a broad range of signal processing and data processing applications including radar, underwater acoustics, medical diagnostics, equipment diagnostics, and a broad range of other applications. The discussions relative to a correlator data processor are intended to exemplify generalized data processing arrangements including a convolution processor, a deconvolution processor, and a Fourier transform processor.

A signal compensation arrangement using a reference signal has been described with reference to FIG. 9 in the embodiment of a memory system. It is herein intended that this memory system be exemplary of general signal compensation arrangements such as for telemetry systems, data acquisition systems, signal processing systems, and servo systems.

Memory and signal processing arrangements have herein been described in the embodiment of CCD arrangements. It is herein intended that these CCD arrangements be exemplary of general componentry such as bipolar, MOS, etc; various structures such as monolithic and discrete structures; and general technologies such as electronic, magnetostrictive, sonic, surface acoustic wave (SAW), magnetic, etc. For example, magnetic tape and disk, magnetostrictive, SAW, and other memory technologies conventionally store digital bits but can also store analog samples. Therefore, these conventional digital memory devices may be used as analog or hybrid memory devices in accordance with the teachings of the present invention as described for the preferred embodiment of a CCD analog or hybrid memory.

Refresh arrangements have been described in the embodiment of a memory system. It is herein intended that this refresh arrangement be exemplary of general signal processing arrangements.

A memory refresh arrangement has been described with a separate analog reference arrangement such as with the signals REF and GND (FIG. 9). Alternately, reference signals may be input as digital signals together with data signals 938C to logic 940 to generate input signals 938B to DAC 933 (FIG. 9C). For example, a digital scale factor signal and a digital bias signal may be multiplexed or combined with input signals 938C and subsequently stored in memory 932 as analog signals 949; where such digital input reference signals will be stored in memory 932 being degraded with errors of other circuits such as DAC 933; thereby permitting compensation of errors in addition to CCD memory errors.

Another feature of the present invention is the use of CCDs in a servo system such as use of the CCD arrangements of the present invention in the servo system of parent application Ser. Nos. 101,881; 134,958; 135,040; and 302,771.

The analog ROM of the present invention may be used in a hybrid memory arrangement or in an analog memory arrangement. A hybrid memory arrangement for storing digital information in analog form has been discussed with reference to FIG. 9. An analog memory arrangement may be used in an analog signal processor such as an analog beamformer or a correlator or may output analog signals to other devices such as outputting analog sound samples to a sound transducer. Such hybrid and analog arrangements may be operated under digital control such as with the arrangements discussed with reference to FIG. 9.

The arrangement of the present invention has been discussed for an embodiment using a specific reference signal. It is herein intended that this arrangement be exemplary of any arrangement that stores extra data, or redundant data, or other data for the purpose of error compensation, or error correction, or improved precision, or other related purposes.

For convenience of description, various arrangements such as a plurality of data processor arrangements have been described relative to the serial CCD memory arrangement of the present invention. It is herein intended that any reference to a serial memory shall exemplify a random access memory, a parallel memory, and any other type of architecture that may be implemented in accordance with the features of the present invention. It is further intended that any reference to a CCD memory exemplify other types of memories such as magnetostrictive delay line memories, magnetic memories, cryogenic memories, integrated circuit memories, optical memories or other types of memories that may be used in accordance with the teachings of the present invention.

In accordance with the memory arrangements of the present invention, a preferred embodiment may be implemented using the same technologies for implementing both memory and logic circuits. For example, CCD technology is a MOS FET technology and MOS FET computers are also well known in the art. Therefore, a CCD memory and a MOS FET data processor may be constructed using similar technologies on a single monolithic integrated circuit chip.

Components have been shown in the figures in simplified form to more easily exemplify the present invention, wherein circuit design is a well-known art and wherein use of such components are well known in the art. Further, many alternate circuit embodiments and component types may be used to implement the discussed embodiments. For example, FETs 917 and 918 (FIG. 9A) can be implemented with any well-known switches including electronic switches such as FETs and bipolar transistors and even mechanical switches such as relays. Further, improved capabilities may be obtained by higher levels of integration. For example, FETs 917 and 918 bipolar transistors and even mechanical switches such as relays. Further, improved capabilities may be obtained by higher levels of integration. For example, FETs 917 and 918 bipolar transistors and even mechanical switches such as relays. Further, improved capabilities may be obtained by higher levels of integration. For example, FETs 917 and 918 bipolar transistors and even mechanical switches such as relays. Further, improved capabilities may be obtained by higher levels of integration. For example, FETs 917 and 918 bipolar transistors and even mechanical switches such as relays. Further, improved capabilities may be obtained by higher levels of integration. For example, FETs 917 and 918 bipolar transistors and even mechanical switches such as relays. Further, improved capabilities may be obtained by higher levels of integration. For example, FETs 917 and 918 bipolar transistors and even mechanical switches such as relays. Further, improved capabilities may be obtained by higher levels of integration. For example, FETs 917 and 918 may be manufactured as part of CCD 920 (FIG. 9A) to provide the combined capabilities of demodulation, filtering, and multiplexing with monolithic circuits.

The system of the present invention is intended to have a broad scope wherein a memory and a signal processing system are intended to exemplify generalized arrangements for storing signals, processing signals and transferring signals; FFT and correlator processors are intended to exemplify generalized filtering or processing arrangements; and other such devices are intended to exemplify generalized arrangements.

The term signal is herein intended to include electrical signals, charge signals, current signals, acoustic signals, illumination signals, magnetostrictive signals, sonic signals, magnetic signals, and other known signals which may be sensed such as with a transducer and which may be processed such as with a filter.

The various features of the present invention have been discussed separately or in particular combinations for simplicity of presentation. Advantages may be obtained by combining or recombining various separately described features or combined features respectively of the present invention. Therefore, it is herein intended that features of the present invention that may be described separately or in particular combinations may be grouped together and recombined in different combinations. For example, many features discussed independently may be compatible and may be used in combination theretogether in alternate embodiments or in preferred embodiments. It is herein intended that the various features discussed herein and the features incorporated by reference herein be usable in combinations to provide still further advantages. For example, the arrangements shown in FIG. 1, FIG. 6A, FIG. 9E, FIG. 9F, and FIG. 9K do not have A/D or D/A converters such as shown in FIG. 9C; wherein it is herein intended that these arrangements be usable with D/A converters and A/D converters as illustrated in FIG. 9C such as to implement the hybrid memory arrangement of the present invention. Further, analog memory arrangements such as shown in FIG. 1, FIG. 6A, FIG. 9A, FIG. 9B, FIG. 9C, and FIG. 9E do not have refresh circuits; wherein it is herein intended that the refresh arrangement of the present invention such as discussed with reference to FIGS. 9C, 9D, and 9F-9T and refresh arrangements known in the prior art be usable with the other arrangements of the present invention such as those discussed with reference to FIG. 1, FIG. 6A, FIG. 9A, FIG. 9B, and FIG. 9E.

Figure 4:
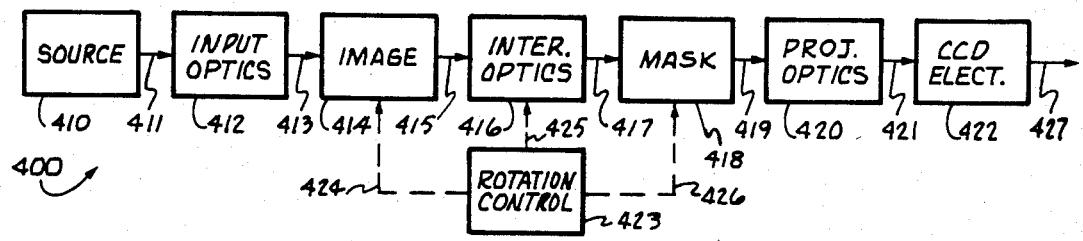
FIG. 4 comprises an optical filter embodiment in accordance with the memory arrangements of FIGS. 1 and 2A of the present invention.

A pattern recognition or correlator arrangement is discussed herein with reference to FIGS. 2A and 4. Another application of this arrangement may be a money changer such as a coin changer or bill changer. For example, the image of a bill may be projected on a CCD array using well-known projection arrangements such as opaque projector arrangements to provide pattern recognition capability.

The analog ROM arrangement discussed with reference to FIGS. 1 and 2 provides shifting of charge signals that are accumulated on large electrodes through smaller electrodes such as discussed with reference to FIG. 2C. An alternate embodiment for implementing such an arrangement would be to accumulate charge in response to a first excitation signal and to shift charge in response to a second excitation signal, wherein the second excitation signal is larger than the first excitation signal. As is well known in the capacitor art, charge accumulation capability is a function of the size of capacitor electrodes, distance between electrodes, and excitation voltage magnitude. Therefore, more charge may be accommodated on capacitor electrodes in response to greater excitation voltages; wherein charge accumulated on larger electrodes in response to a lower accumulation voltage may then be shifted through smaller electrodes with greater excitation voltage. One guideline might be that the charge handling capacity of the largest electrode when excited with the charge accumulation voltage (lower voltage) must not be greater than the charge handling capacity of the smallest electrode when excited with the charge shifting voltage (higher voltage). The two voltage levels may be adjusted to accomplish this guideline.

Many of the circuit combinations set forth herein are unique and distinguish over the art. For example, use of a sample-and-hold circuit in combination with an analog memory such as a CCD memory or a bubble memory provides important distinctions over prior art systems.

An alterable CCD memory and other monolithic memories are typically volatile memories, wherein stored information is typically destroyed when power is removed. In accordance with another feature of the present invention, a battery arrangement may be provided to preserve stored information during power removal. A battery may be connected in parallel with an electronic regulator and may be isolated therefrom with diode isolation. Therefore, when the electronic regulator does not supply power, the battery will automatically supply power through the isolation diodes. The battery may be charged from a battery charger when power is being supplied. Alternately, a battery may be connected across an electronic regulator for charging when the regulator is supplying power to the system and for supplying power to the system when the regulator is inoperable.

The analog refresh arrangement of the present invention has been discussed with reference to FIG. 9 using an implicit servo. Such an implicit servo is exemplary of other arrangements such as other servos, automatic gain control (AGC), etc and many related control arrangements that are well known in the art. In one alternate embodiment, a scale factor reference signal stored in a sample-and-hold circuit such as circuit 961B can be summed (or differenced) as signal 962B through resistor R2 with a scale factor reference signal through resistor R1 to generate a scale factor error signal 978. The scale factor error signal can be used to adjust the gain of an amplifier that amplifies memory output signal 936 to adjust the stored reference signal 962B (and therefore the stored data signals) to equal the scale factor reference signal to resistor R1. Adjustment can be provided with a voltage controlled amplifier such as circuit 963 (FIG. 9H) or such as a well-known AGC circuit. In this embodiment, a differential amplifier such as amplifier 977 and resistors R1 to R3 can be inserted inbetween sample-and-hold 961 and voltage controlled amplifier 963 in signal line 962 (FIG. 9H) to subtract sampled signal 962 from sample-and-hold circuit 961 with a scale factor reference signal for controlling the gain of amplifier 963 with the error or difference signal to input $I_{ABC}$ (FIG. 9H). Other servo and signal control arrangements will now become obvious to one skilled in the art from the teachings herein.

From the above description it will be apparent that there is thus provided a device of the character described possessing the particular features of advantage before enumerated as desireable, but which obviously is susceptible to modification in it's form, method, mechanization, operation, detailed construction and arrangement of parts without departing from the principles involved or sacrificing any of its advantages.

While in order to comply with the statute, the invention has been described in language more or less specific as to structural features, it is to be understood that the invention is not limited to the specific features shown, but that the means, method, and construction herein disclosed comprise the preferred form of several modes of putting the invention into effect, and the invention is, therefore, claimed in any of its forms or modifications within the legitimate and valid scope of the appended claims.

What I claim is:

1. A data processor system comprising:
   an analog memory for storing a program, said analog memory including means for storing the program as a plurality of analog signals;
   analog refresh circuitry for refreshing the analog signals stored in said analog memory;
   accessing circuitry for accessing the program of stored analog signals from said analog memory; and
   a stored program digital data processor for processing data under control of the program of stored analog signals accessed from said analog memory with said accessing circuitry.

2. The system as set forth in claim 1 above, wherein said stored program digital data processor includes a converter for converting the program accessed with said accessing circuitry to digital signal form and digital execution circuitry for processing the digital date in response to the stored program from said converter.

3. The system as set forth in claim 1 above, wherein said data processor includes an integrated circuit data processor, said integrated circuit data processor including
   a. integrated circuit read only memory means for storing computer instructions in digital signal form and
   b. integrated circuit execution means for processing the data in response to the stored digital computer instructions.

4. The system as set forth in claim 1 above, wherein said analog memory includes a charge coupled device for storing the analog signals in charge signal form and wherein said analog refresh circuitry includes analog bias refresh circuitry for reducing bias errors and analog scale factor refresh circuitry for reducing scale factor errors in the analog signals stored in said analog memory.

5. The system as set forth in claim 4 above, wherein said data processor is an integrated circuit data processor, said integrated circuit data processor including an integrated circuit read only memory for storing permanent information and an integrated circuit alterable memory for storing alterable information.

6. The system as set forth in claim 1 above, wherein said analog refresh circuitry includes an adaptive control circuit for processing the stored analog signals stored in said analog memory.

7. The system as set forth in claim 1 above, wherein said analog memory includes an analog read only memory for storing the program of signals in read only signal form; said analog read only memory including means for storing the program of analog signals in electrode area form.

8. The system as set forth in claim 7 above, wherein said analog memory further includes an analog alterable memory for storing the data processed with said data processor in alterable analog signal form; said data processor further including means for processing the data accessed from said analog alterable memory with said accessing circuitry under control of the program of stored analog signals.

9. The system as set forth in claim 1 above wherein said analog memory includes means for storing an analog reference signal and for storing an analog output signal, wherein said data processor includes a processing circuit for generating the analog output signal stored in said analog memory in response to the analog reference signal stored in said analog memory.

10. The system as set forth in claim 1 above, further comprising a digital to analog converter circuit for generating an analog input signal, wherein said data processor includes a circuit for generating an analog output signal in response to the analog input signal and the analog signals stored in said analog memory.

11. The system as set forth in claim 1 above, wherein said analog memory includes a nonvolatile analog memory for storing the program as a plurality of nonvolatile analog signals in nonvolatile signal form; said data processor including means for processing the digital data under control of the program of stored nonvolatile analog signals accessed from said nonvolatile analog memory with said accessing circuitry.

12. The system as set forth in claim 11 above, wherein said analog memory further includes a volatile analog memory for storing volatile analog signals in volatile signal form; said data processor further including means for processing the volatile analog signals accessed from said volatile analog memory with said accessing circuitry under control of the program of stored nonvolatile analog signals accessed from said nonvolatile analog memory with said accessing circuitry.

13. The system as set forth in claim 1 above, wherein said analog memory includes a nonvolatile analog memory for storing analog program signals and a volatile analog memory for storing alterable signals, wherein said stored program digital data processor includes means for processing the alterable signals stored in said volatile analog memory in response to the analog program signals stored in said nonvolatile analog memory.

14. The system as set forth in claim 1 above, wherein said system is a hybrid system, wherein said data processor includes a digital data processor for processing digital signals in response to the analog signals stored in said analog memory.

15. The system as set forth in claim 1 above, wherein said data processor includes a digital differential analyzer for processing incremental digital signals in response to the analog signals stored in said analog memory.

16. The system as set forth in claim 1 above, wherein said analog memory includes a nonvolatile analog sound memory for storing analog sound signals in electrode area form, said system further comprising a transducer for generating a sound in response to the analog sound signals stored in said nonvolatile analog sound memory.

17. The system as set forth in claim 1 above, wherein said system is a talking doll system and wherein said analog memory includes an analog speech memory for storing analog speech signals; said system further comprising a transducer for generating a speech sound in response to the stored analog speech signals stored in said analog speech memory.

18. The system as set forth in claim 1 above, wherein said data processor program includes a plurality of analog program instructions and wherein said digital processing logic includes means for processing digital data under control of the data processor program instructions.

19. A stored program digital computer for processing digital data in response to a stored program, said digital computer comprising:
an analog main memory for storing a computer program in analog signal form;
accessing means for accessing the computer program stored in said analog main memory;
a digital operand memory for storing digital operands; and
digital processing logic for processing the digital operands stored in said digital operand memory under control of the computer program accessed from said analog main memory with said accessing means.

20. The system as set forth in claim 19 above, wherein said analog main memory includes an analog magnetic bubble main memory for storing the computer program in analog magnetic bubble signal form.

21. The system as set forth in claim 20 above, wherein the analog magnetic bubble signal form computer program stored in said analog magnetic bubble memory is stored in magnetic bubble analog size form, said analog magnetic bubble main memory including means for storing an analog magnetic bubble having a controlled analog size in said analog magnetic bubble main memory.

22. The system as set forth in claim 19 above, wherein said analog main memory includes means for storing the computer program as a plurality of electrode areas.

23. A data processor system for processing data in response to stored program instructions wherein said data processor comprises:
an analog main memory for storing program instructions in analog signal form;
means for accessing stored program instructions from said analog main memory; and
a stored program data processor for processing data in response to the program instructions accessed from said analog main memory with said accessing means.

24. The system as set forth in claim 23 above, wherein said analog main memory includes means for storing the computer program instructions as electrode areas.

25. A memory system comprising:
an analog memory for storing analog signals;
an analog refresh circuit for refreshing the analog signals stored in said analog memory;
an analog to digital converter for generating digital signals in response to the stored analog signals from said analog memory;
a digital processor for processing the digital signals generated with said converter; and
a digital to analog converter for generating analog signals in response to the digital signals processed with said digital processor;
wherein said analog memory includes means for storing the analog signals generated with said digital to analog converter.

26. The system as set forth in claim 25 above, wherein said analog memory includes means for storing the analog signals as a plurality of electrode areas.

27. The system as set forth in claim 25 above, wherein the analog signals stored in said analog memory include a plurality of program instructions, wherein said digital processor is a stored program digital processor, and wherein said stored program digital processor includes means for processing the digital signals generated with said analog to digital converter under control of the program instructions.

28. A data processor system comprising:
an analog memory for storing analog information, wherein said analog memory includes
(a) a nonvolatile memory for storing analog information in nonvolatile signal form,
(b) a volatile memory for storing analog information in volatile signal form,
(c) a read only memory for storing analog information in read only signal form,
(d) an alterable memory for storing analog information in alterable signal form,
(e) adaptive control circuitry for adaptively controlling storage of analog information, and
(f) shift circuitry for shifting stored analog information;
a digital memory for storing digital information, said digital memory including
(a) a nonvolatile digital memory for storing digital information in nonvolatile signal form,
(b) a volatile digital memory for storing digital information in volatile signal form,
(c) a digital read only memory for storing permanent digital information, and
(d) an alterable digital memory for storing alterable digital information;
accessing circuitry for accessing stored information, said accessing circuitry including
(a) analog online accessing circuitry for accessing analog information stored in said analog memory as online analog information,
(b) analog offline accessing circuitry for accessing the analog information stored in said analog memory for offline processing,
(c) online digital accessing circuitry for accessing digital information stored in said digital memory for online processing,
(d) offline digital accessing circuitry for accessing digital information stored in said digital memory for offline processing,
(e) a converter for generating digital accessed information in response to the analog information accessed from said analog memory,
(f) analog block accessing circuitry for accessing a block of analog information stored in said analog memory, and
(g) digital block accessing circuitry for accessing a block of digital information stored in said digital memory;
a stored program data processor for processing information in response to a stored program, said data processor including
(a) a first processor for processing analog information stored in said analog memory in response to an analog program stored in said analog memory,
(b) a second processor for processing digital information stored in said digital memory in response to an analog program stored in said analog memory,
(c) a third processor for processing analog information stored in said analog memory in response to a digital program stored in said digital memory, and (d) a fourth processor for processing digital information stored in said digital memory in response to a digital program stored in said digital memory; and a special purpose data processor, said special purpose data processor including
  (a) a fifth data processor for generating analog output information in response to analog information stored in said analog memory,
  (b) a sixth data processor for generating digital output information in response to analog information stored in said analog memory,
  (c) a seventh data processor for generating analog output information in response to digital information stored in said digital memory, and
  (d) an eighth data processor for generating digital output information in response to digital information stored in said digital memory.

29. A stored program computer comprising:
an analog program memory for storing program instructions;
means for accessing program instructions from said analog program memory;
an operand memory for storing an operand;
a digital processor for processing the operand stored in said operand memory in response to the program instructions accessed from said analog program memory with said accessing means.

30. The computer as set forth in claim 29 above, wherein said analog program memory includes an analog charge coupled device read only memory for storing the program instructions in analog electrode size form.

31. The computer as set forth in claim 29 above, wherein said analog program memory includes an analog magnetic bubble memory for storing the program instructions in analog magnetic bubble form.

32. The computer as set forth in claim 29 above, wherein said computer is an integrated circuit computer, wherein said analog program memory includes an integrated circuit analog read only memory for storing the program instructions in analog read only form and wherein said operand memory includes an integrated circuit alterable memory for storing a plurality of operands in alterable form.

33. The computer as set forth in claim 29 above, wherein said analog program memory includes an adaptive control circuit for processing the analog program instructions stored therein.

34. The computer as set forth in claim 29 above, wherein said analog program memory includes an analog read only memory having an electrode area information content for storing the program in read only signal form and wherein said operand memory includes an analog alterable memory for storing the operand in analog signal form.

35. The computer as set forth in claim 29 above, wherein said analog program memory includes means for storing the program as a plurality of computer instructions.

36. The computer as set forth in claim 29 above, wherein said analog program memory includes means for storing an analog reference signal and means for storing analog program instruction signals, wherein said computer includes a refresh circuit for refreshing the analog program instruction signals stored in said analog program memory in response to the analog reference signal stored in said analog program memory.

37. The computer as set forth in claim 29 above, wherein said operand memory is an analog operand memory, wherein said analog operand memory includes means for storing the operand in analog signal form, means for storing an analog reference signal, and a refresh circuit for refreshing the stored operand in response to the analog reference signal.

38. The computer as set forth in claim 29 above, wherein said analog program memory includes a nonvolatile analog memory for storing the program instructions in nonvolatile signal form.

39. The computer as set forth in claim 38 above, wherein said operand memory includes a volatile analog memory for storing an analog operand in volatile signal form.

40. The computer as set forth in claim 29 above, wherein said analog program memory includes a sound memory for storing analog sound information, said computer further comprising a transducer for generating a sound in response to the analog sound information stored in said analog program memory.

41. The computer as set forth in claim 29 above, wherein said analog program memory includes an analog speech memory for storing analog speech information, said computer further comprising a transducer for generating a speech sound in response to the stored analog speech information.

42. A stored program analog computer comprising:
an analog main memory for storing a program in analog signal form;
accessing means for accessing the program stored in said analog main memory;
an analog scratched memory for storing an operand in analog signal form; and
analog circuitry for processing the operand stored in analog signal form in said analog scratchpad memory in response to the program accessed from said analog main memory with said accessing means.

43. A stored program hybrid computer comprising:
an analog program memory for storing a program in analog signal form;
accessing means for accessing the program from said analog program memory;
a digital operand memory for storing an operand in digital signal form; and
a stored program digital processor for processing the operand stored in said digital operand memory in digital signal form in response to the program accessed from said analog program memory in analog signal form.

44. A stored program computer system comprising:
an analog program memory for storing a computer program as a plurality of analog signals;
means for accessing the computer program from said analog program memory;
an operand memory for storing a computer operand; and
a stored program computer for processing the computer operand stored in said operand memory in response to the computer program accessed from said analog program memory.

45. The system as set forth in claim 44 above, wherein said analog program memory includes an electrical charge memory for storing the analog signals in charge signal form.

46. The system as set forth in claim 44 above, wherein said stored program computer is an analog stored program computer and wherein said operand memory is an analog operand memory for storing the computer operand in analog signal form, said analog computer including means for processing the operand stored in said analog operand memory in response to the computer program stored in said analog program memory.

47. The system as set forth in claim 44 above, wherein said analog program memory includes a magnetic bubble memory for storing the computer program in analog magnetic bubble signal form.

48. The system as set forth in claim 44 above, wherein said analog program memory includes an integrated circuit read only memory for storing permanent analog information and wherein said operand memory includes an integrated circuit analog alterable memory for storing alterable analog operands.

49. The system as set forth in claim 44 above, wherein said analog program memory includes an adaptive control circuit for processing the stored analog signals.

50. The system as set forth in claim 44 above, wherein said analog program memory includes an analog read only memory for storing the analog signals in electrode area form.

51. The system as set forth in claim 50 above, wherein said operand memory includes an analog alterable memory for storing the computer operand as an analog signal in alterable signal form.

52. The system as set forth in claim 44 above, wherein said analog program memory is a computer main memory.

53. The system as set forth in claim 44 above, wherein said analog program memory includes means for generating a reference signal, means for storing the reference signal, and means for refreshing the stored analog signals in response to the stored reference signal.

54. The system as set forth in claim 44 above, further comprising an input circuit for generating an analog input signal, wherein said computer includes a circuit for generating an analog output signal in response to the analog input signal under control of the analog signals stored in said analog program memory.

55. The system as set forth in claim 44 above, wherein said analog program memory includes a refresh circuit for refreshing the stored analog signals to reduce scale factor degradation of the stored analog signals.

56. The system as set forth in claim 44 above, wherein said analog program memory includes a nonvolatile analog memory for storing the analog signals in electrode area form.

57. The system as set forth in claim 44 above, wherein said analog program memory further includes a volatile analog memory for storing the analog signals in volatile signal form.

58. The system as set forth in claim 44 above, wherein said analog program memory includes a nonvolatile analog memory for storing analog program signals and wherein said operand memory includes a volatile analog memory for storing the operand in alterable signal form, wherein said computer includes a processor for processing the alterable signals stored in said volatile analog memory in response to the analog program signals stored in said analog program memory.

59. The system as set forth in claim 44 above, wherein said system is a hybrid system, wherein said computer includes a digital data processor for processing digital information in response to the computer program stored in said analog program memory.

60. The system as set forth in claim 44 above, wherein said analog program memory includes a sound memory for storing analog sound information, said system further comprising a transducer for generating a sound in response to the analog sound information stored in said analog program memory.

61. The system as set forth in claim 45 above, wherein said system is a talking doll system, wherein said analog program memory includes an analog speech memory for storing analog speech information, wherein said system further comprises a transducer for generating speech information in response to the stored analog speech information.

62. The system as set forth in claim 44 above, wherein said operand memory is a digital operand memory for storing a digital operand and wherein said stored program computer includes means for processing the digital operand stored in said operand memory in response to the computer program stored in said analog program memory.

63. A data processor system comprising:
a magnetic bubble memory for storing analog information in magnetic bubble form, wherein the analog information includes analog program information, and wherein said magnetic bubble memory is a data processor main memory;
accessing circuitry for accessing the stored analog information from said magnetic bubble memory in response to an access signal, wherein the analog information accessed with said accessing circuitry is analog program information; and
a data processor for generating the access signal, wherein said data processor is a stored program data processor for processing data in response to the analog program information accessed from said main memory with said accessing circuitry.

* * * * *